(12) United States Patent
Schober et al.

(10) Patent No.: US 10,476,457 B2
(45) Date of Patent: Nov. 12, 2019

(54) LOW NOISE TRANS-IMPEDANCE AMPLIFIERS BASED ON COMPLEMENTARY CURRENT FIELD-EFFECT TRANSISTOR DEVICES

(71) Applicant: Circuit Seed, LLC, Newport Beach, CA (US)

(72) Inventors: Susan Marya Schober, Corona Del Mar, CA (US); Robert C. Schober, Huntington Beach, CA (US)

(73) Assignee: Circuit Seed, LLC, Newport Beach, CA (US)

( * ) Notice: Subject to any disclaimer, the term of this patent is extended or adjusted under 35 U.S.C. 154(b) by 0 days.

(21) Appl. No.: 15/748,813

(22) PCT Filed: Jul. 29, 2016

(86) PCT No.: PCT/US2016/044787
§ 371 (c)(1),
(2) Date: Jan. 30, 2018

(87) PCT Pub. No.: WO2017/019978
PCT Pub. Date: Feb. 2, 2017

(65) Prior Publication Data
US 2018/0219519 A1  Aug. 2, 2018

Related U.S. Application Data

(60) Provisional application No. 62/309,903, filed on Mar. 17, 2016, provisional application No. 62/268,983, (Continued)

(51) Int. Cl.
*H03F 3/45* (2006.01)
*H03F 1/08* (2006.01)
(Continued)

(52) U.S. Cl.
CPC ..... *H03F 3/45183* (2013.01); *H01L 29/4238* (2013.01); *H01L 29/78* (2013.01);
(Continued)

(58) Field of Classification Search
CPC ...... H03F 3/45183; H03F 3/193; H03F 3/211; H03F 3/45475; H03F 3/3022; H03F 1/083; H03F 3/195; H03F 1/223
(Continued)

(56) References Cited

U.S. PATENT DOCUMENTS 3,887,878 A   6/1975  Schade, Jr.
3,986,134 A  10/1976  Yokoyama
(Continued)

FOREIGN PATENT DOCUMENTS

CN   101142686    3/2008
CN   102265403   11/2011
(Continued)

OTHER PUBLICATIONS

Baker, R. Jacob, "CMOS—Circuit Design, Layout, and Simulation, Third Edition", IEEE Press, 2010.
(Continued)

*Primary Examiner* — Khanh V Nguyen
*Assistant Examiner* — Khiem D Nguyen
(74) *Attorney, Agent, or Firm* — Lee & Hayes, P.C.

(57) ABSTRACT

The present invention relates to a novel and inventive compound device structure for a low noise current amplifier or trans-impedance amplifier. The trans-impedance amplifier includes an amplifier portion, which converts current input into voltage using a complimentary pair of novel n-type and p-type current field-effect transistors (NiFET and PiFET) and a bias generation portion using another complimentary pair of NiFET and PiFET. Trans-impedance of NiFET and PiFET and its gain may be configured and programmed by
(Continued)

a ratio of width (W) over length (L) of source channel over the width (W) over length (L) of drain channel (W/L of source channel/W/L of drain channel).

17 Claims, 58 Drawing Sheets

Related U.S. Application Data filed on Dec. 17, 2015, provisional application No. 62/198,900, filed on Jul. 30, 2015.

(51) Int. Cl.

| | |
|---|---|
| *H03F 1/22* | (2006.01) |
| *H03F 3/08* | (2006.01) |
| *H03F 3/193* | (2006.01) |
| *H03F 3/195* | (2006.01) |
| *H03F 3/21* | (2006.01) |
| *H03F 3/30* | (2006.01) |
| *H03K 19/0185* | (2006.01) |
| *H01L 29/423* | (2006.01) |
| *H01L 29/78* | (2006.01) |

(52) U.S. Cl.
CPC ............ *H03F 1/083* (2013.01); *H03F 1/223* (2013.01); *H03F 3/082* (2013.01); *H03F 3/193* (2013.01); *H03F 3/195* (2013.01); *H03F 3/211* (2013.01); *H03F 3/3022* (2013.01); *H03F 3/45475* (2013.01); *H03K 19/018557* (2013.01); *H03F 2200/294* (2013.01); *H03F 2200/451* (2013.01); *H03F 2203/45246* (2013.01); *H03F 2203/45692* (2013.01)

(58) Field of Classification Search
USPC .................................. 330/253, 262–264, 269
See application file for complete search history.

(56) References Cited

U.S. PATENT DOCUMENTS

| | | | |
|---|---|---|---|
| 4,100,502 | A | 7/1978 | Yamashiro |
| 4,247,859 | A | 1/1981 | Rai-Choudhury et al. |
| 4,282,477 | A | 8/1981 | Ahmed |
| 4,309,665 | A | 1/1982 | Yamashiro |
| 4,607,274 | A | 8/1986 | Yoshitake |
| 4,910,709 | A | 3/1990 | Dhong et al. |
| 4,927,779 | A | 5/1990 | Dhong et al. |
| 5,041,894 | A | 8/1991 | Reczek et al. |
| 5,336,937 | A | 8/1994 | Sridhar et al. |
| 5,349,311 | A | 9/1994 | Mentzer |
| 5,528,056 | A | 6/1996 | Shimada et al. |
| 6,040,610 | A | 3/2000 | Noguchi et al. |
| 6,046,638 | A * | 4/2000 | Hogeboom .......... H03K 5/2481 330/252 |
| 6,081,218 | A | 6/2000 | Ju et al. |
| 6,441,663 | B1 | 8/2002 | Chuang et al. |
| 6,784,824 | B1 | 8/2004 | Quinn |
| 6,933,750 | B2 | 8/2005 | Takahashi et al. |
| 7,057,302 | B2 | 6/2006 | Matsuzawa et al. |
| 7,554,409 | B1 | 6/2009 | Zhang et al. |
| 2002/0016030 | A1 | 2/2002 | Misewich et al. |
| 2003/0049892 | A1 | 3/2003 | Yamaguchi et al. |
| 2003/0210097 | A1 | 11/2003 | Wilson et al. |
| 2004/0102170 | A1 | 5/2004 | Jensen et al. |
| 2005/0168242 | A1 | 8/2005 | Won |
| 2005/0218299 | A1 | 10/2005 | Olsen et al. |
| 2006/0001413 | A1 | 1/2006 | Marinca |
| 2006/0065927 | A1 | 3/2006 | Thean et al. |
| 2006/0139195 | A1 | 6/2006 | Casper et al. |
| 2007/0046369 | A1 | 3/2007 | Schober et al. |
| 2007/0085593 | A1 | 4/2007 | Wich et al. |
| 2007/0098041 | A1 | 5/2007 | Seo |
| 2008/0258959 | A1 | 10/2008 | Trifonov et al. |
| 2009/0160487 | A1 | 6/2009 | Hu et al. |
| 2009/0311837 | A1 | 12/2009 | Kapoor |
| 2011/0309888 | A1 | 12/2011 | Bulzacchelli et al. |
| 2012/0097965 | A1 | 4/2012 | Shin et al. |
| 2012/0098579 | A1 | 4/2012 | Schober et al. |
| 2013/0027107 | A1 | 1/2013 | Nohara |
| 2013/0177175 | A1 | 7/2013 | Ting |
| 2013/0287071 | A1 | 10/2013 | Chen et al. |
| 2014/0062550 | A1 | 3/2014 | Lee et al. |
| 2014/0111181 | A1 | 4/2014 | Nagayama et al. |
| 2014/0132435 | A1 | 5/2014 | Dempsey |
| 2014/0159168 | A1 | 6/2014 | Toh et al. |
| 2015/0070091 | A1 | 3/2015 | Schober et al. |
| 2018/0219514 | A1 | 8/2018 | Schober et al. |
| 2018/0224878 | A1 | 8/2018 | Schober et al. |
| 2018/0226930 | A1 | 8/2018 | Schober et al. |

FOREIGN PATENT DOCUMENTS

| | | |
|---|---|---|
| CN | 104465657 | 3/2015 |
| EP | 1079294 | 9/2004 |
| JP | 2014063929 | 4/2014 |
| KR | 1020120043522 | 5/2012 |
| WO | WO9534913 | 12/1995 |
| WO | WO2007014053 | 2/2007 |
| WO | WO2007081634 | 7/2007 |

OTHER PUBLICATIONS

Horowitz, et al., "The Art of Electronics—2nd Edition", Cambridge University Press, 1989, 1041 pages.
PCT Search Report and Written Opinion dated Oct. 23, 2015 for PCT Applicatoin No. PCT/US2015/42696, 12 pages.
International Search Report and Written Opinion from PCT/US2016/044800 dated Mar. 13, 2017, 8 pages.
PCT Search Report and Written Opinion dated Oct. 20, 2016 for PCT application No. PCT/US216/044792, 13 pages.
PCT Search Report and Written Opinion dated Nov. 10, 2016 for PCT application No. PCT/US2016/044770, 15 pages.
PCT Search Report and Written Opinion dated Nov. 8, 2016 for PCT application No. PCT/US2016/044787, 16 pages.
PCT Search Report and Written Opinion dated Apr. 3, 2017 for PCT application No. PCT/US16/67529, 14 pages.
PCT Search Report and Written Opinion dated May 13, 2016 for PCT Application No. PCT/US16/14639, 11 pages.
Aguirre, et al., "Temperature Controlled Measurement System for Precise Characterization of Electronic Circuits and Devices", IEEE Instrumentation and Measurement, 2014, 4 pages.
Amaravati, et al., "800-nA Process-and-Voltage-Invariant 106-dB PSRR PTAT Current Reference", IEEE Transactions on Circuits and Systems—II: Express Briefs, Sep. 2013, 60(9), pp. 577-581.
Anusandhana Journal of Science, Engineering and Management, vol. 1, Issue 2, Dec. 2012, 78 pages.
Baghini, et al., "A Sub-1V 32nA Process, Voltage and Temperature Invariant Voltage Reference Circuit", 2013 26th International Conference on VLSI Design and the 12th International Conference on Embedded Systems, 2013, pp. 136-141.
Baker, et al., "High Speed Op-amp Design: Compensation and Topologies for Two and Three Stage Designs", IEEE Solid-State Circuits Society, Apr. 9-10, 2015, 58 pages.
Bendali, et al., "A 1-V CMOS Current Reference With Temperature and Process Compensation", IEEE Transactions on Circuits and Systems—I: Regular Papers, vol. 54, No. 7, Jul. 2007, pp. 1424-1429.
Christoffersen, et al., "An Ultra-Low Power CMOS PTAT Current Source", IEEE—EMATA 2010, pp. 35-40.
Dai, et al., "Threshold Voltage Based CMOS Voltage Reference", IEE Proceedings Circuits Devices Systems, vol. 151, No. 1, Feb. 2004, pp. 58-62.
De Vita, et al., "A 300 nW, 12 ppm/C Voltage Reference in a Digital 0.35 um CMOS Process", 2006 Symposium on VLSI Circuits Digest of Technical Papers, IEEE 2006, 3 pages.

(56) References Cited

OTHER PUBLICATIONS

Galeano et al., "A Very Low Power Area Efficient CMOS Only Bandgap Reference", IEEE 2012, 6 pages.
Gray, et al., "Analysis and Design of Analog Integrated Circuits", John Wiley & Sons, Inc., 2009.
Haft-Baradaran, Afshin, "Basic and Advanced Current References", University of Toronto, 2001, 16 pages.
Hirose, et al., "A CMOS Bandgap and Sub-Bandgap Voltage Reference Circuits for Nanowatt Power LSIs", IEEE Asian Solid-State Circuits Conference, Nov. 8-10, 2010, 4 pages.
Huang, et al., "A 1V 16.9ppm/C 250nA Switched-Capacitor CMOS Voltage Reference", 2008, IEEE International Solid-State Circuits Conference, 4 pages.
Huang, et al., "Piecewise Linear Curvature-Compensated CMOS Bandgap Reference", IEEE, 2008, pp. 308-311.
Huffenus, et al., "A High PSRR Class-D Audio Amplifier IC Based on a Self-Adjusting Voltage Reference", European Solid State Circuits Conference, 2010, pp. 4.
Ivanov, et al., "An Ultra Low Power Bandgap Operational at Supply From 0.75 V", IEEE Journal of Solid-State Circuits, vol. 47, No. 7, Jul. 2012, pp. 1515-1523.
Le, et al., "A Design of Three-Stage CMOS Opamp Using Indirect Feedback Compensation Technique", The Solid-State Systems Symposium & VLSI and Related Technology, 4S, Aug. 2012, pp. 153-156.
Lee, et al., "A Wideband CMOS Variable Gain Amplifier With an Exponential Gain Control", IEEE Transactions on Microwave Theory and Techniques, vol. 55, No. 6, Jun. 2007, pp. 1363-1373.
Matta, et al., "2.3 ppm/C 40 nW MOSFET-Only Voltage Reference", ISLPED' 14, Aug. 11-13, 2014, 7 pages.
Meijer, et al., "Temperature Sensors and Voltage References Implemented in CMOS Technology", IEEE Sensors Journal, vol. 1, No. 3, Oct. 2001, pp. 225-234.
Millemon Sr., B.A.., "CMOS Characterization, Modeling, and Circuit Design in the Presence of Random Local Variation", A Thesis submitted Aug. 2012, Boise State University, 88 pages.
Mok, et al., "Design Considerations of Recent Advanced Low-Voltage Low-Temperature-Coefficient CMOS Bandgap Voltage Reference", CICC, Oct. 2004, 8 pages.
Osaki, et al., "1.2-V Supply, 100-nW, 1.09-V Bandgap and 0.7-V Supply, 52.5-nW, 0.55-V Subbandgap Reference Circuits for Nanowatt CMOS LSIs", IEEE Journal of Solid-State Circuits, vol. 48, No. 6, Jun. 2013, pp. 1530-1538.
Pain, et al., "Low-power Low-noise Analog Circuits for on-focal-plane Signal Processing of Infrared Sensors", Proceedings of the SPIE, vol. 1946, 1993, 10 pages.
Park, et al., "A 95nW Ring Oscillator-based Temperature Sensor for RFID Tags in 0.13um CMOS", IEEE 2009, pp. 1153-1156.
Paul, et al., "Design of Second-Order Sub-Bandgap Mixed-Mode Voltage Reference Circuit for Low Voltage Applications", Proceedings of the 18th Intl Conference on VLSI Design, 2005, 6 pages.
Rossi, et al., "PTAT Voltage Generator Based on an MOS Voltage Divider", 2007, Instituto de Ing. Electrica, Universidad de la Republica, Montevideo, Uruguay, 4 pages.
Rossi, et al., "Ultra-low Power CMOS Cells for Temperature Sensors", SBCCI '05, Sep. 4-7, 2005, pp. 202-206.
Rossi-Aicardi, et al., "A MOSFET-only Voltage Source with Arbitrary Sign Adjustable Temperature Coefficient", IEEE 2011, pp. 366-369.
Saxena, et al., "Compensation of CMOS Op-amps Using Split-Length Transistors", IEEE 2008, pp. 109-112.
Saxena, et al., "Indirect Compensation Technique for Low-Voltage CMOS Op-amps", Jan. 18, 2016, 4 pages.
Saxena, et al., "Indirect Feedback Compensation of CMOS Op-Amps", 2006 IEEE Workshop on Microelectronics and Electron Devices, 2 pages.
Saxena, et al., "Systematic Design of Three-Stage Op-amps Using Split-Length Compensation", 2011, IEEE 54th International Midwest Symposium on Circuits and Systems (MWSCAS), pp. 1-4.
Saxena, Vishal, "Indirect Feedback Compensation Techniques for Mulit-Stage Operational Amplifiers", A Thesis submitted Oct. 2007, Boise State University, 209 pages.
Schmitt, Otto H., "A Simple Differential Amplifier", R.S.I., vol. 8, Apr. 1937, pp. 126-127.
Schmitt, Otto H., "A Thermionic Trigger", Journal of Scientific Instrumens, 1937, 3 pages.
Shinde, S.V., "PVT Insensitive Reference Current Generation", Proceedings of the International MultiConference of Engineers and Computer Scientists 2014, vol. II, Mar. 12-14, 2014, 5 pages.
Sun, et al., "A Low-Power Low-Voltage Bandgap Reference in CMOS", CCECE 2010 Canadian Conference, 5 pages.
Tzanateas et al., "A CMOS Bandgap Voltage Reference", IEEE Journal of SolidD-State Circuits, vol. SC-14, No. 3, Jun. 1979, pp. 655-657.
Vittoz, et al., "A Low-Voltage CMOS Bandgap Reference", IEEE Journal of Solid-State Circuits, Vovl. SC-14, No. 3, Jun. 1979, pp. 573-577.
Vittoz, et al., "CMOS Analog Integrated Circuits Based on Weak Inversion Operation", IEEE Journal of Solid-State Circuits, Jun. 1977, vol. SC-12, No. 3, pp. 224-231.
Yang, et al., "All-CMOS Subbandgap Reference Circuit Operating at Low Supply Voltage", IEEE 2011, pp. 893-896.
Zhang, Z., "CMOS Radio Frequency Integrated Circuit Design for Direct Conversion Receivers", A thesis submitted to The Hong Kong University of Science and Technology, Sep. 2001, 155 pages.
Razavi, B., Design of Analog CMOS Integrated Circuits, 2001, McGraw-Hill Higher Education, New York, NY.
Razavi, B., Fundamentals of Microelectronics, Wiley, 2006.
Office Action for U.S. Appl. No. 15/748,813, dated Oct. 18, 2018, Schober et al., Low Noise Trans-Impedance Amplifiers Based on Complementary Current Field-Effect Transistor Devices, 14 pages.
Office Action from related Chinese Application No. 201580083441.5 dated Apr. 26, 2019, 6 pages.
Ajit et al., "The Minority Carrier Injection Controlled field-Effect Transistor (MICFET): A New MOS-Gate Power Transistor Sturcture", IEEE Transactions on Electron Devices, vol. 39, No. 8, Aug. 1992, 7 pages.
Baker et al., "High Speed Op-amp Design: Compensation and Topologies for Tow and three Stage Designs", Jul. 1, 2007, retrieved Jun. 6, 2006 from «http://cmosedu.com/jbaker/papers/talks/Multistage_Opamp_Presentation.pdf», 58 pages.
The Extended European Search Report dated Jun. 28, 2019 for European Patent Application No. 15899854.2, 7 pages.
Sugawara, et al., 350 V Carrier Injection Field Effect Transistor (CIFET) with Very Low On-Resistance and High Switching Speed, Proceedings of the 7th International Symposium on Power Semiconductor Devices and IC's, May 23, 1995, 5 pages.
Office Action for U.S. Appl. No. 16/146,161, dated Aug. 12, 2019, Schober, "Complementary Current Field-Effect Transistor Devices and Amplifiers", 4 pages.

* cited by examiner

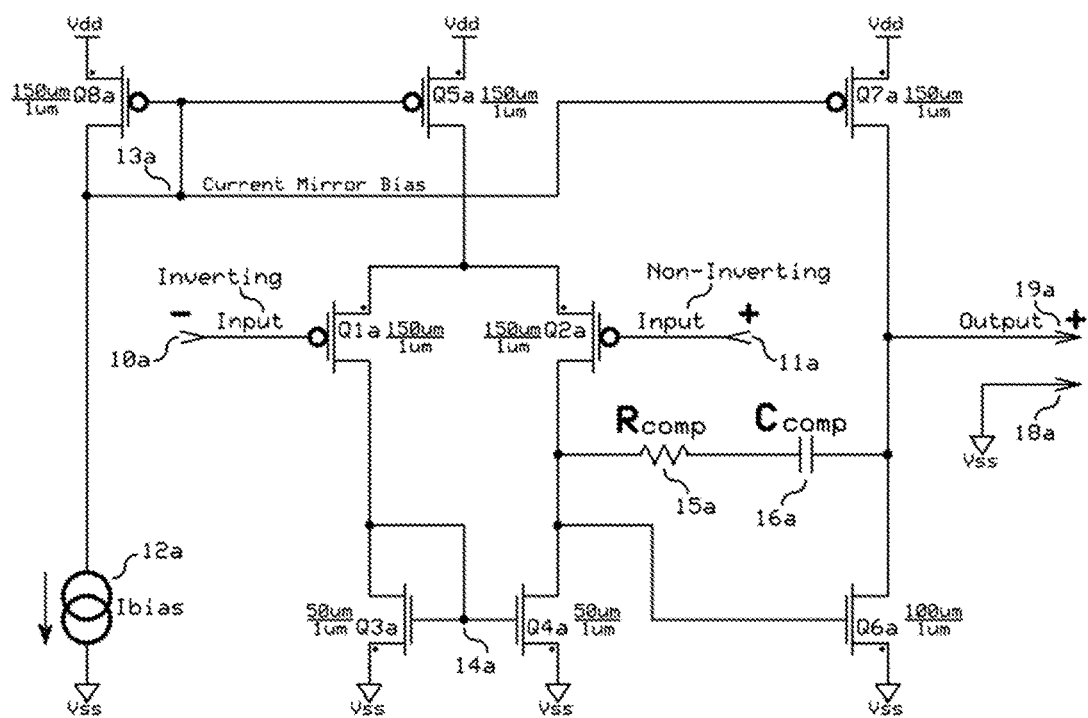
PRIOR ART
Figure 1a

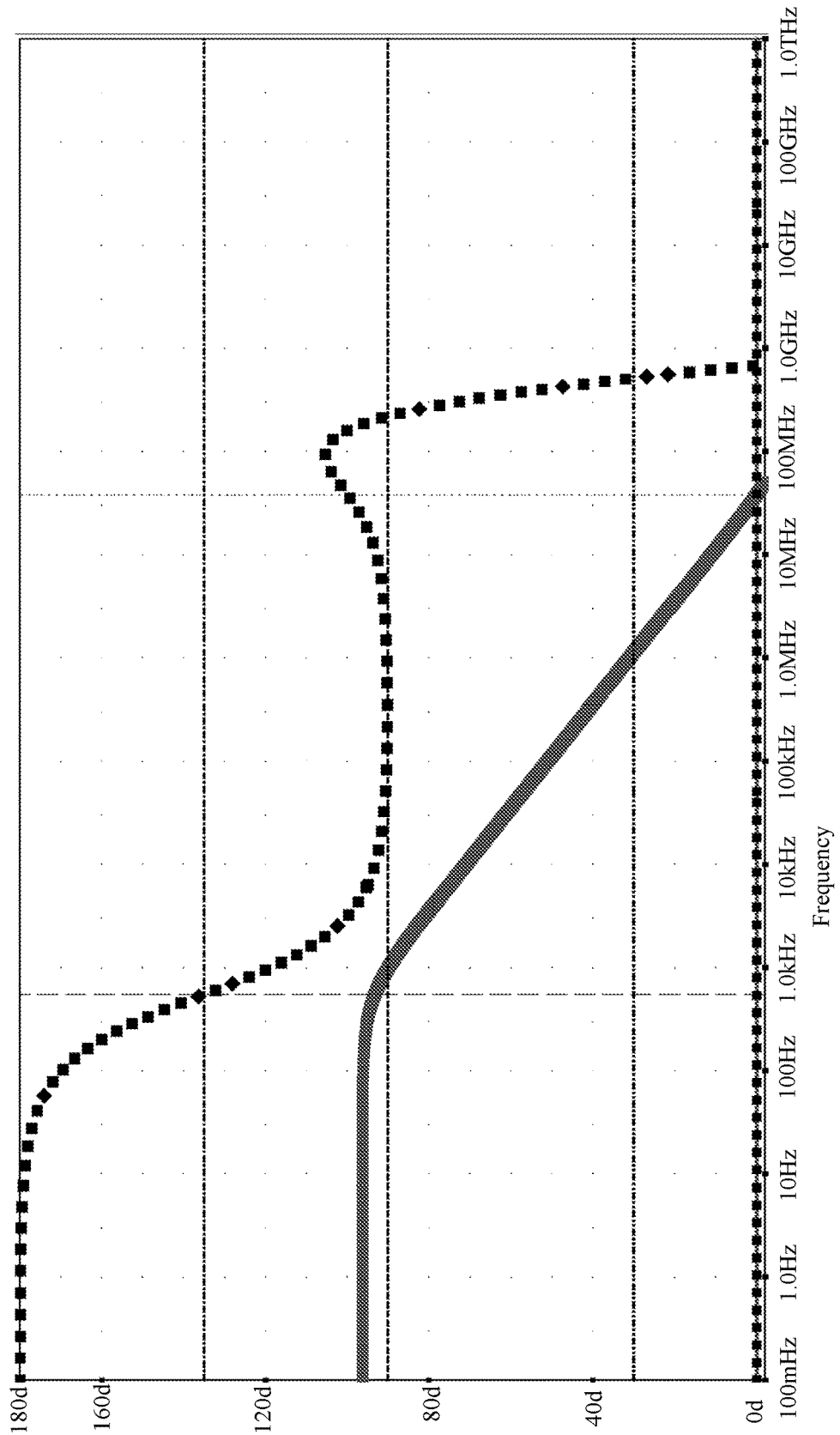
PRIOR ART
Figure 1b

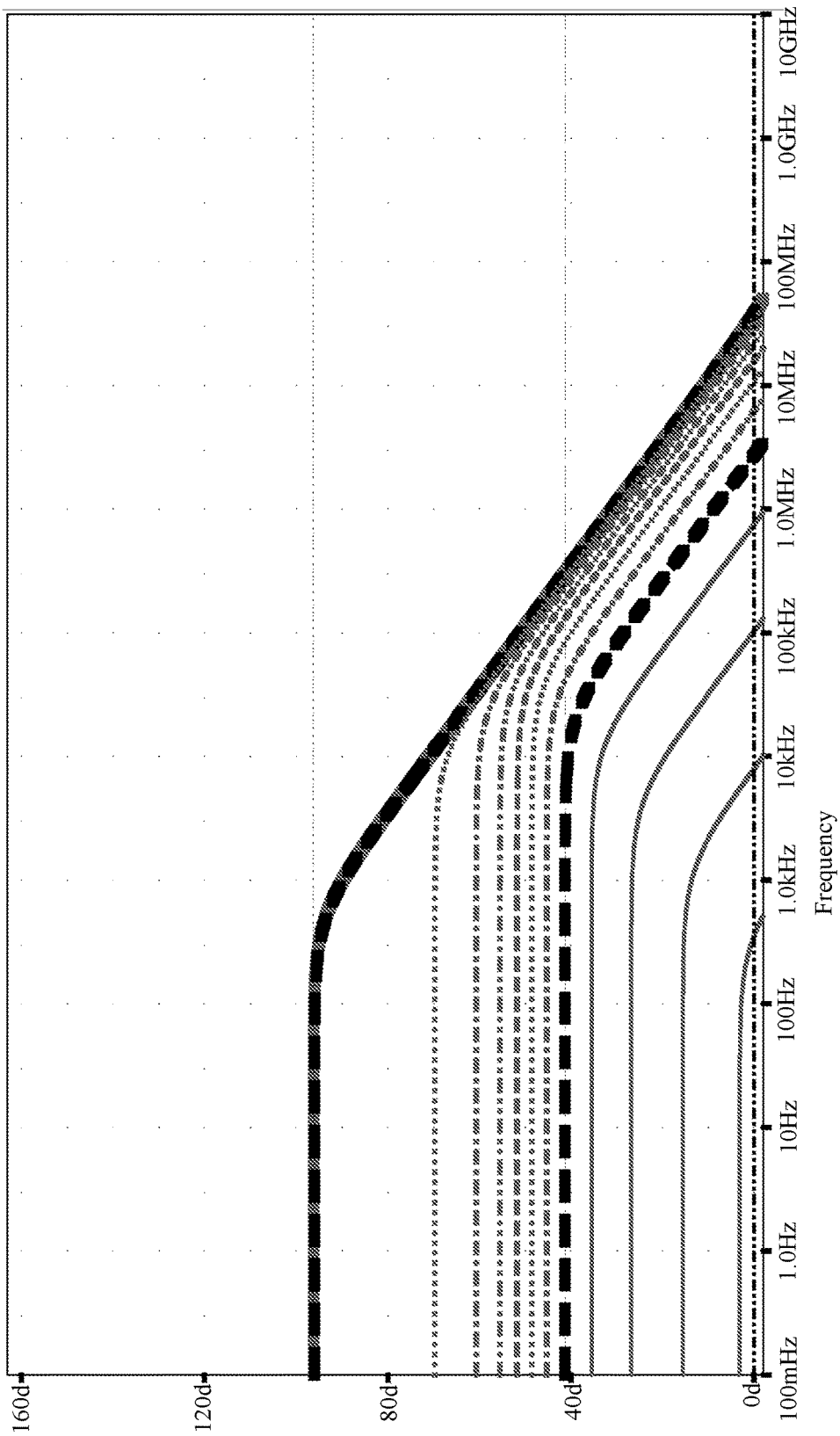
PRIOR ART
Figure 1c

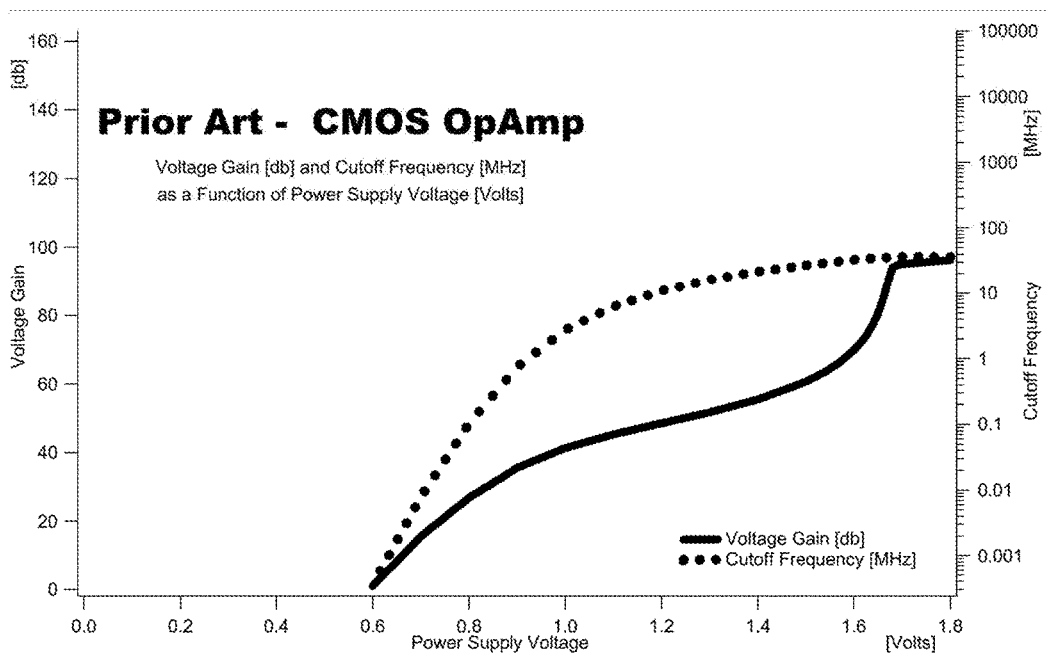
Figure 1d
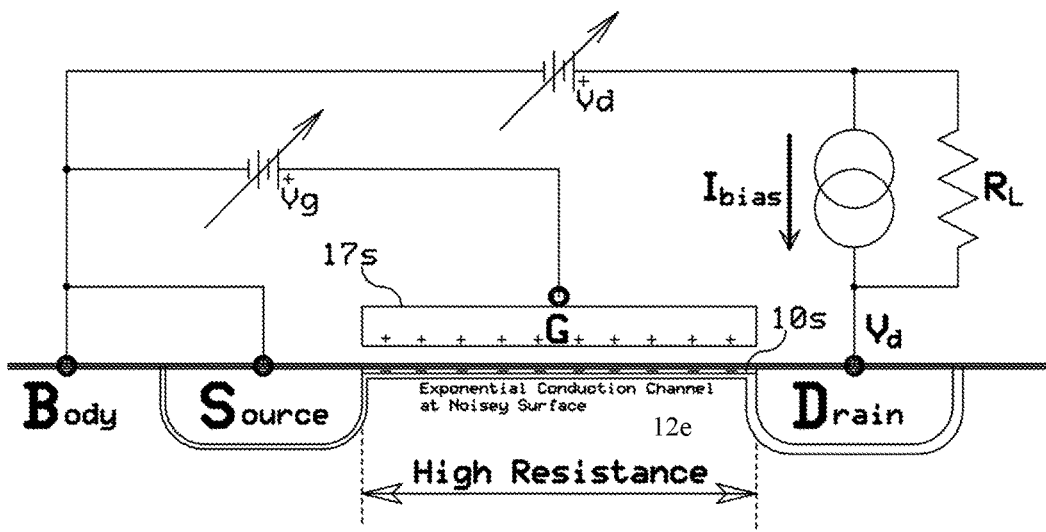
PRIOR ART
Figure 1e

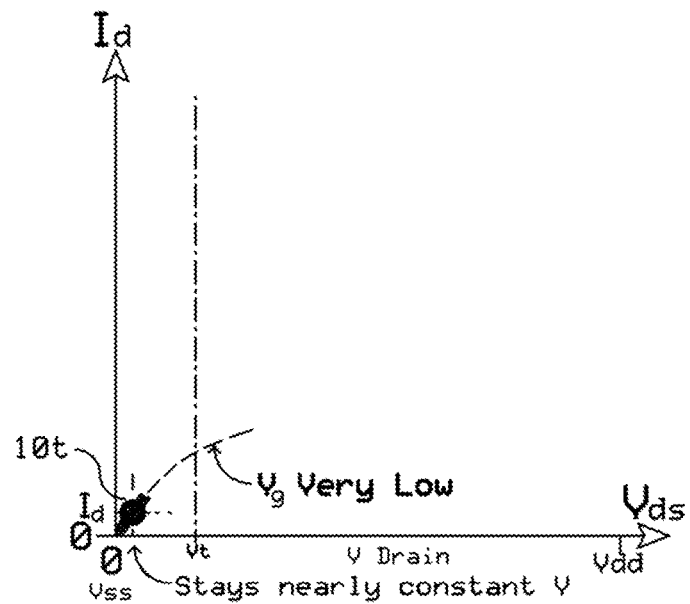
PRIOR ART
Figure 1f
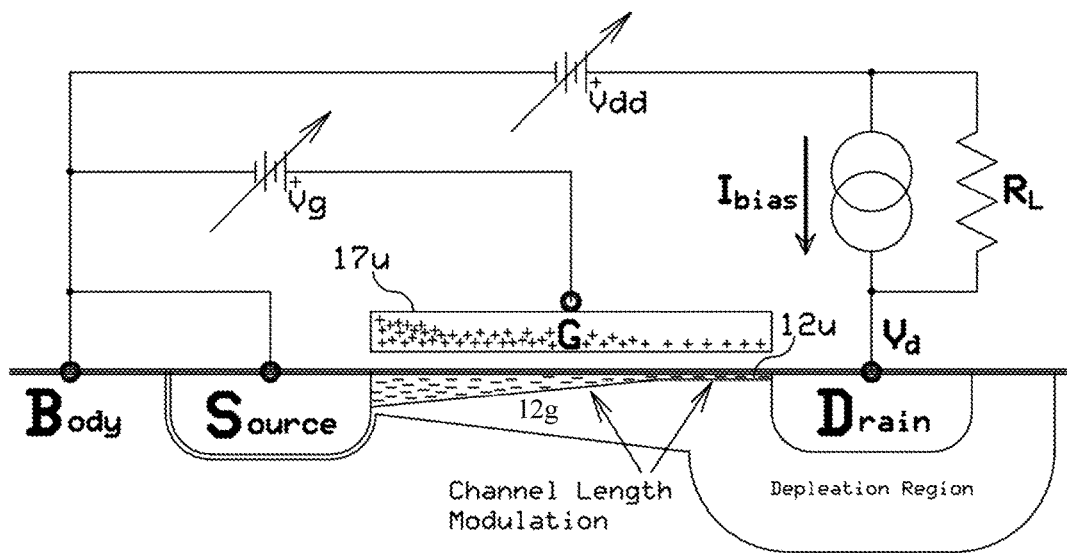
PRIOR ART
Figure 1g

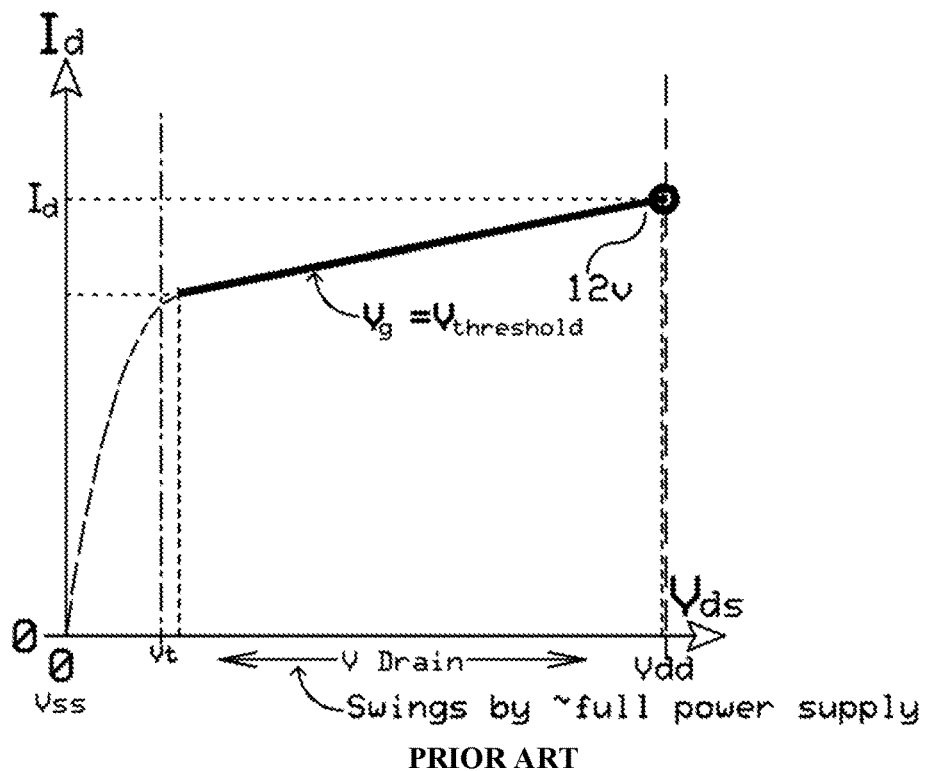
PRIOR ART
Figure 1h
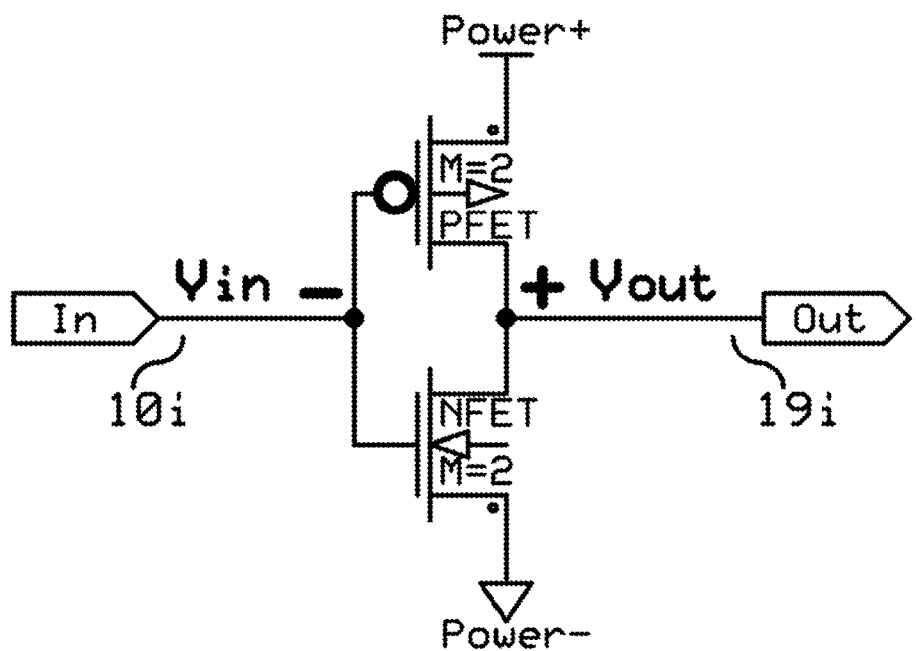
PRIOR ART
Figure 1i

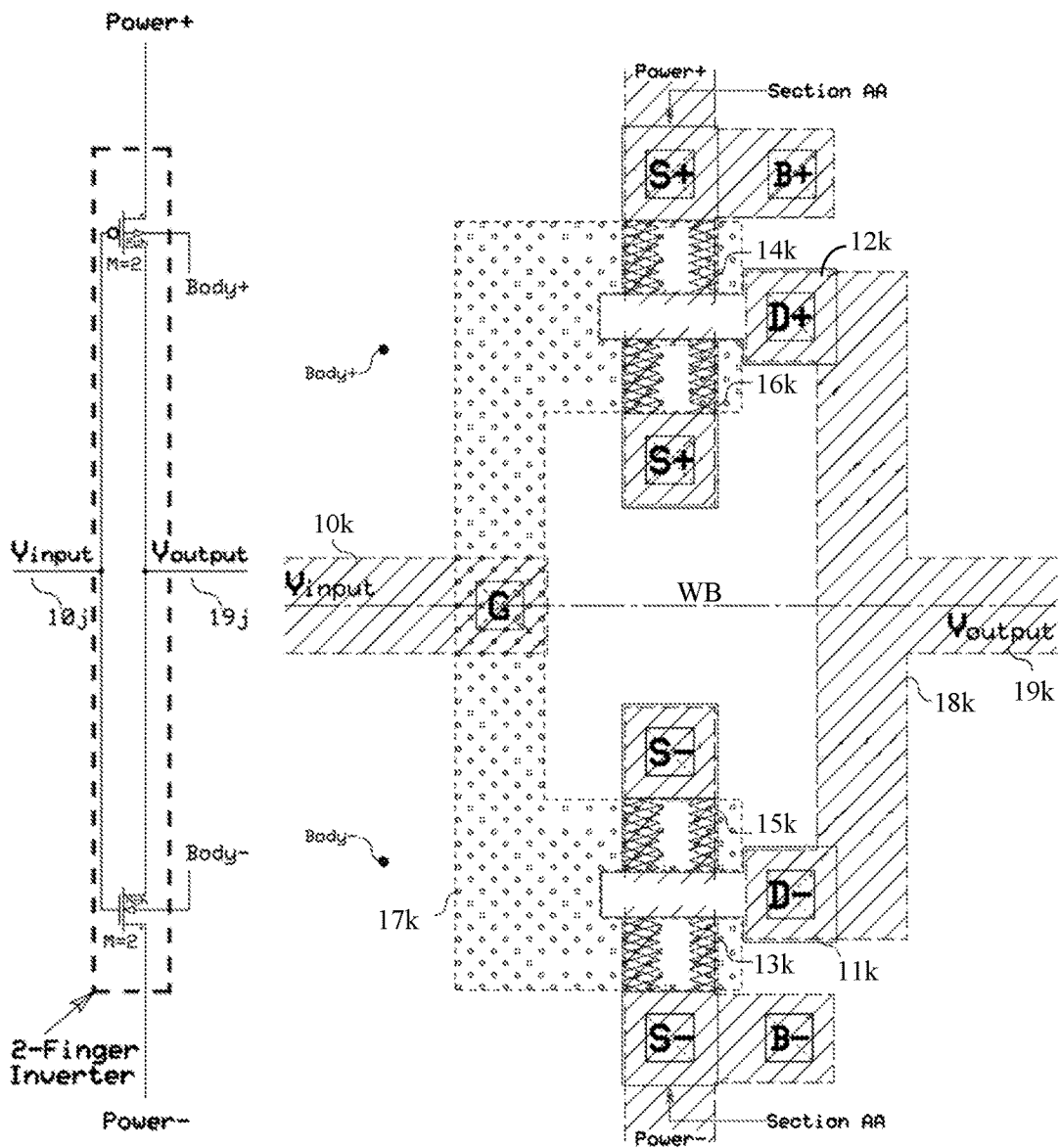
PRIOR ART
Figure 1j
PRIOR ART
Figure 1k

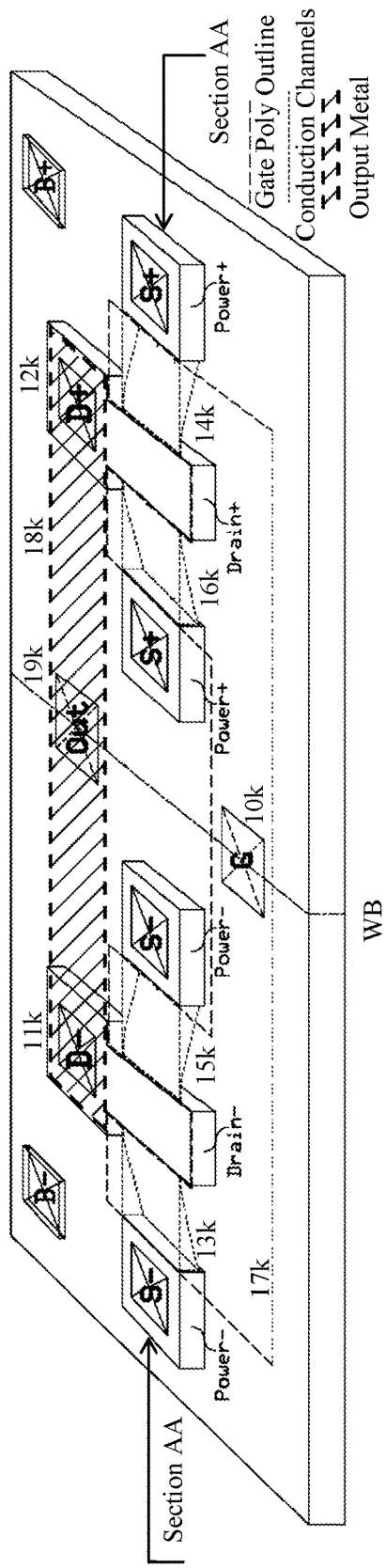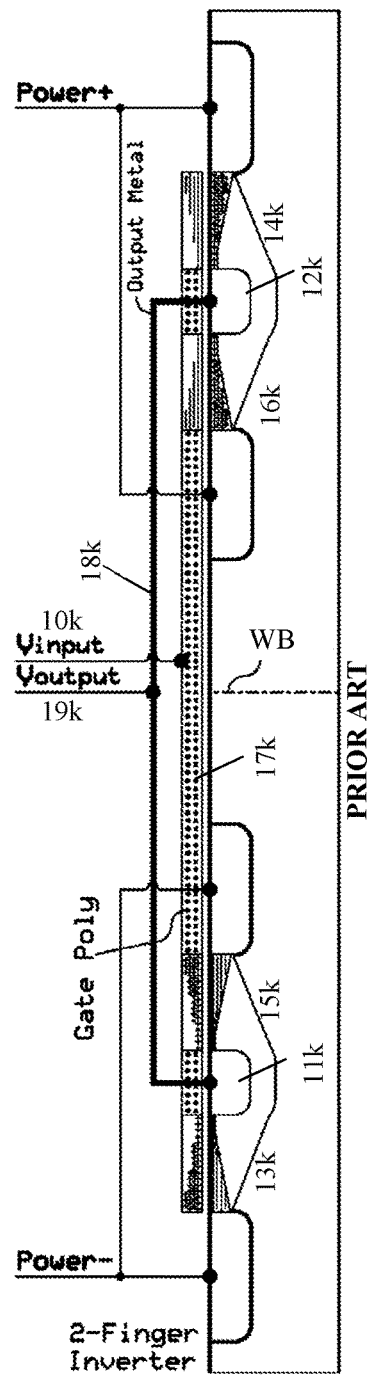

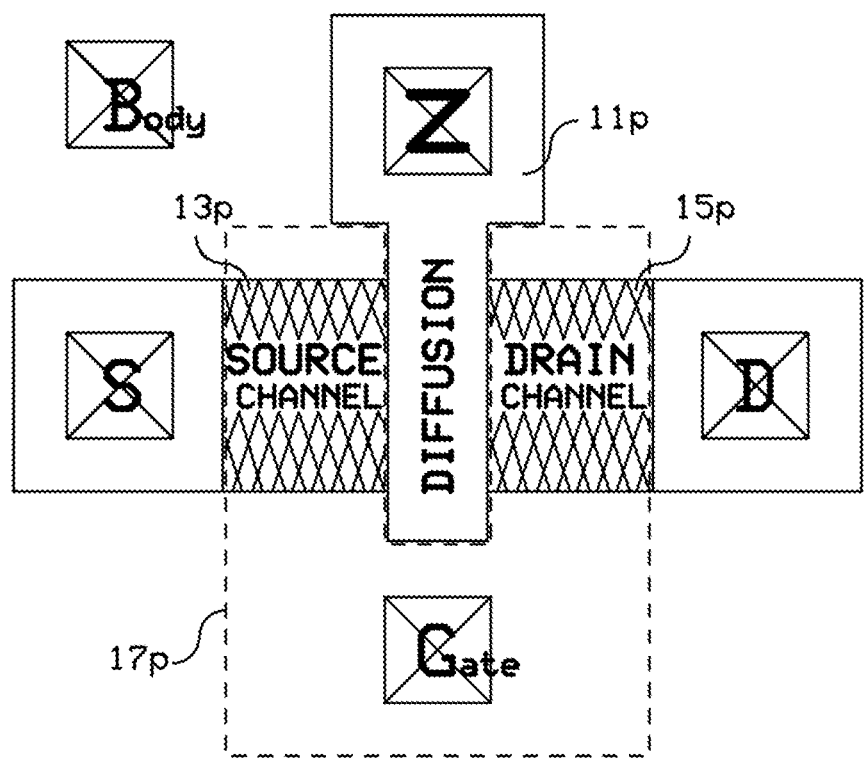
PRIOR ART
Figure 1p

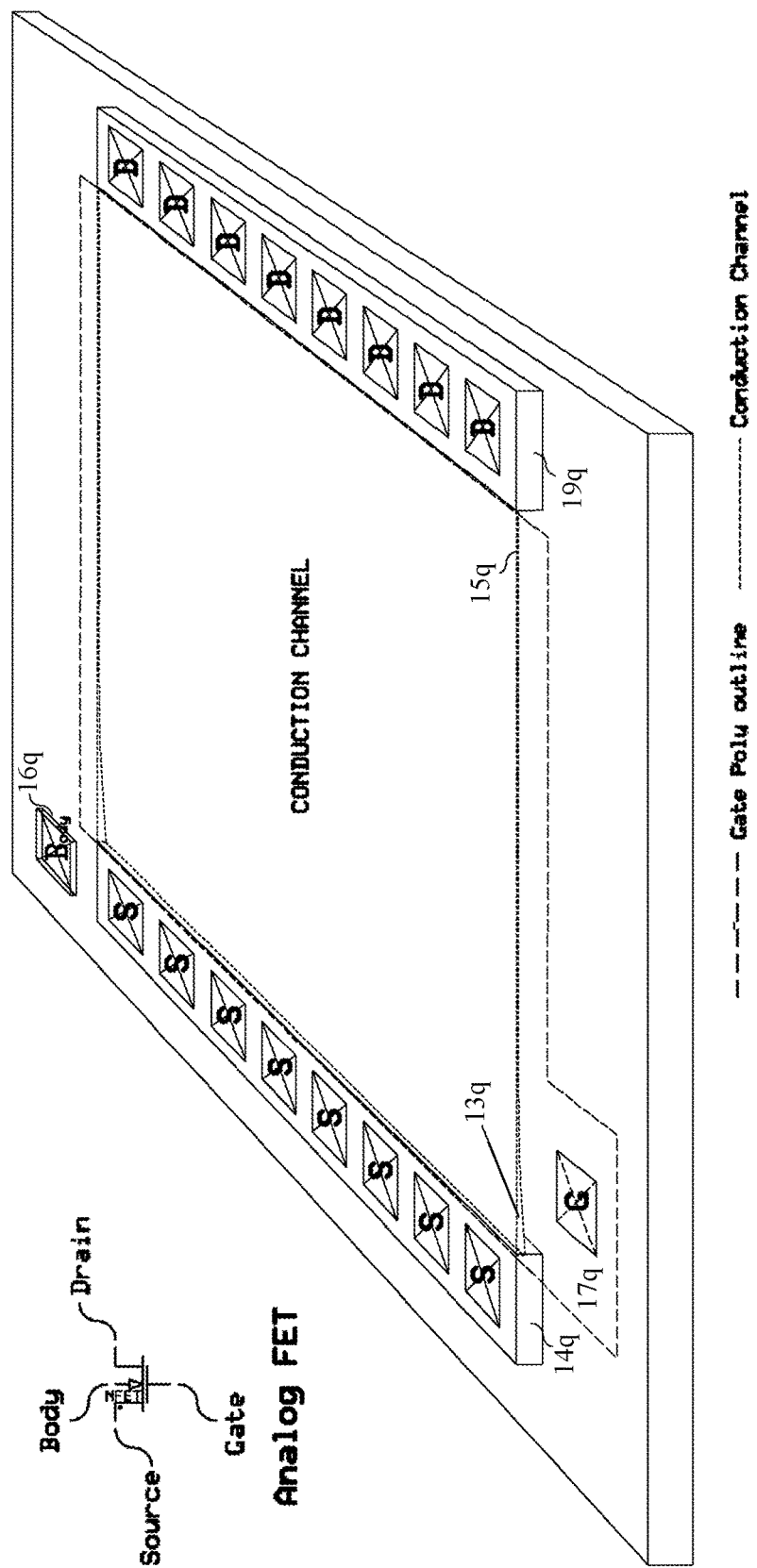
PRIOR ART
Figure 1q

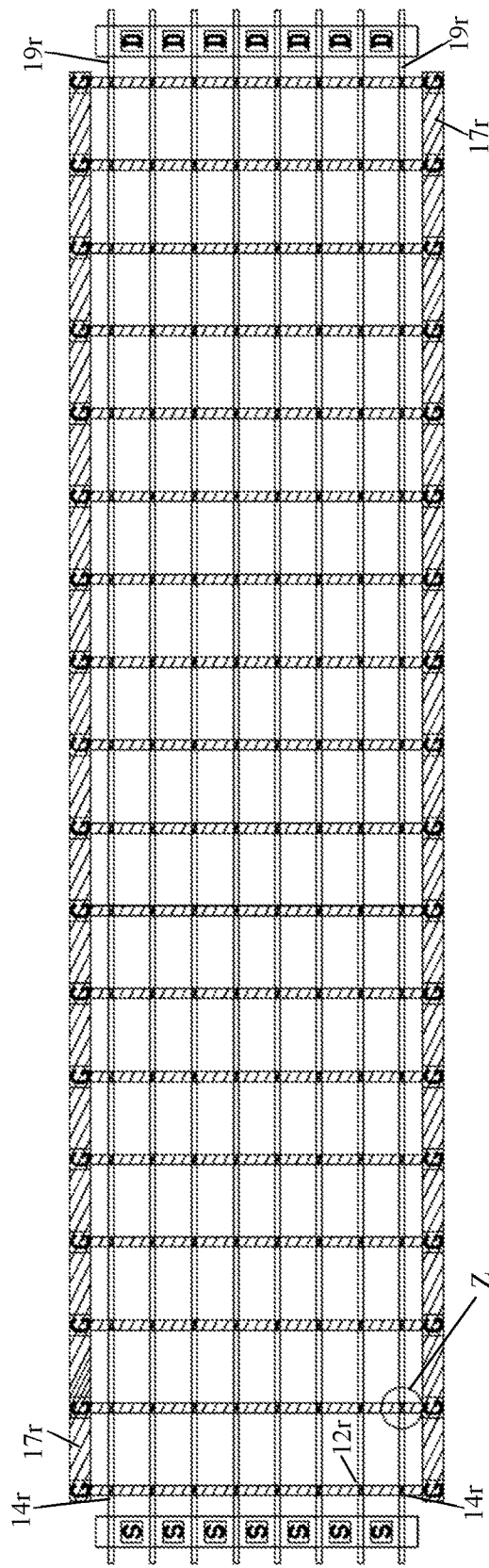
PRIOR ART
Figure 1r

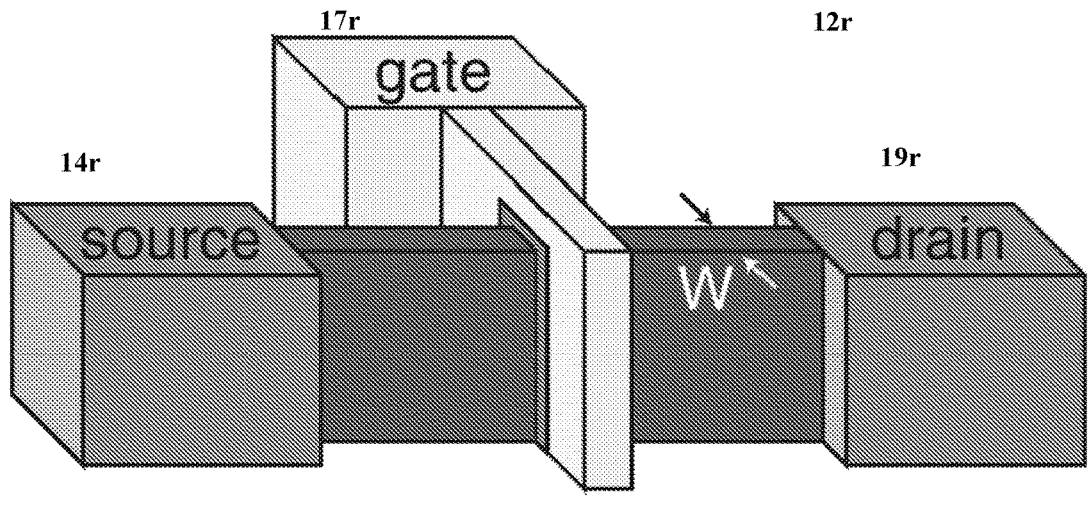
PRIOR ART
Figure 1s
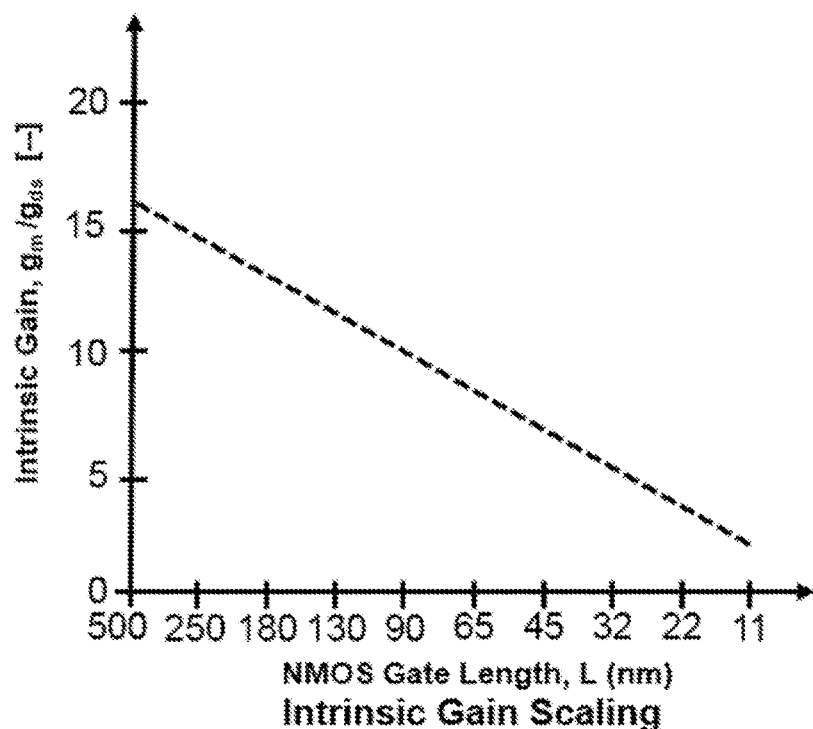
PRIOR ART
Figure 1t

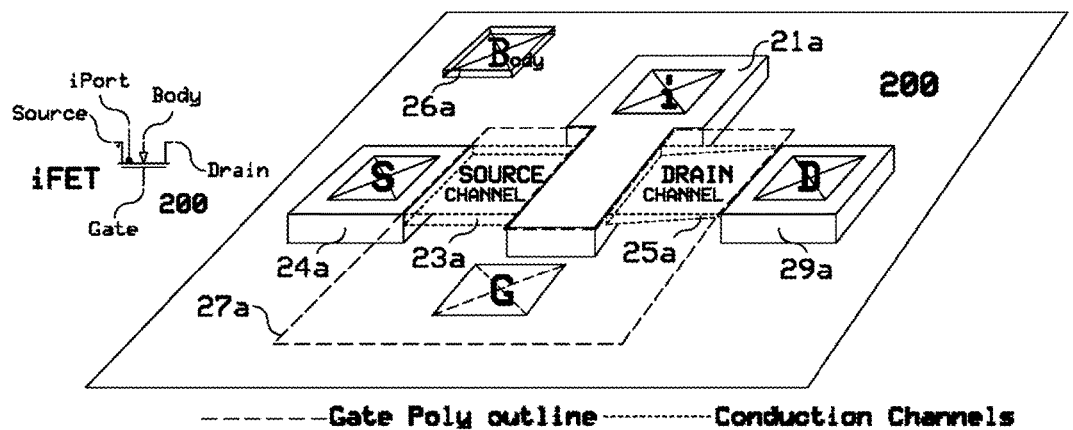
Figure 2a
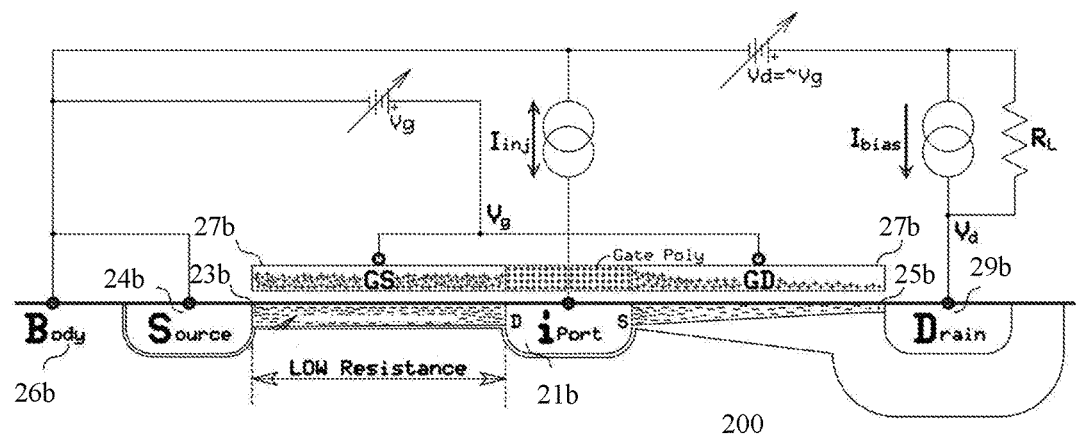
Figure 2b

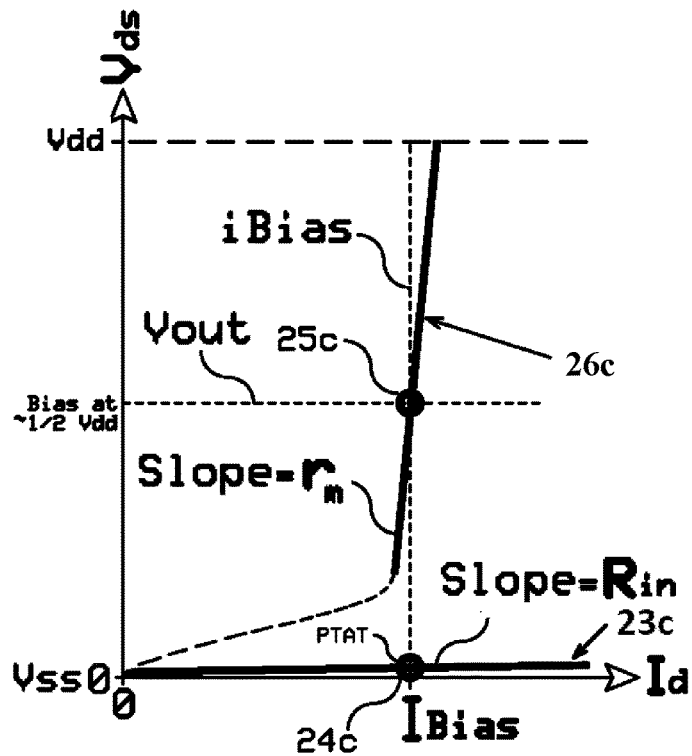
Figure 2c
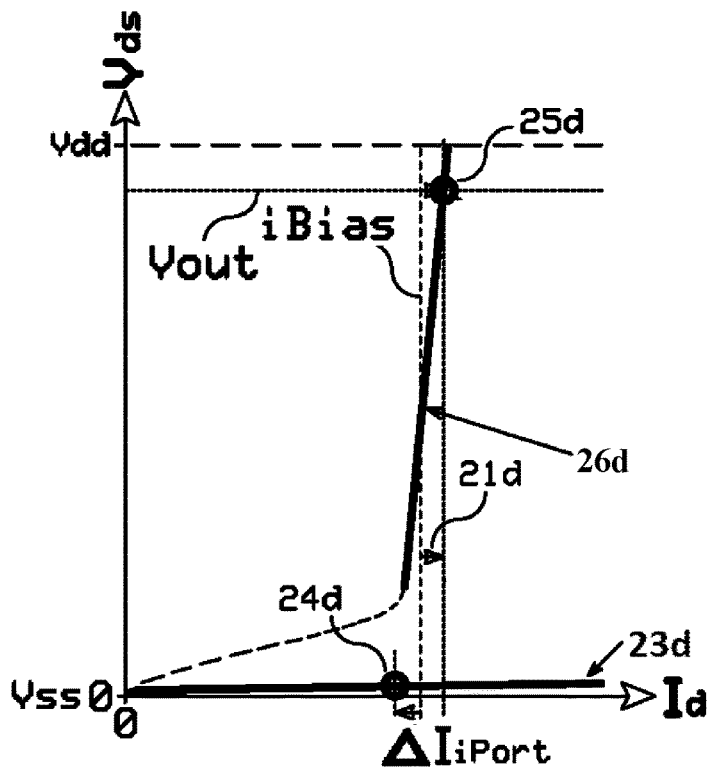
Figure 2d

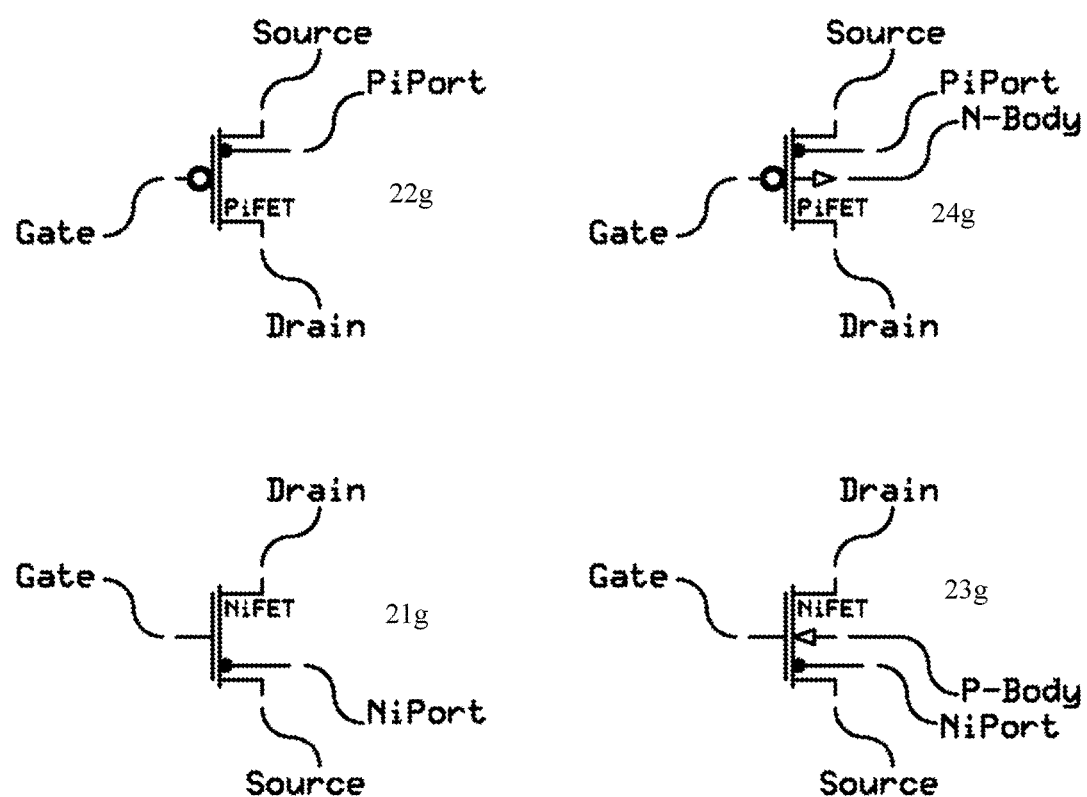
Figure 2e

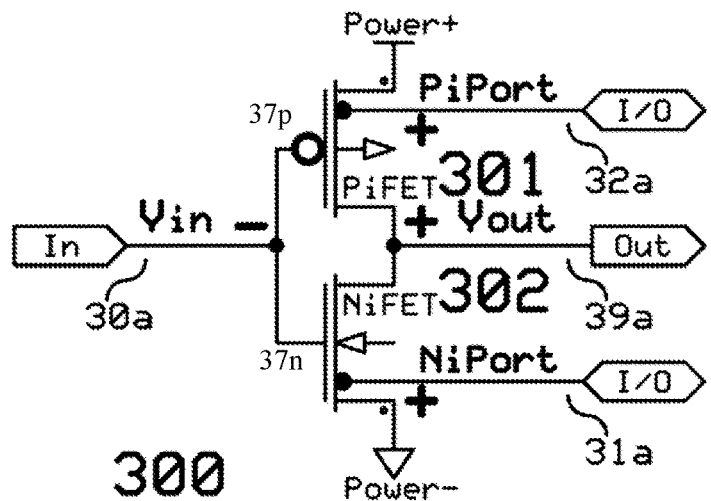
Figure 3a
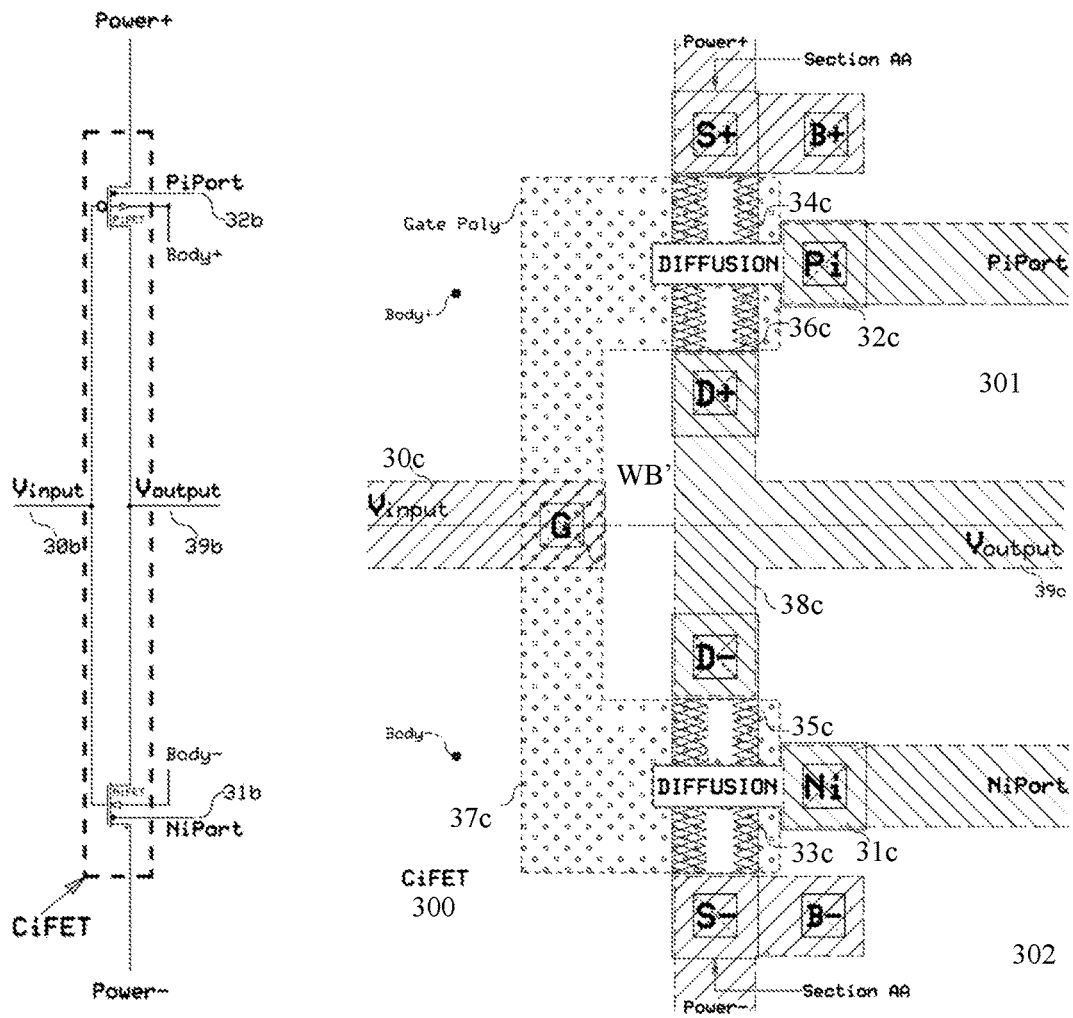
Figure 3b
Figure 3c

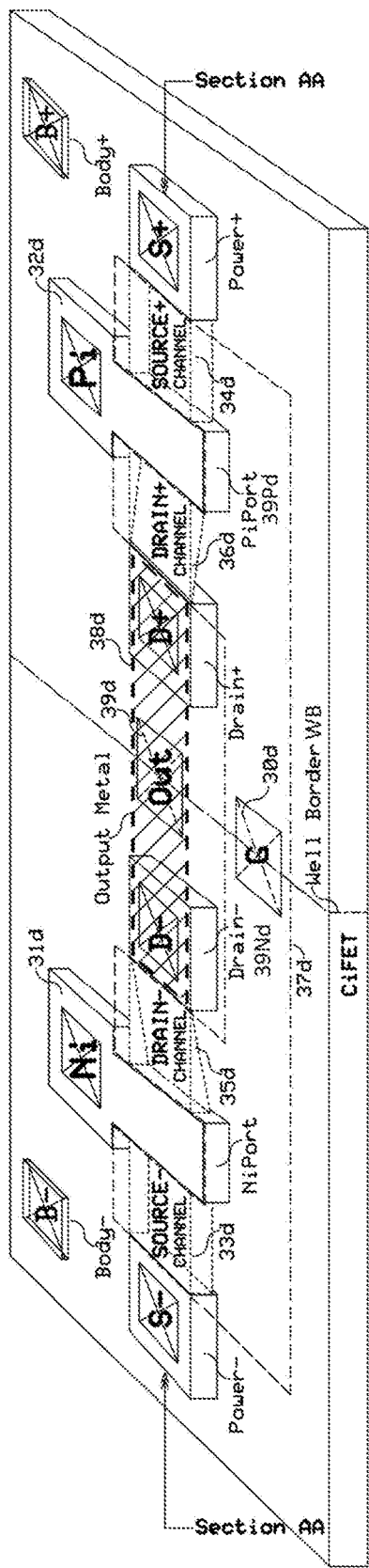
Figure 3d
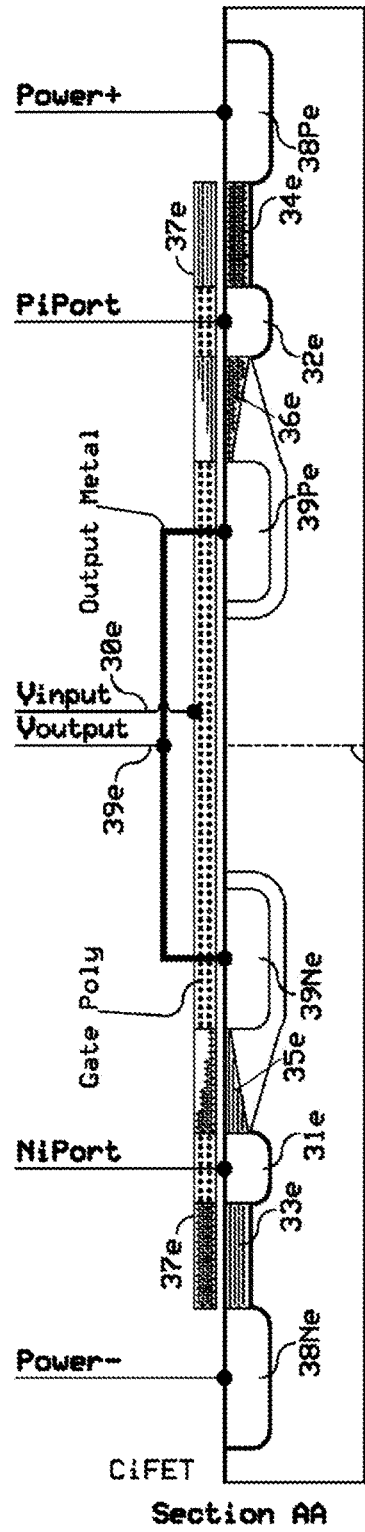
CiFET
Figure 3e

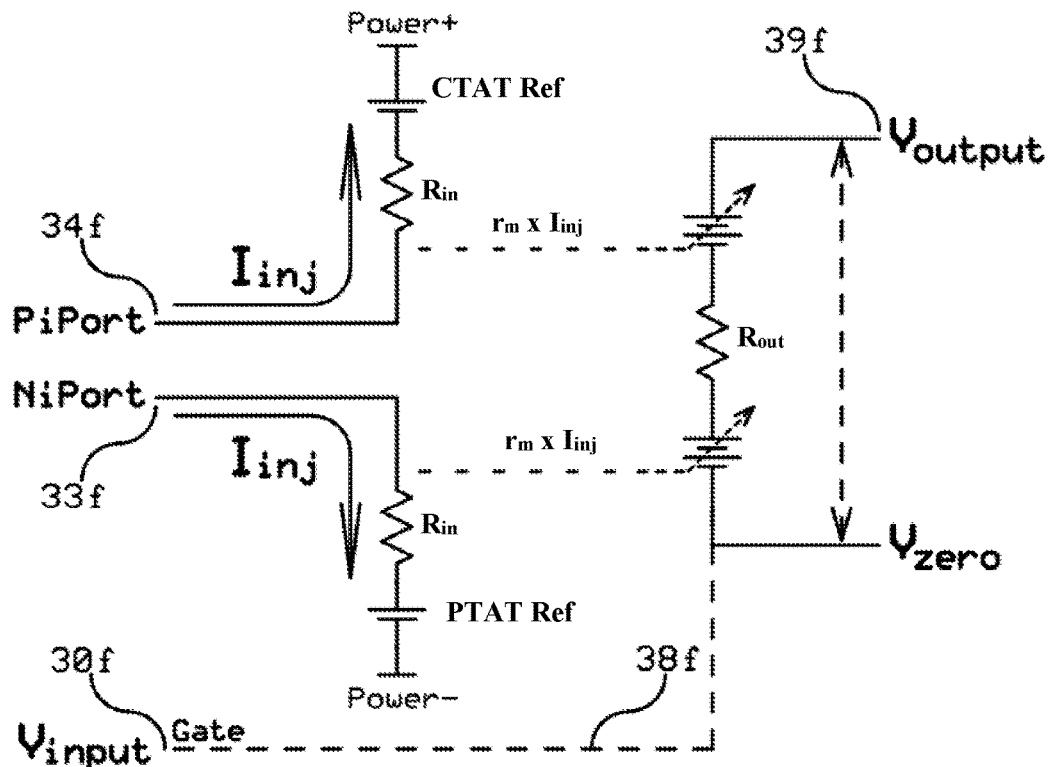
Figure 3f
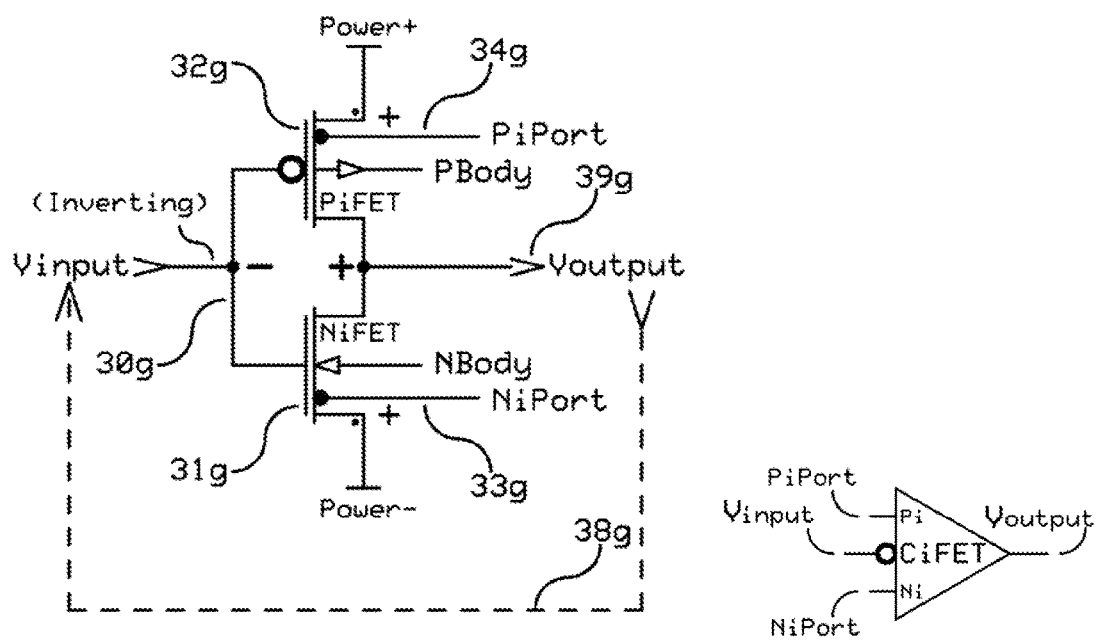
Figure 3g
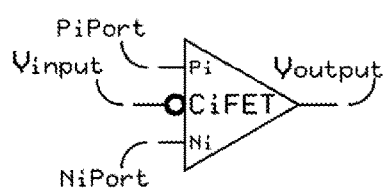
Figure 3h

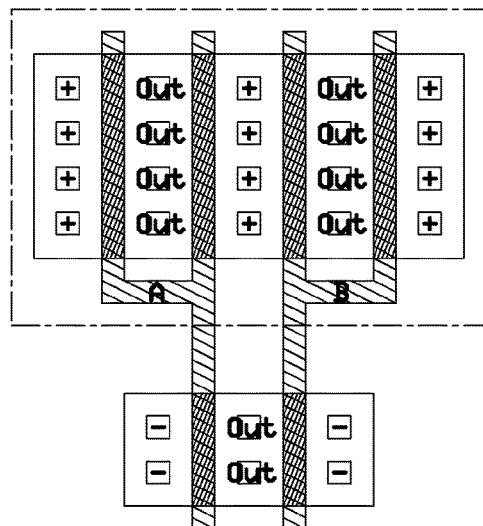
PRIOR ART
Figure 3i
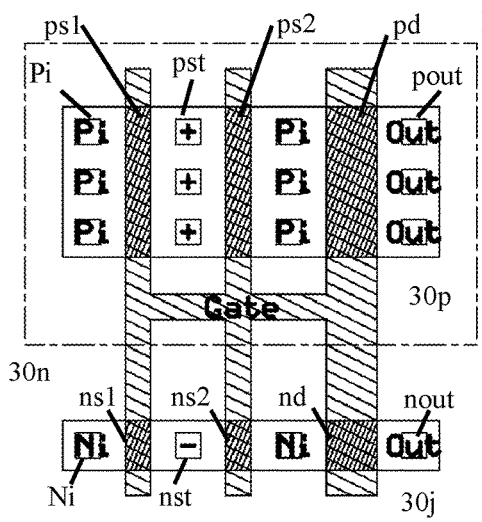
Figure 3j(1)
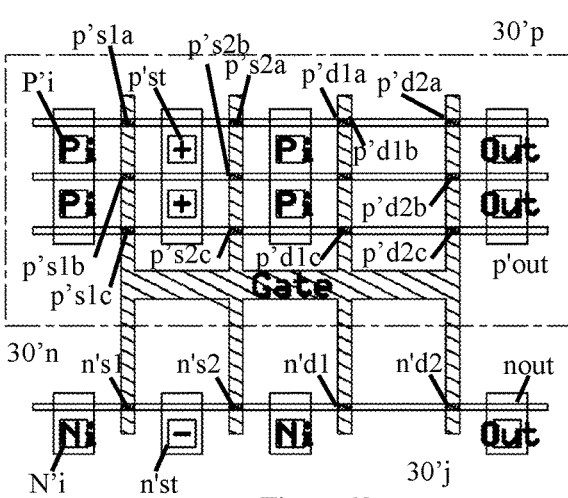
Figure 3k
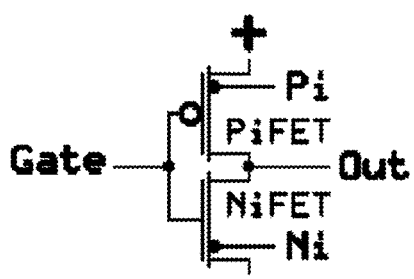
Figure 3j(2)
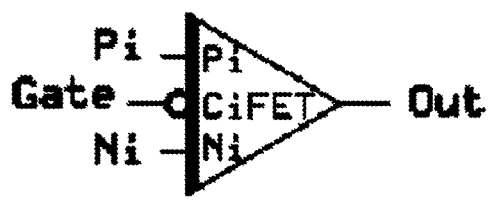
Figure 3j(3)

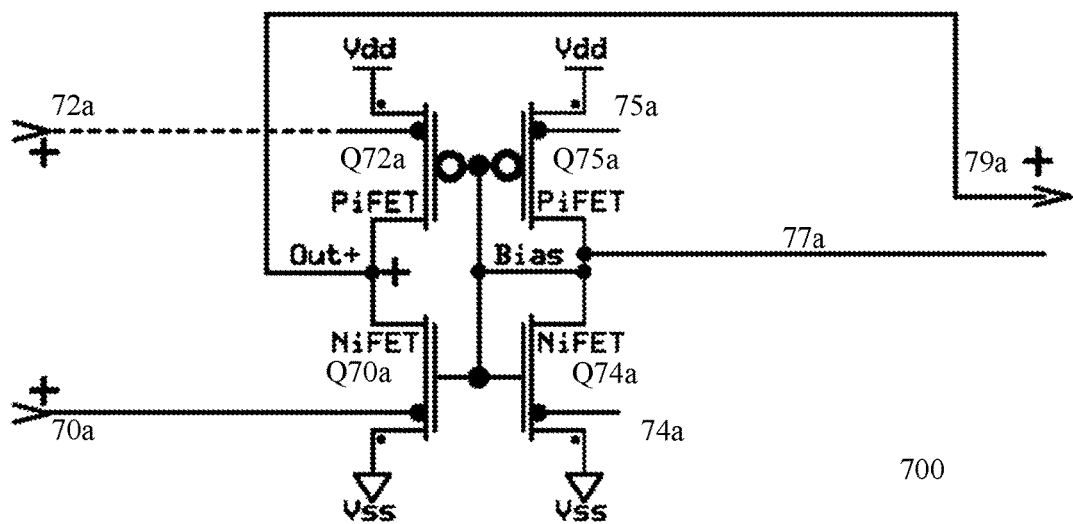
Figure 4a

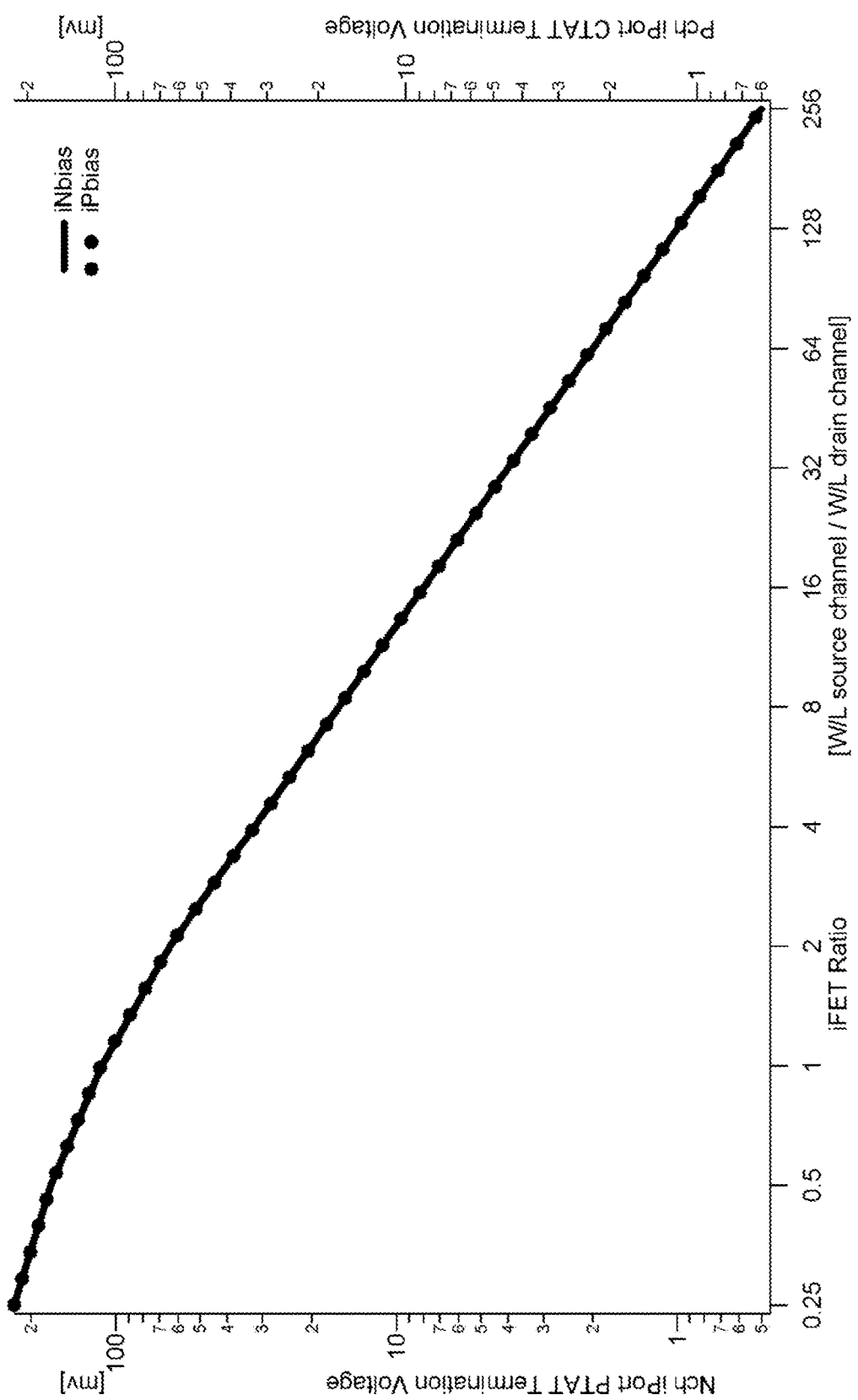
Figure 4b

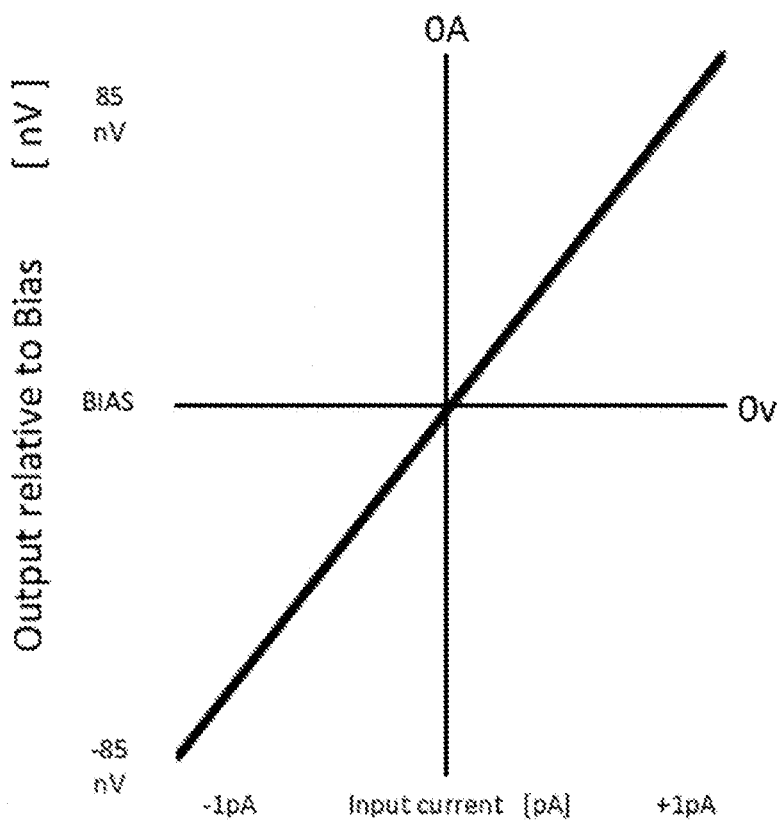
Figure 4c

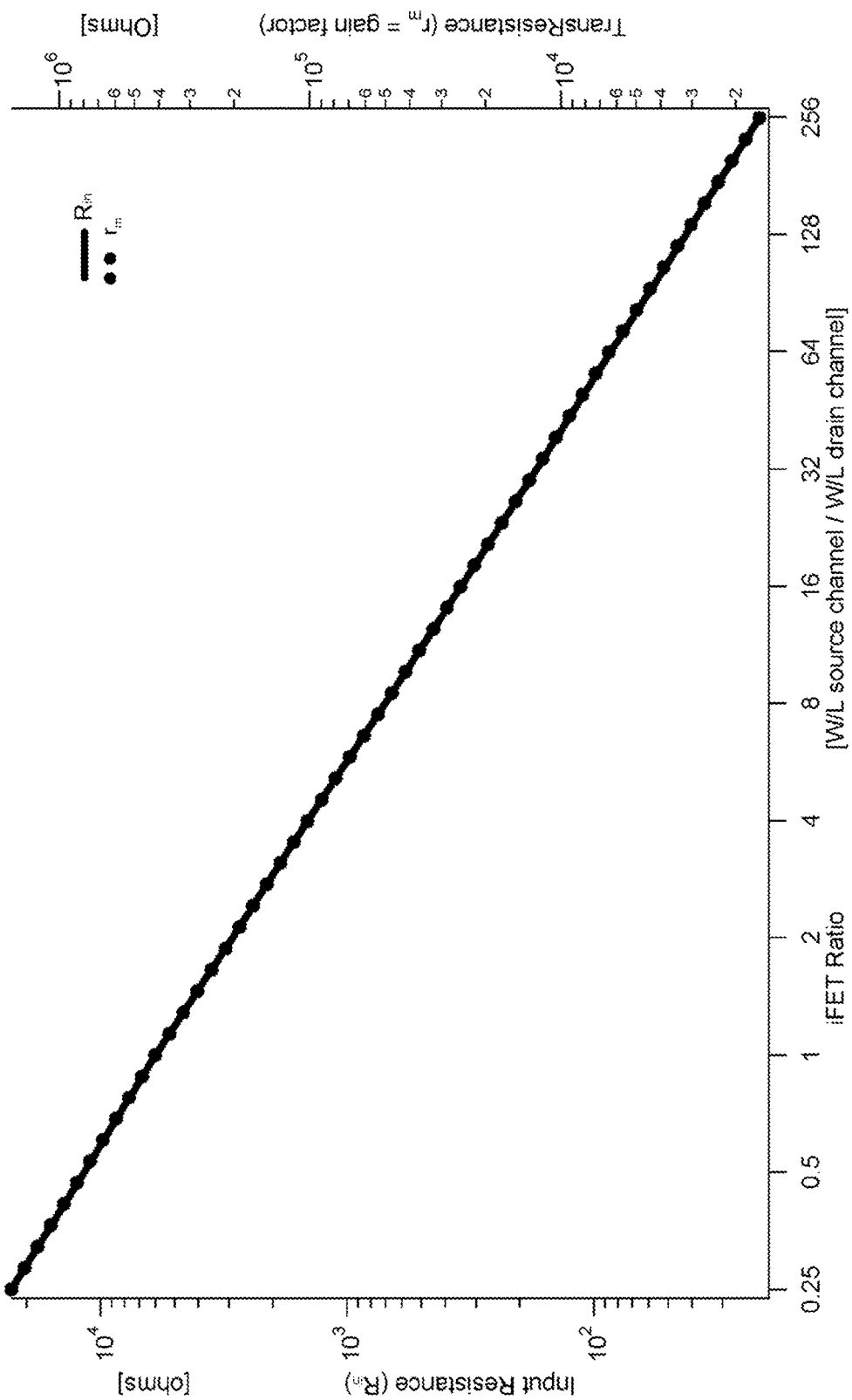
Figure 4d

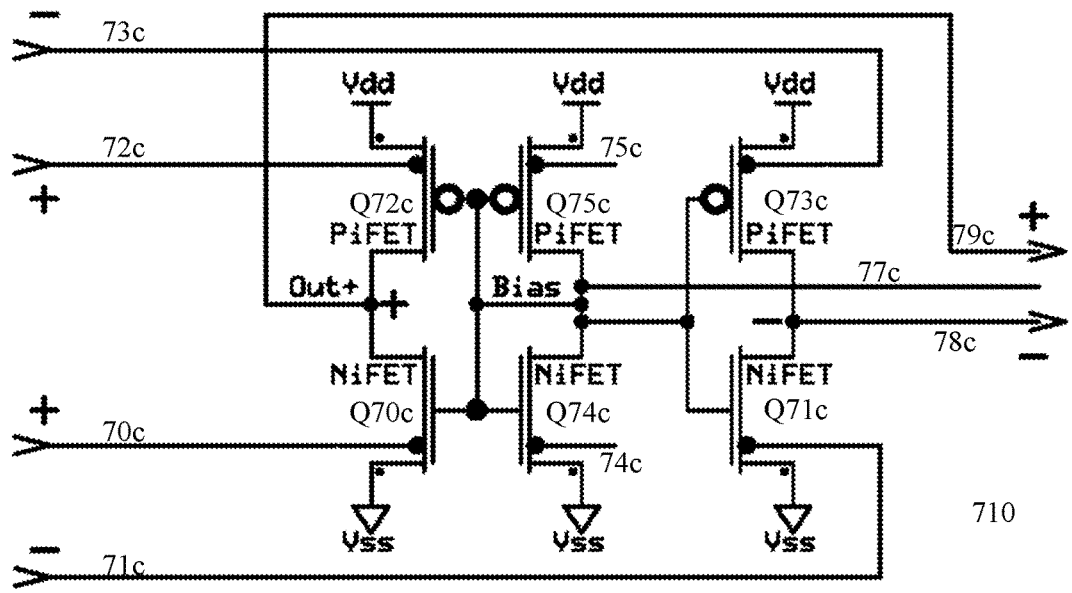
Figure 4e(1)
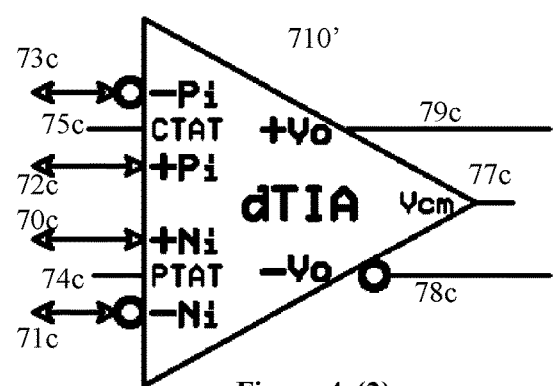
Figure 4e(2)

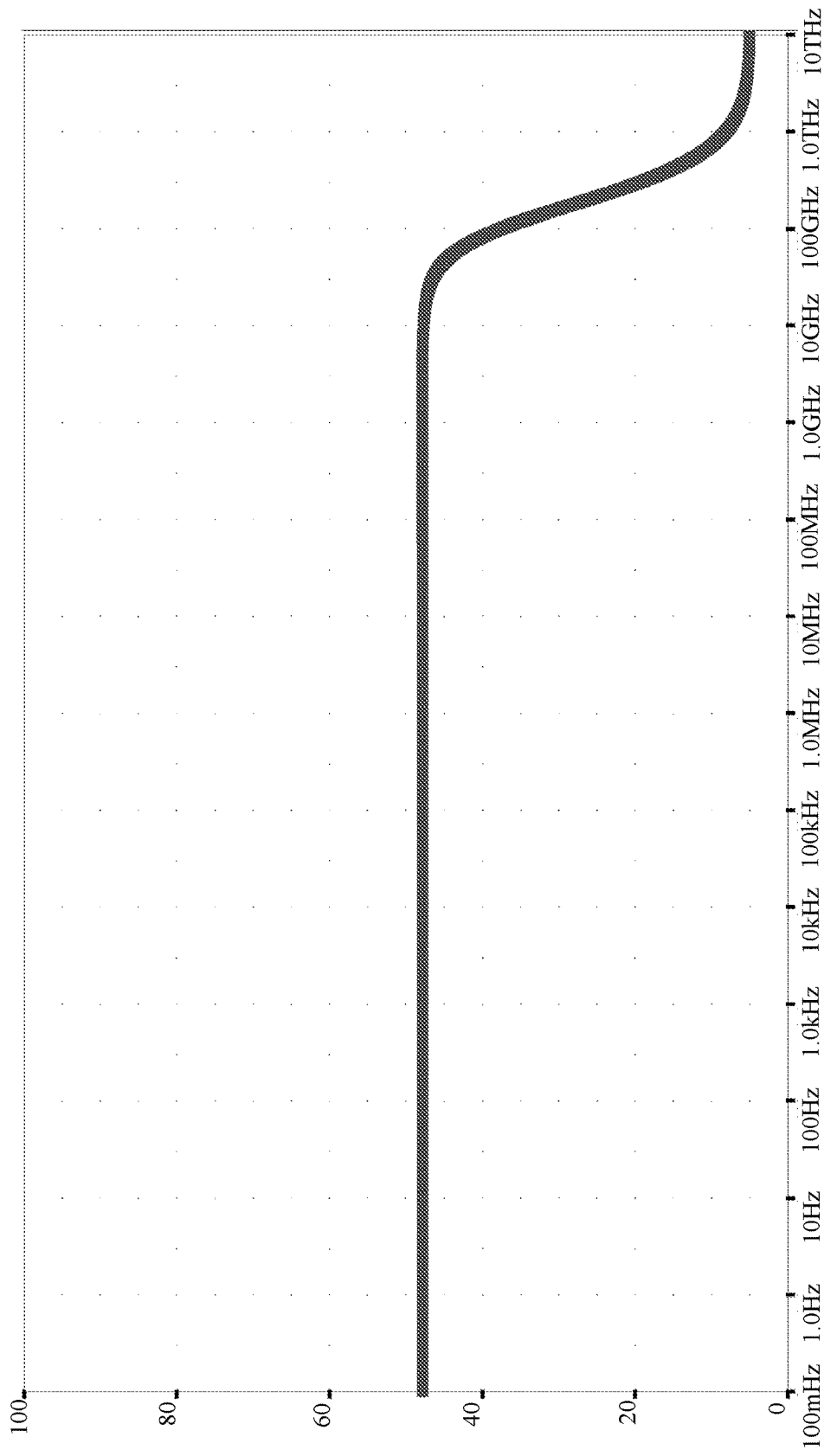
Figure 4f

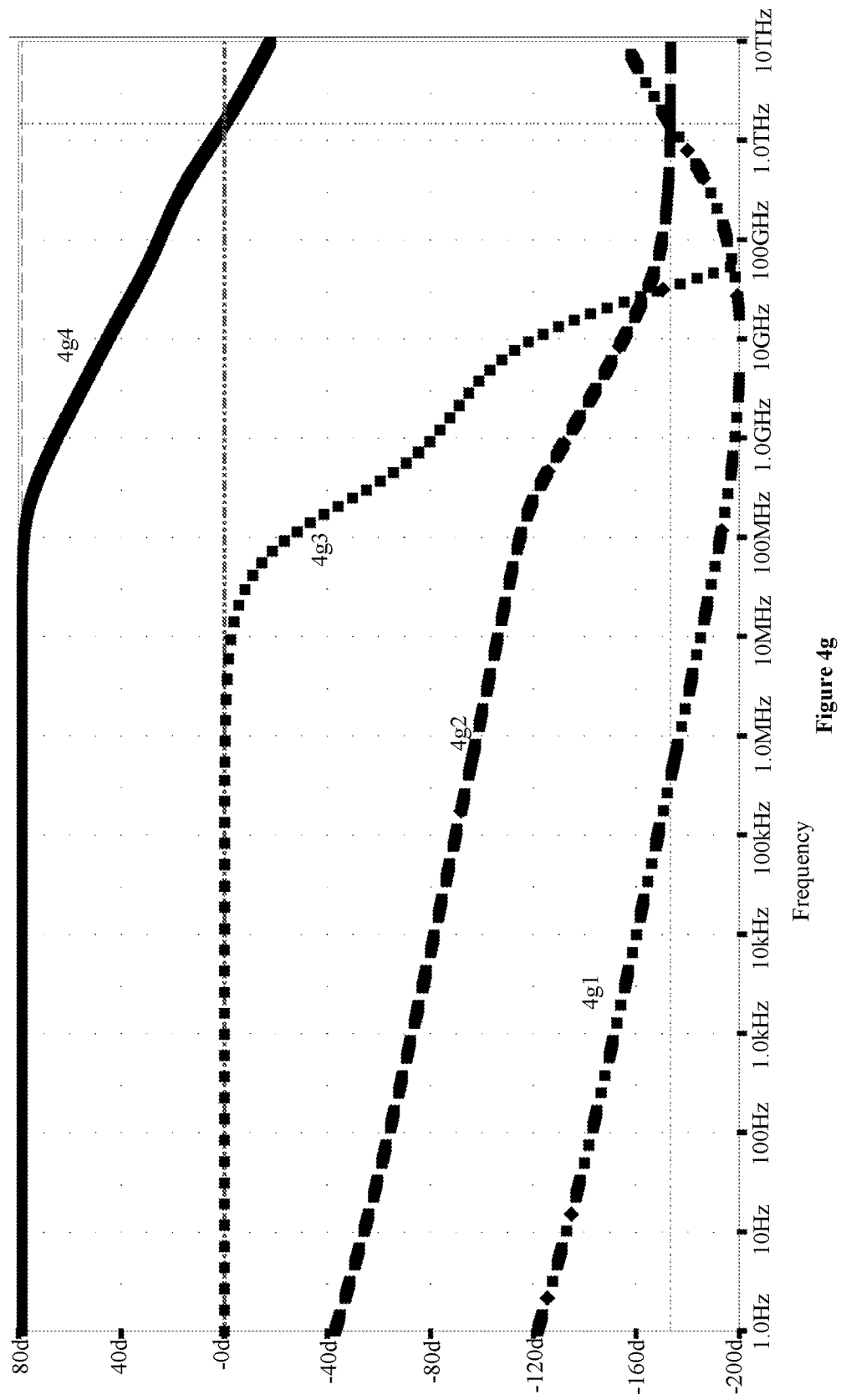
Figure 4g

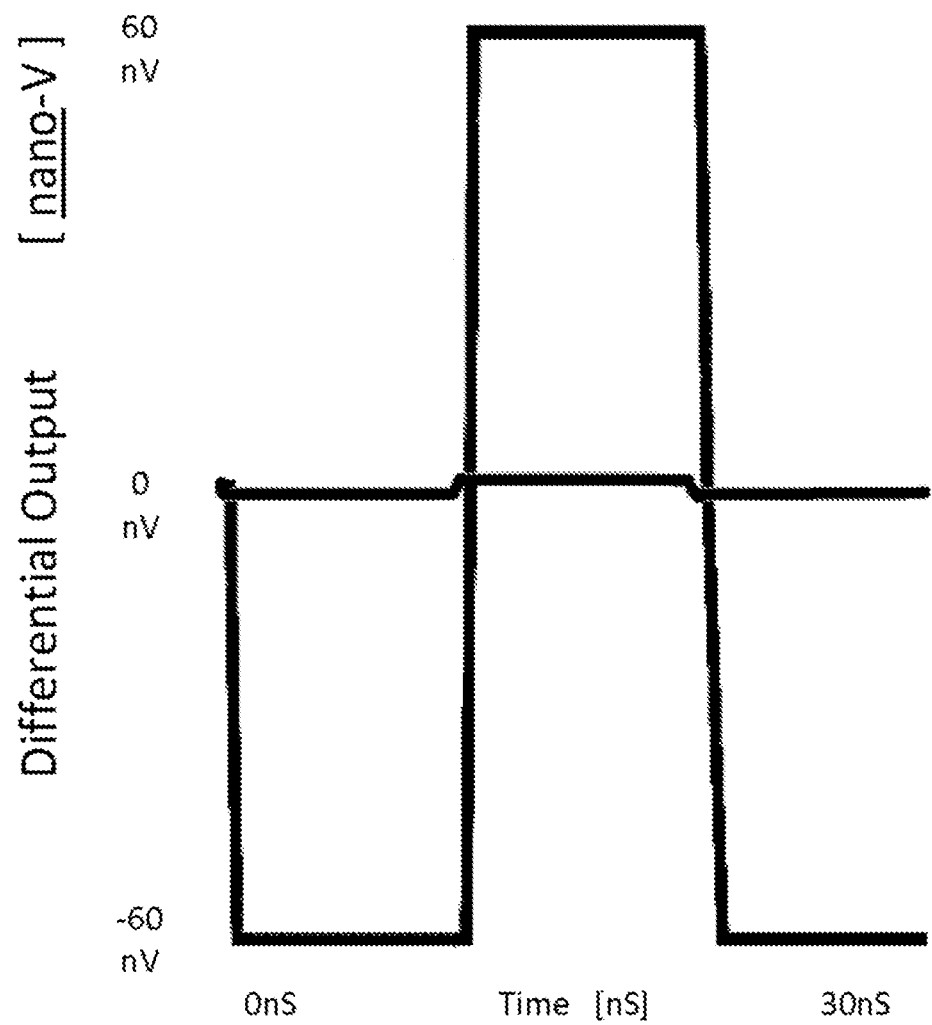
Figure 4h

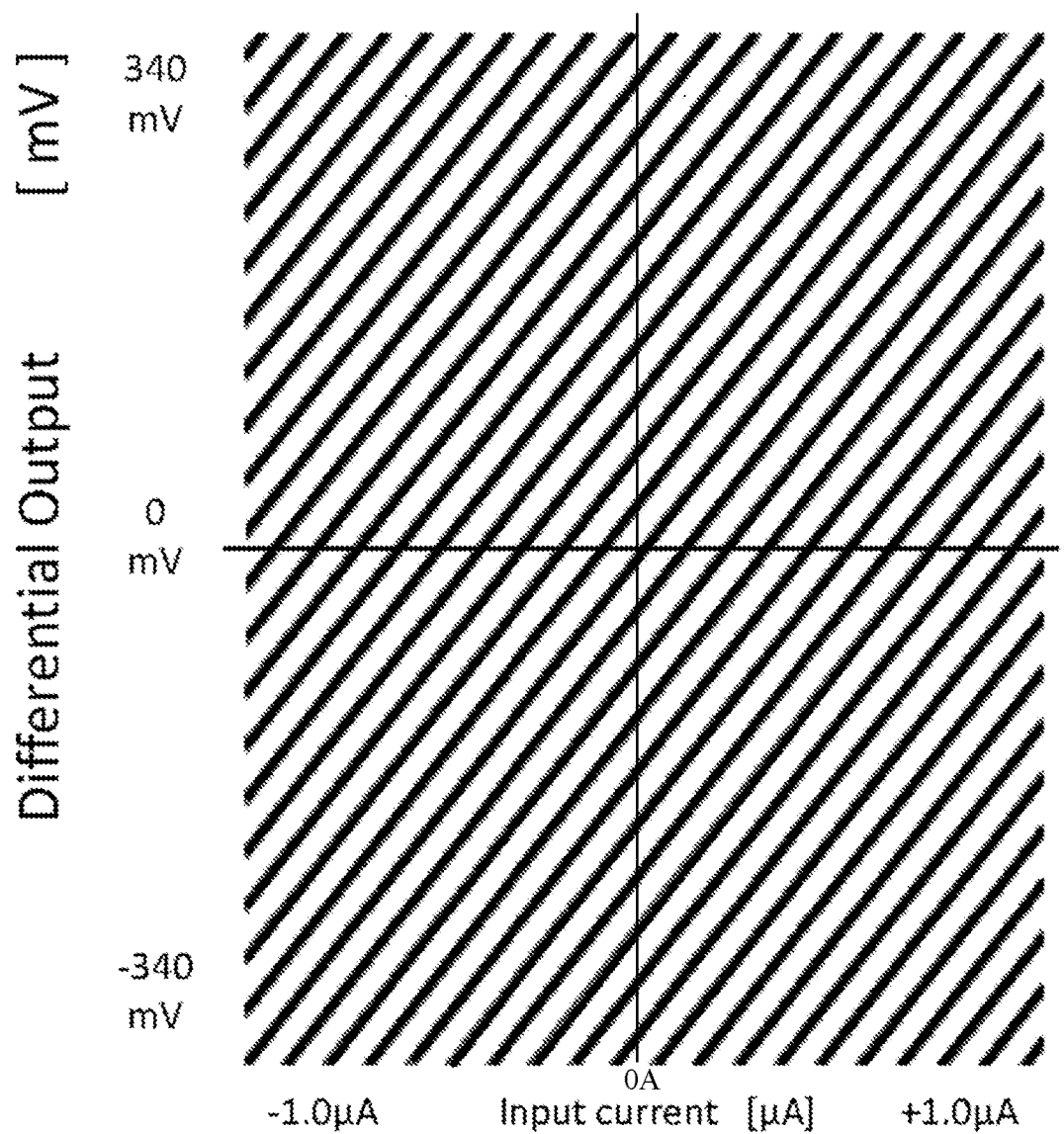
Figure 4i

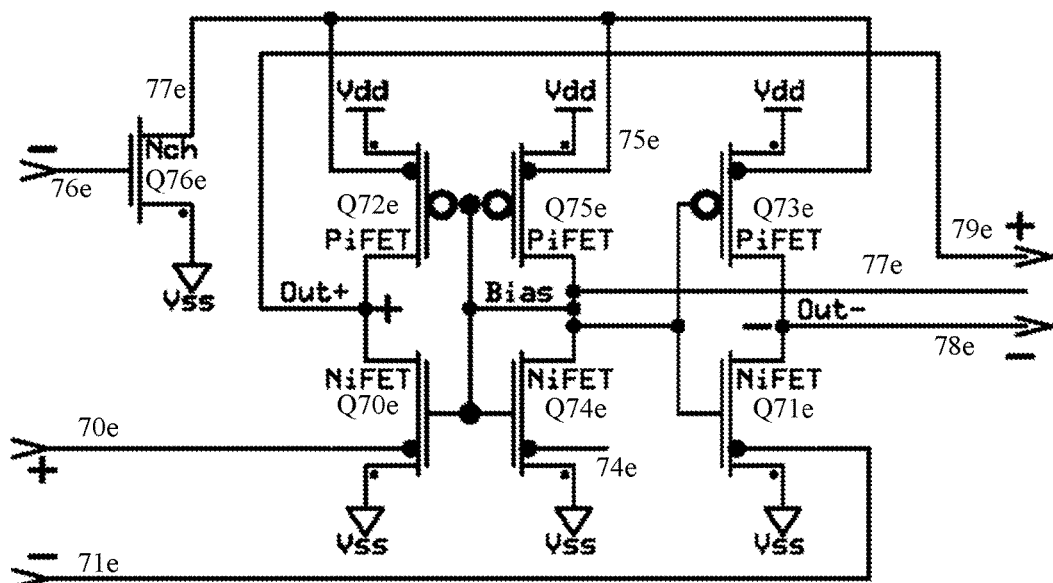
Figure 4j

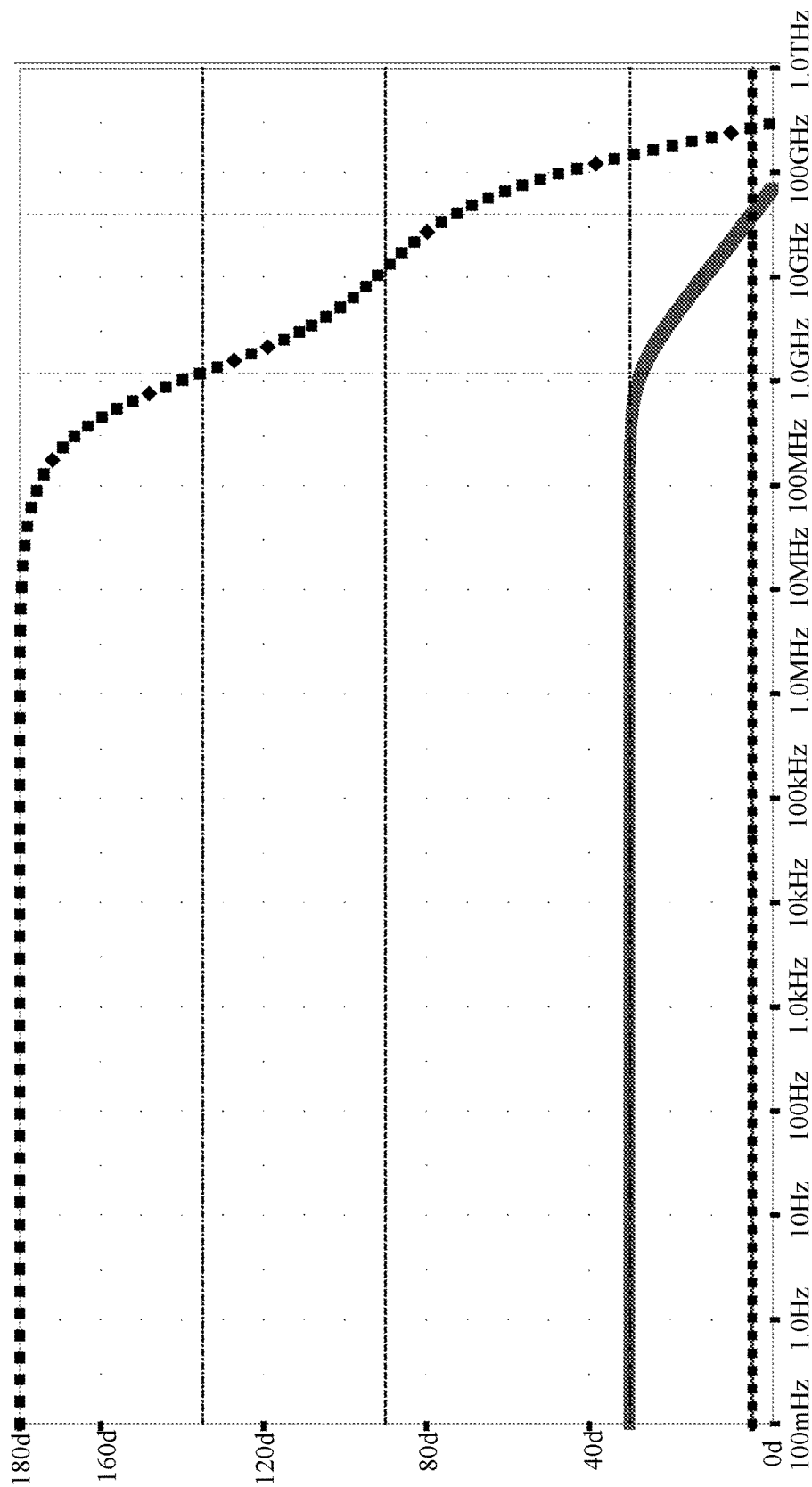
Figure 4k

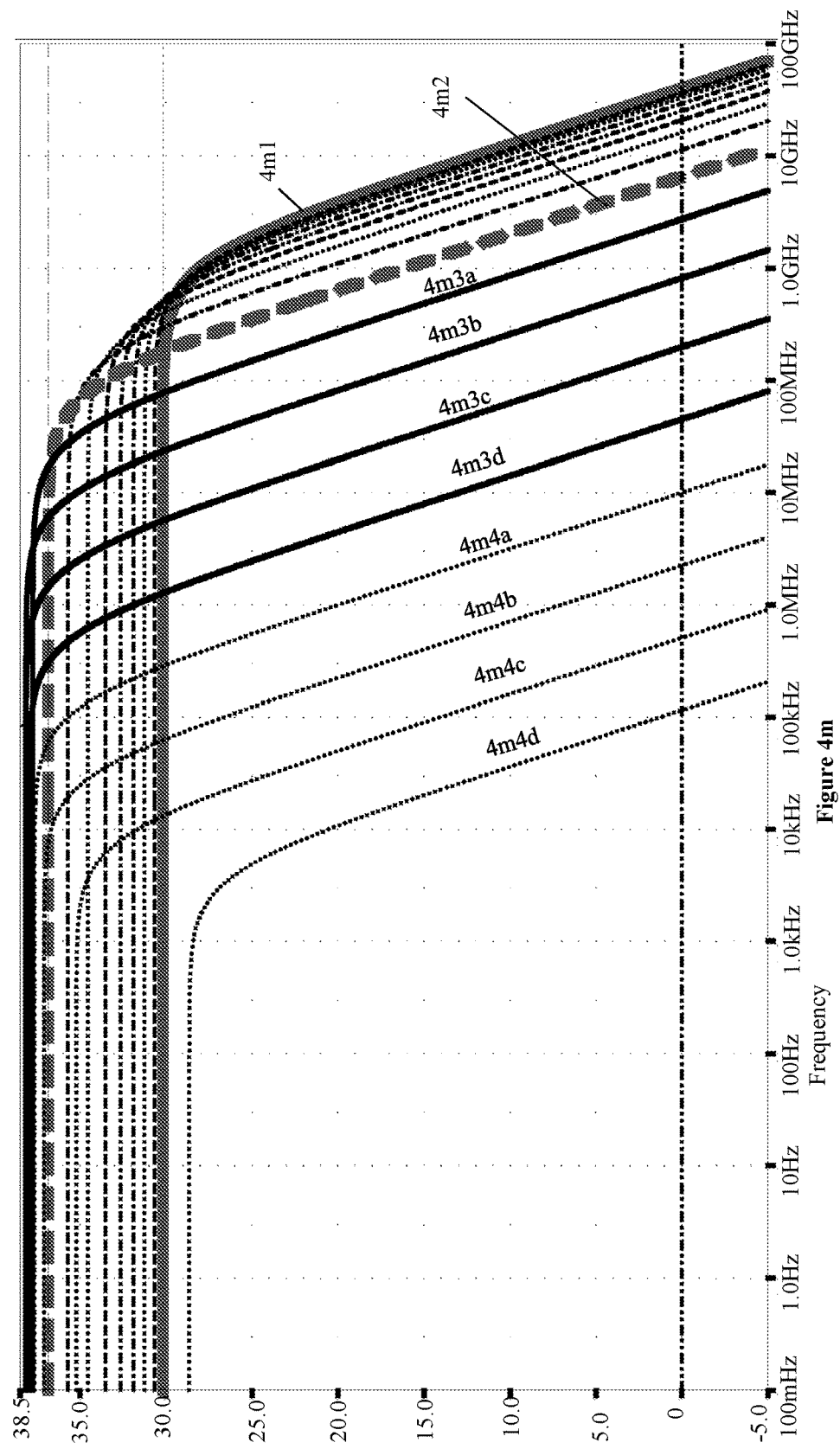
Figure 4m

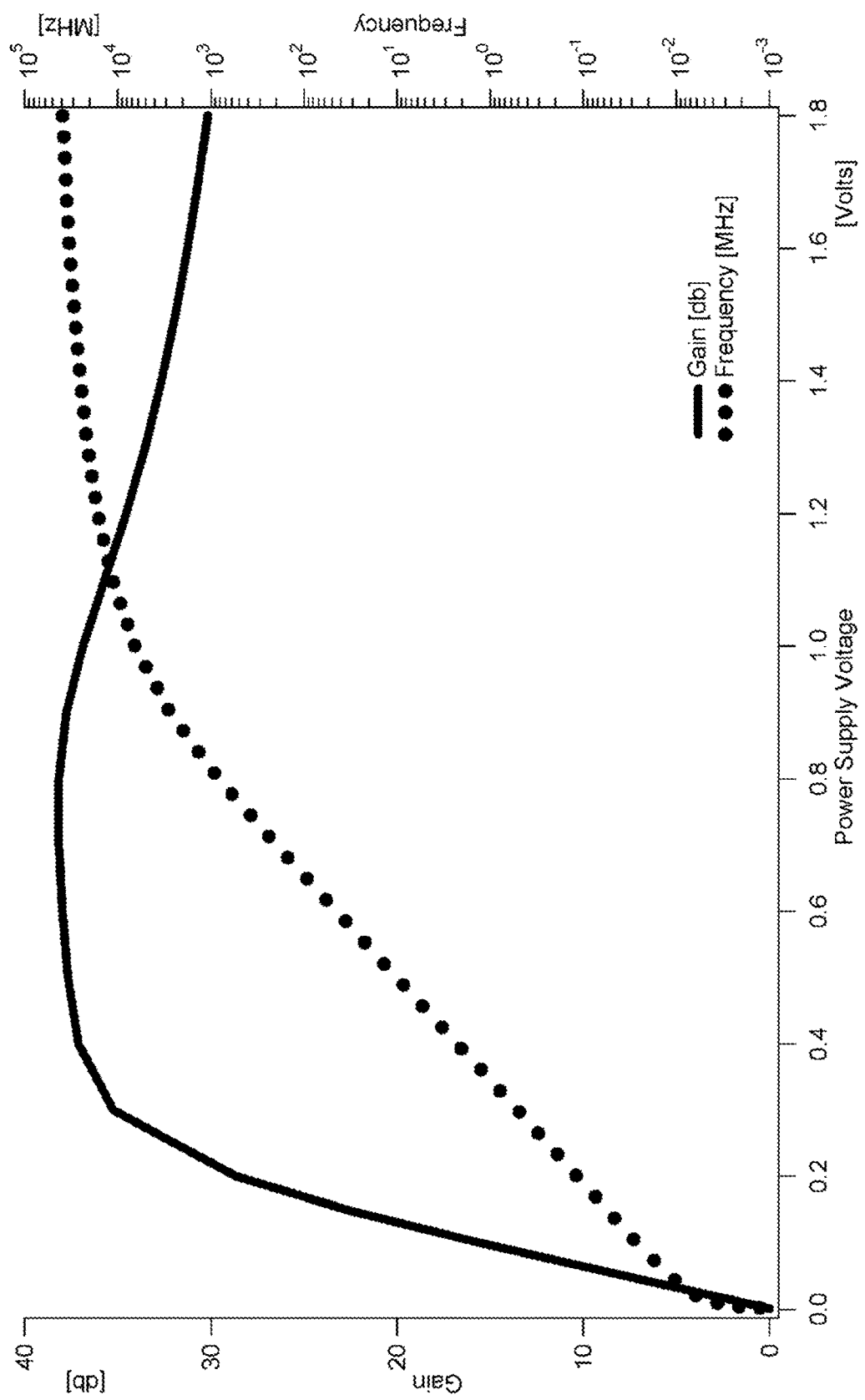
Figure 4n

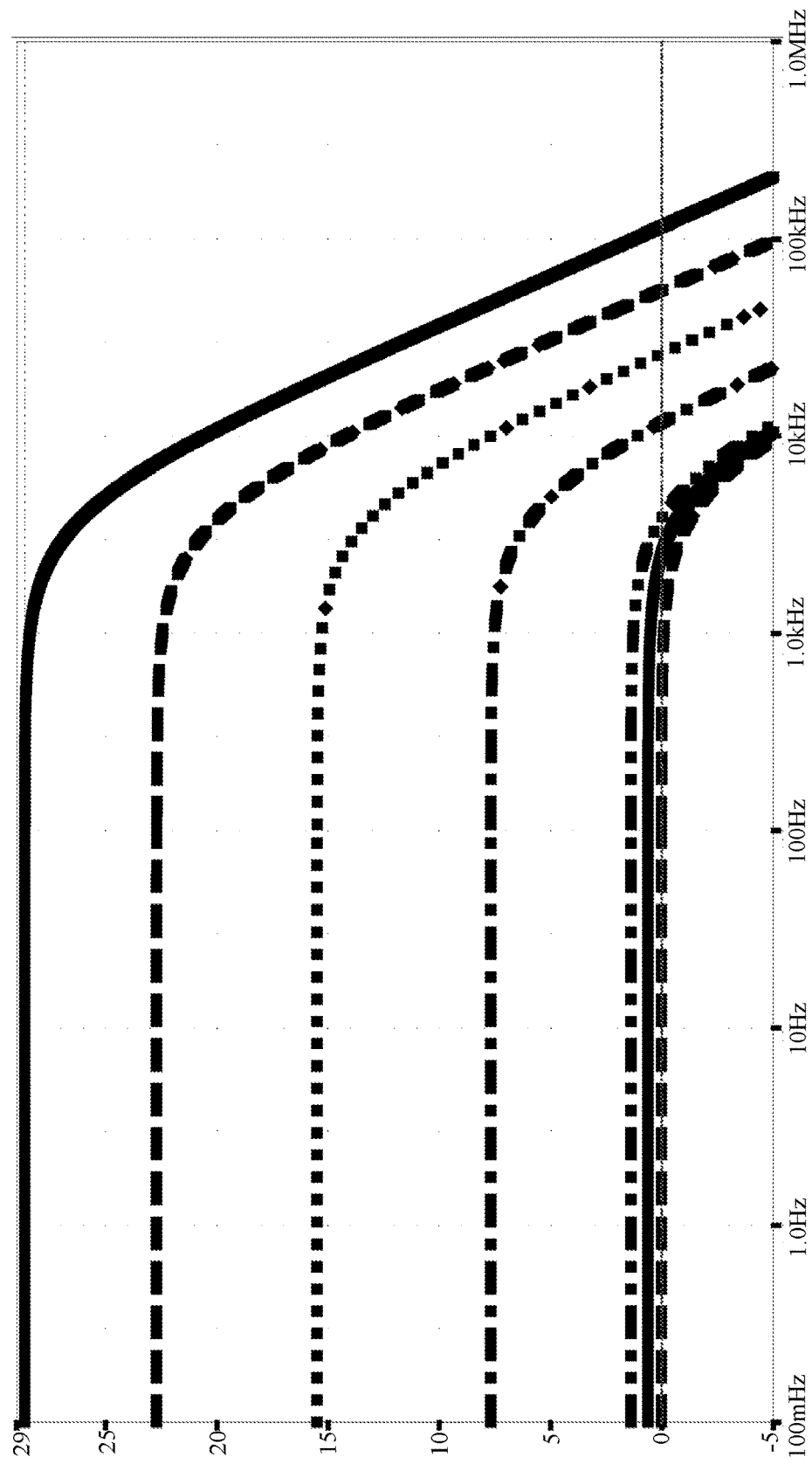
Figure 4o

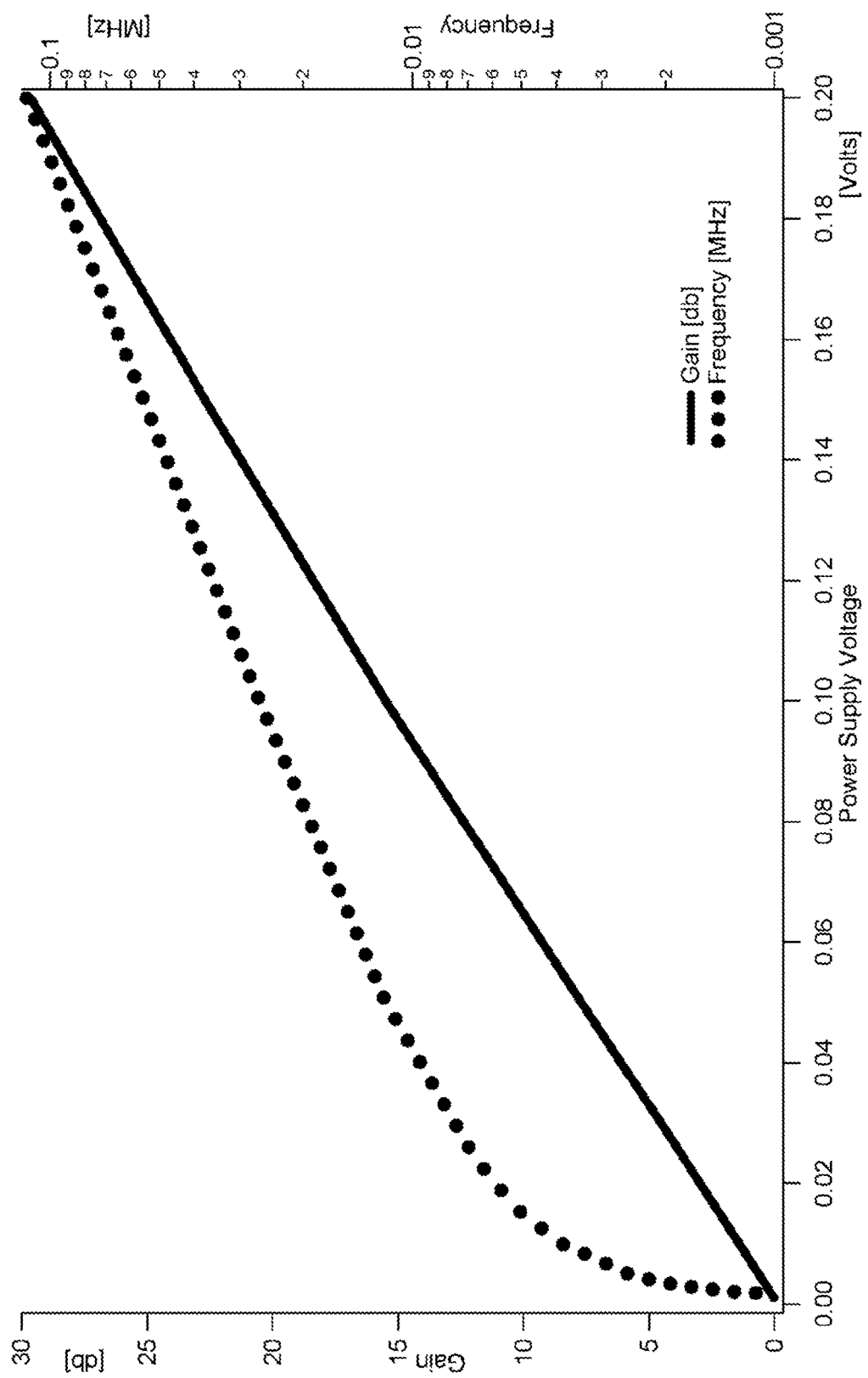
Figure 4p

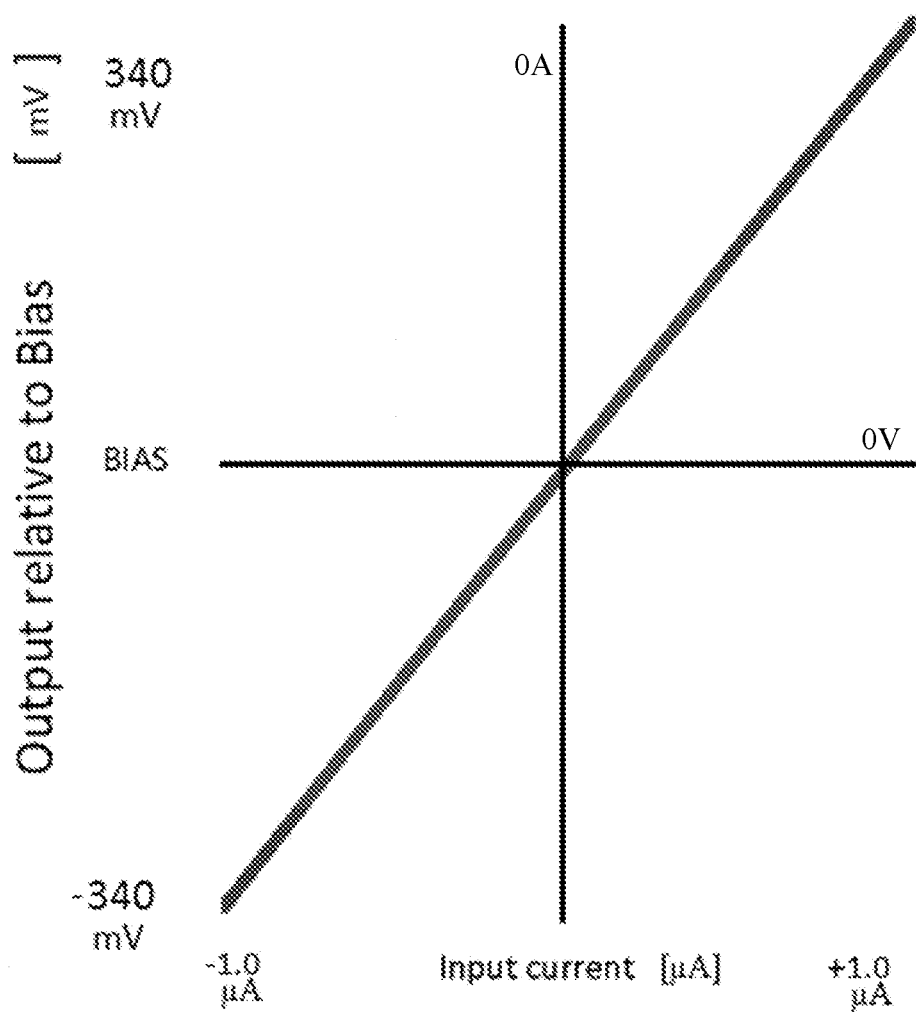
Figure 4q

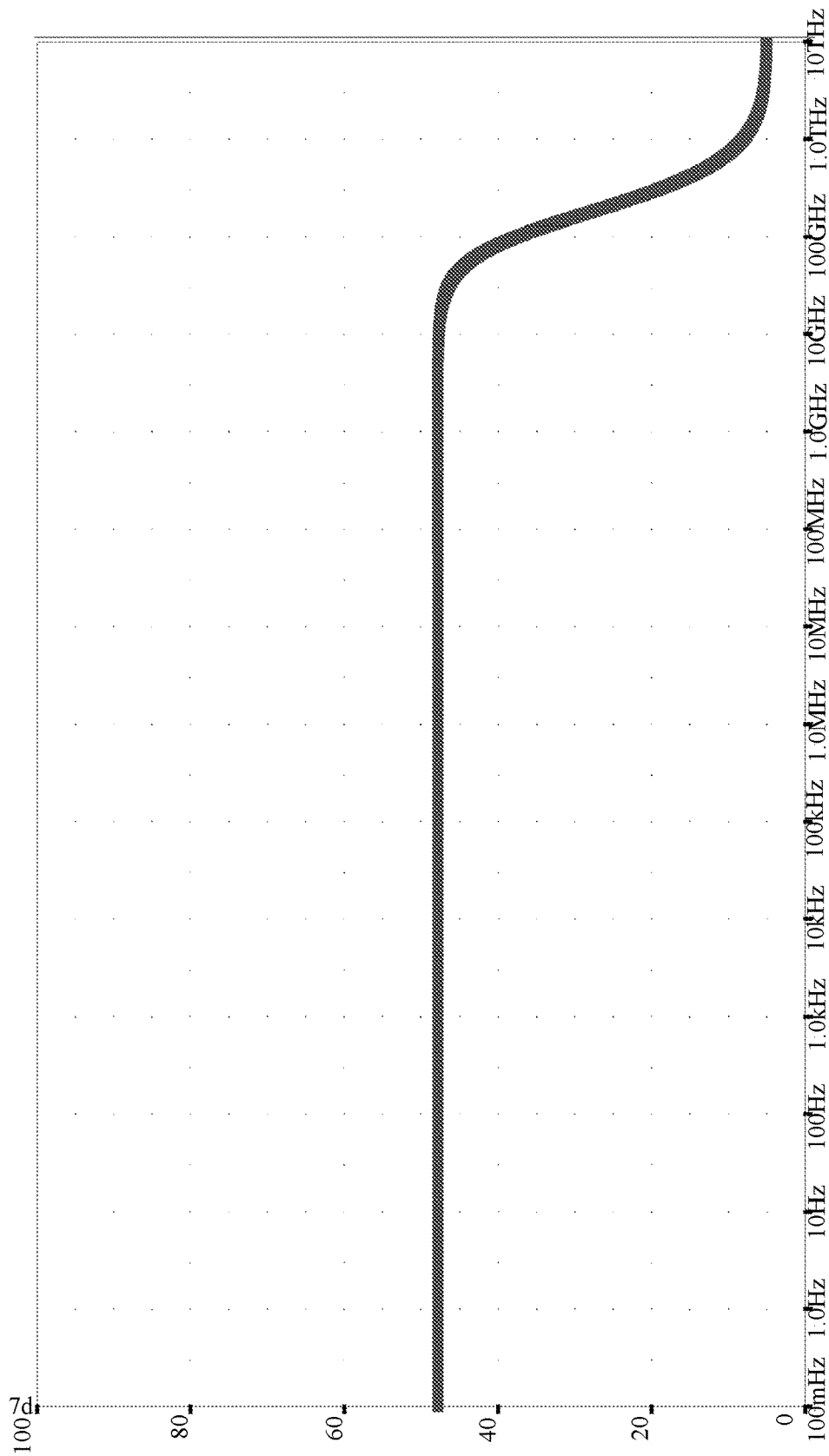
Figure 4r

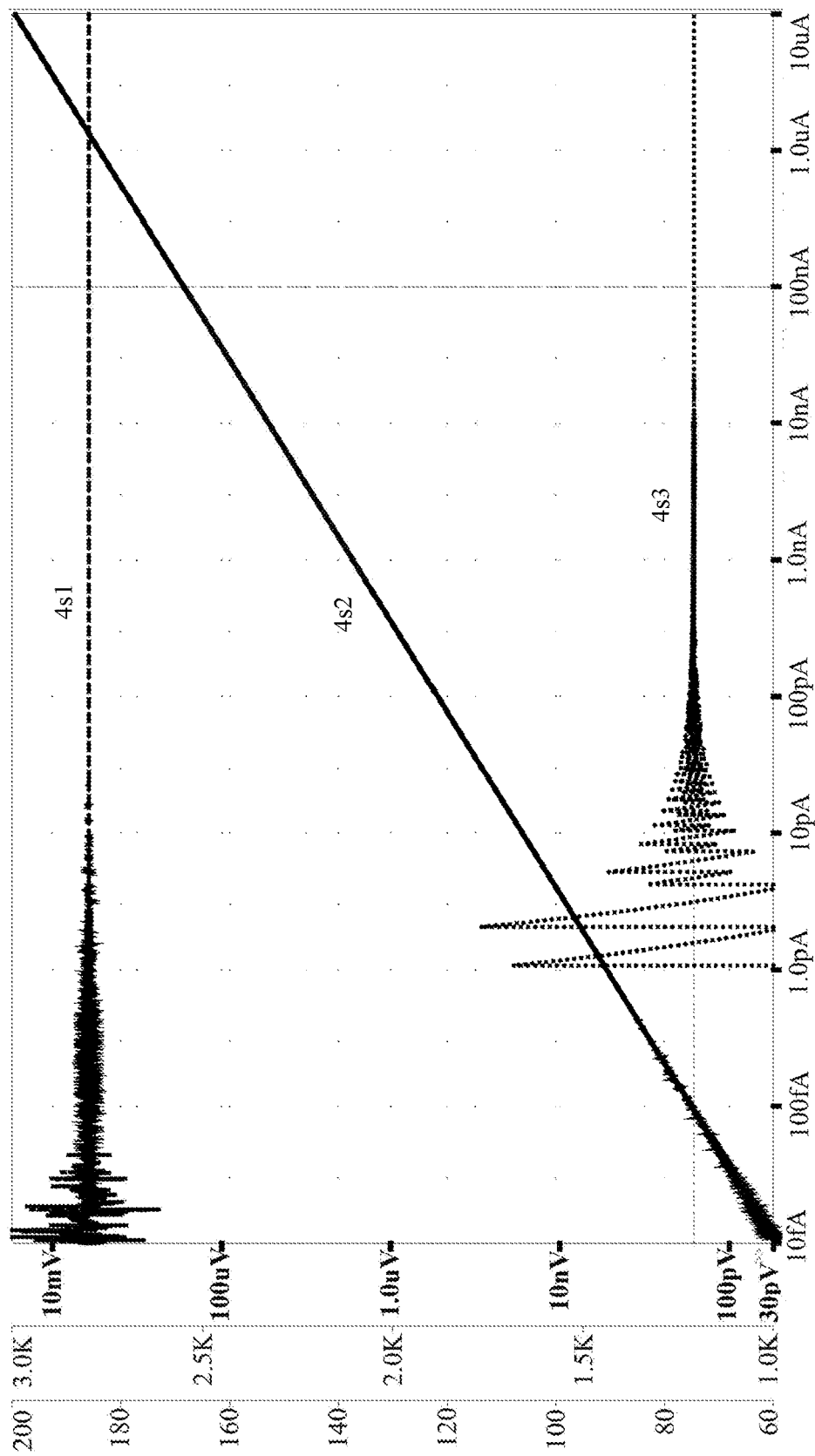
Figure 4s

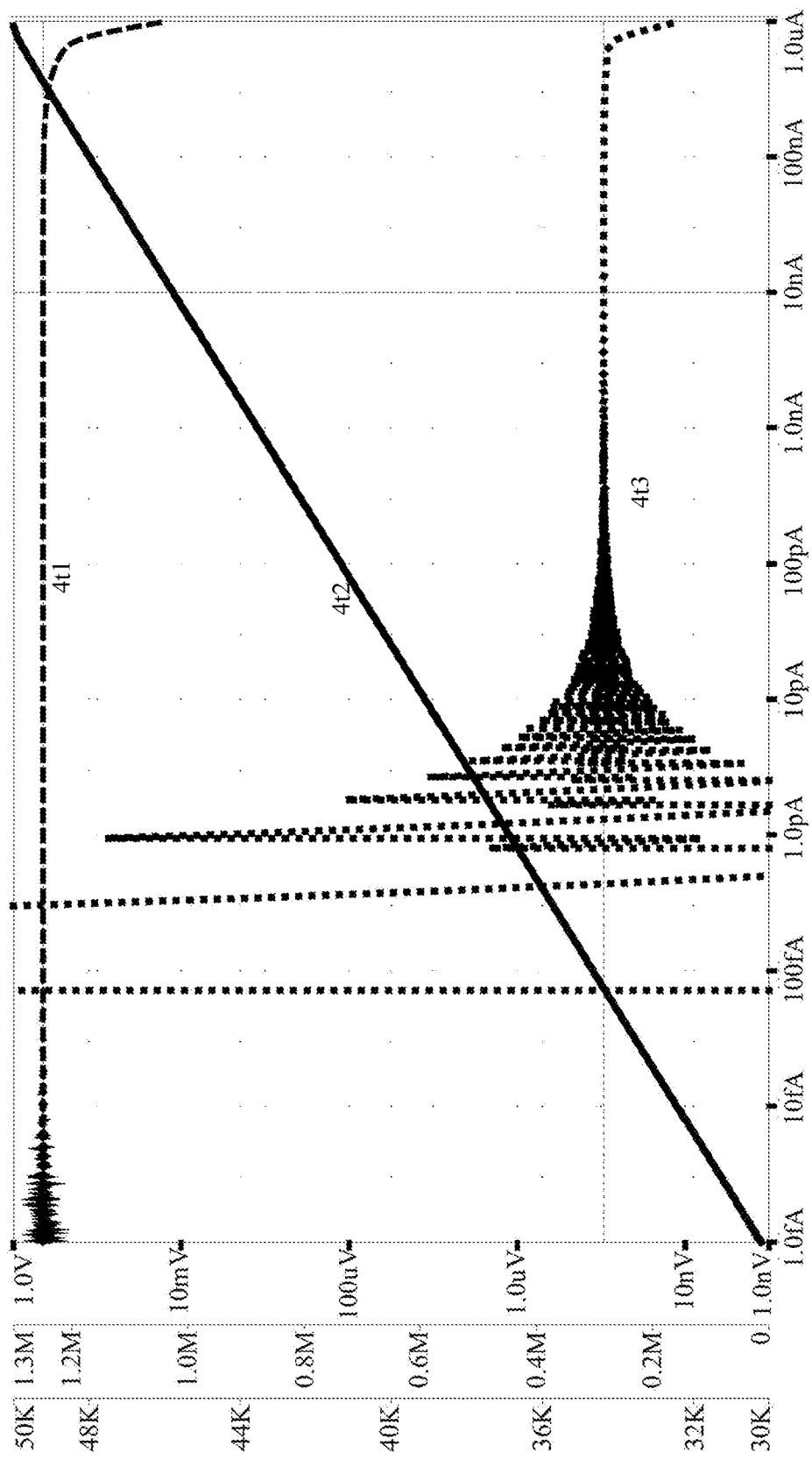
Figure 4t

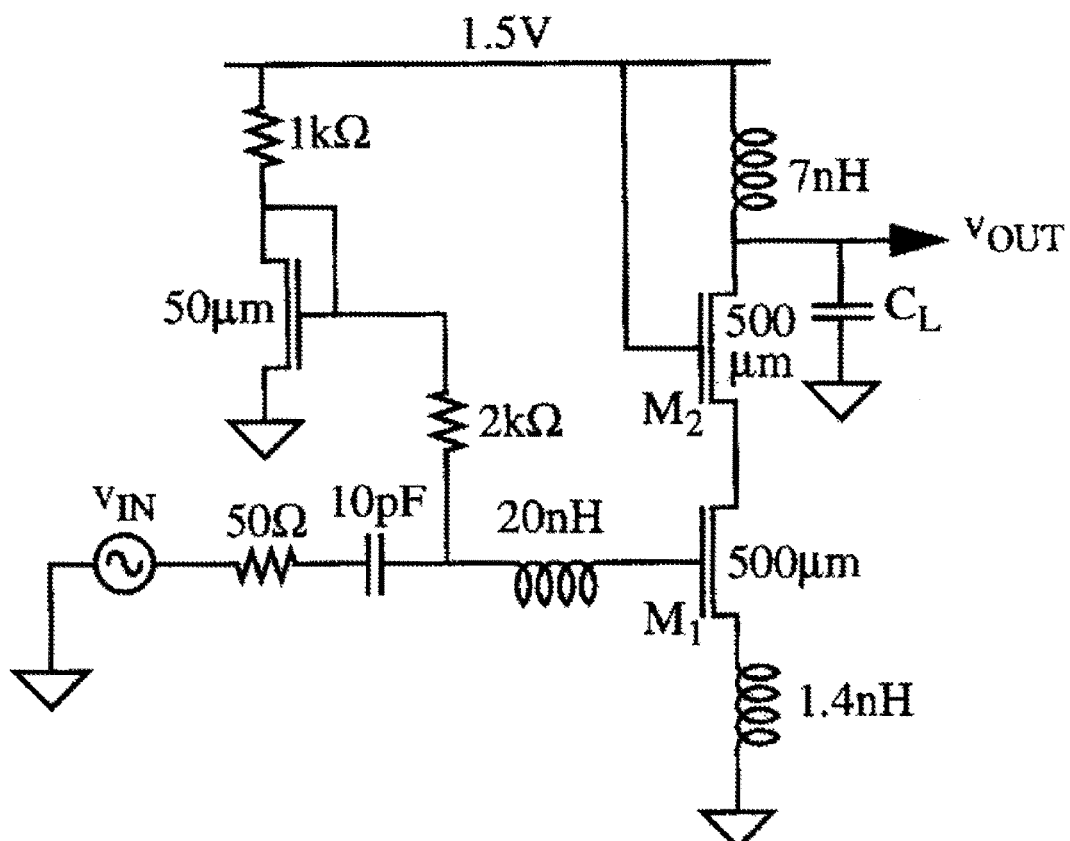
PRIOR ART
Figure 5a

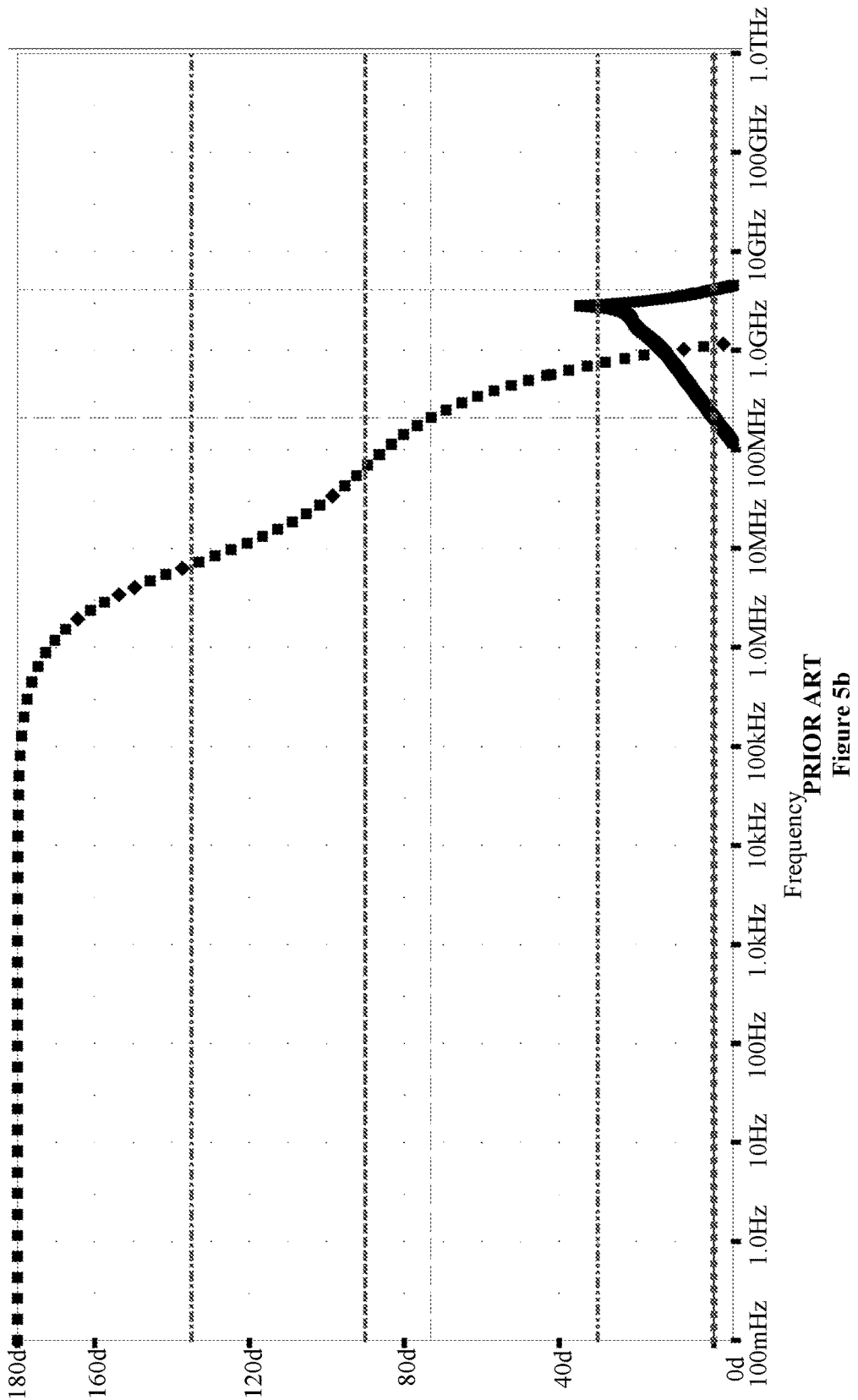
PRIOR ART
Figure 5b

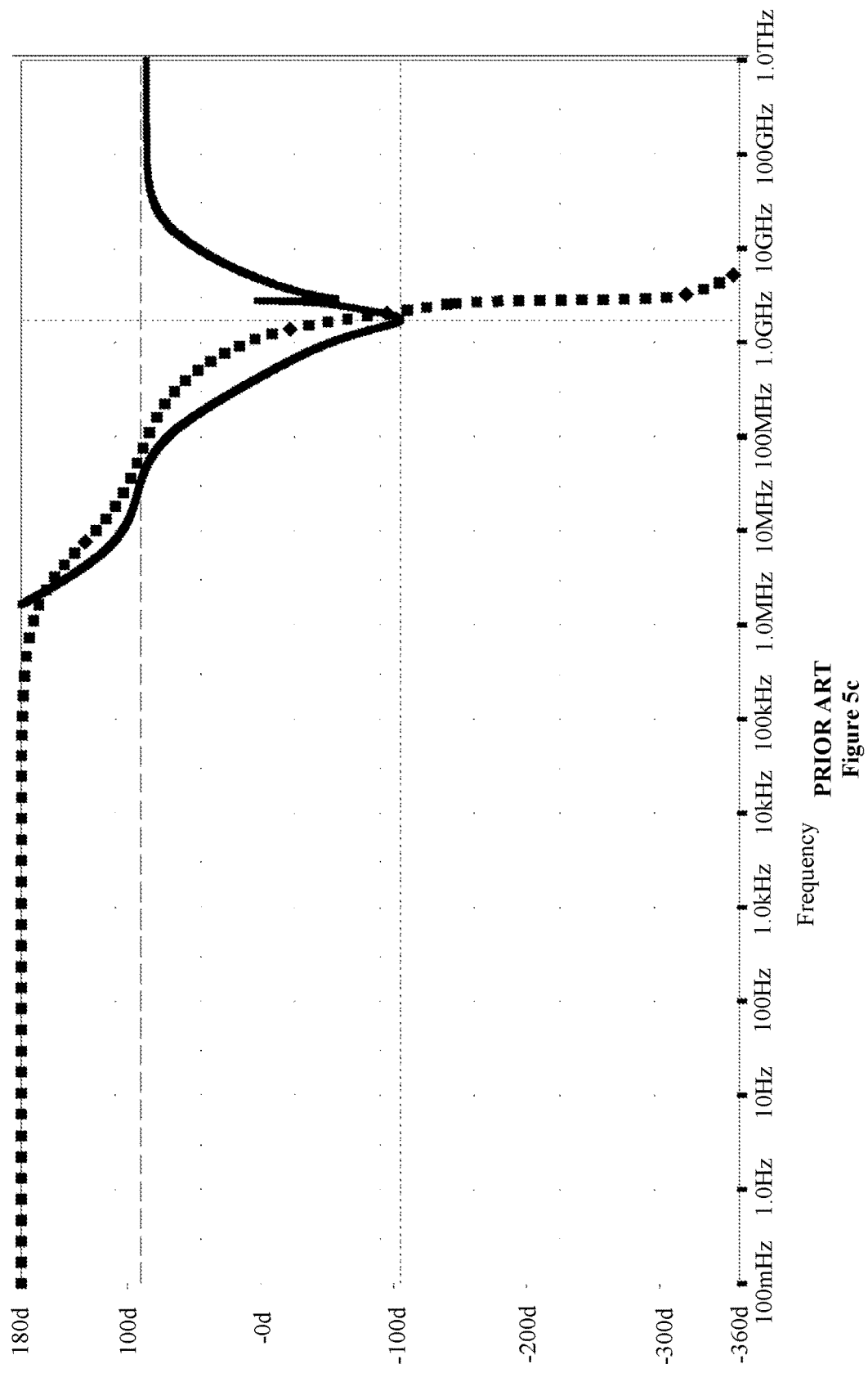
PRIOR ART
Figure 5c

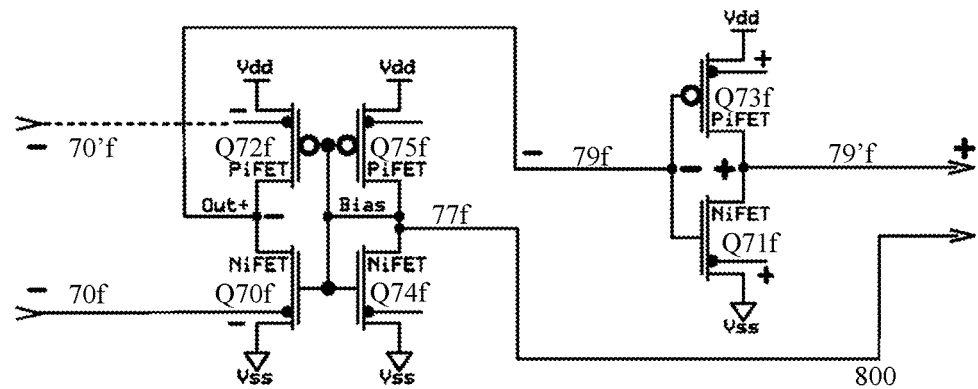
Figure 6a
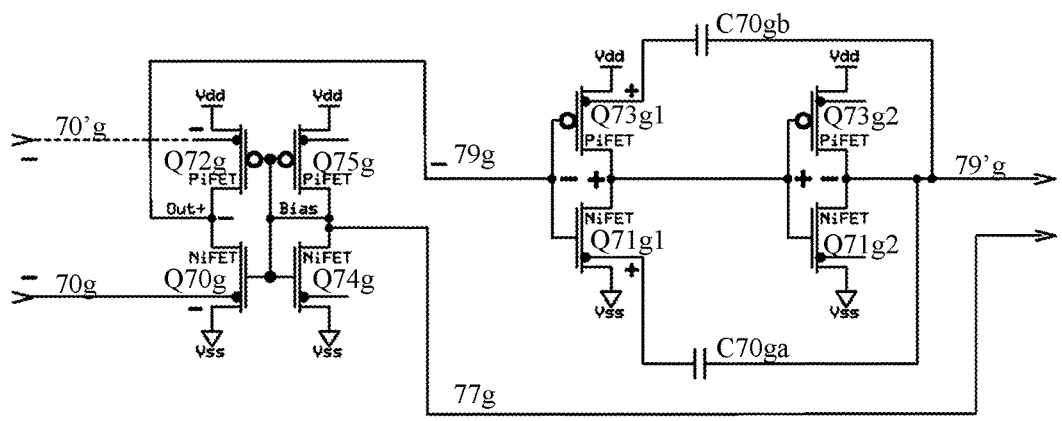
Figure 6b
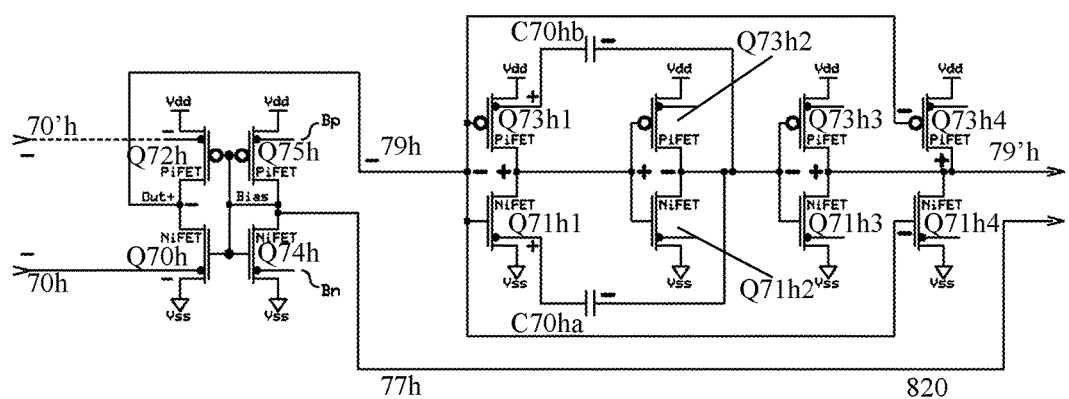
Figure 6c

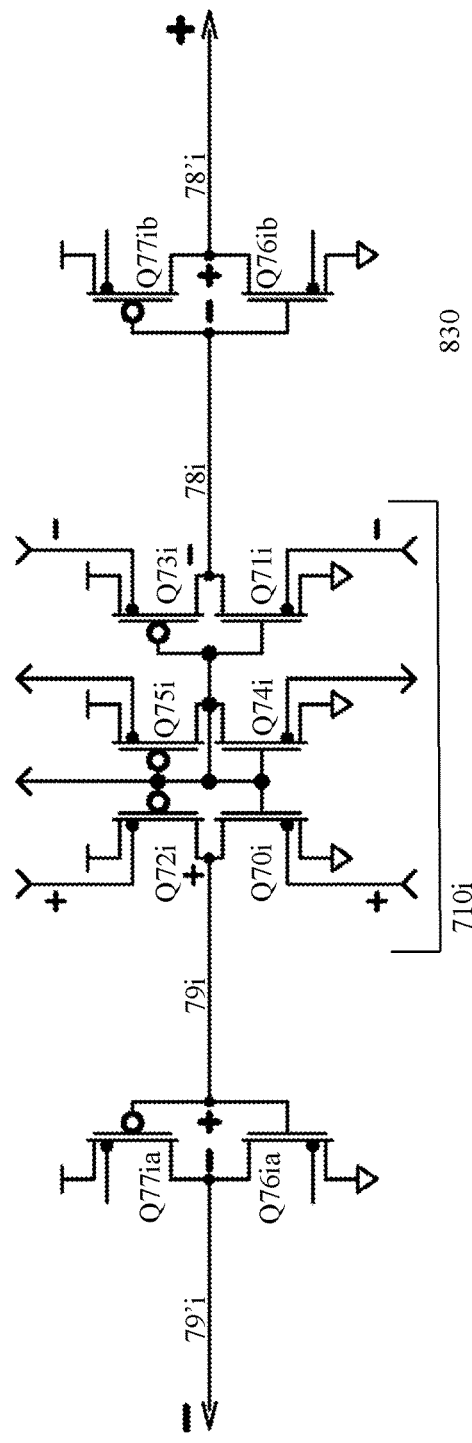
Figure 6d
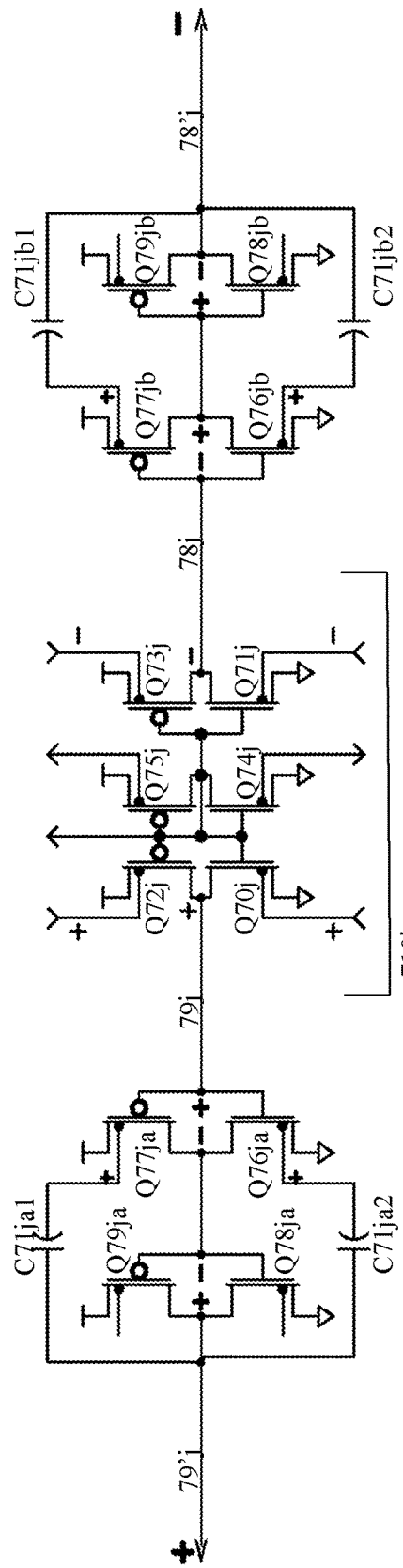
Figure 6e

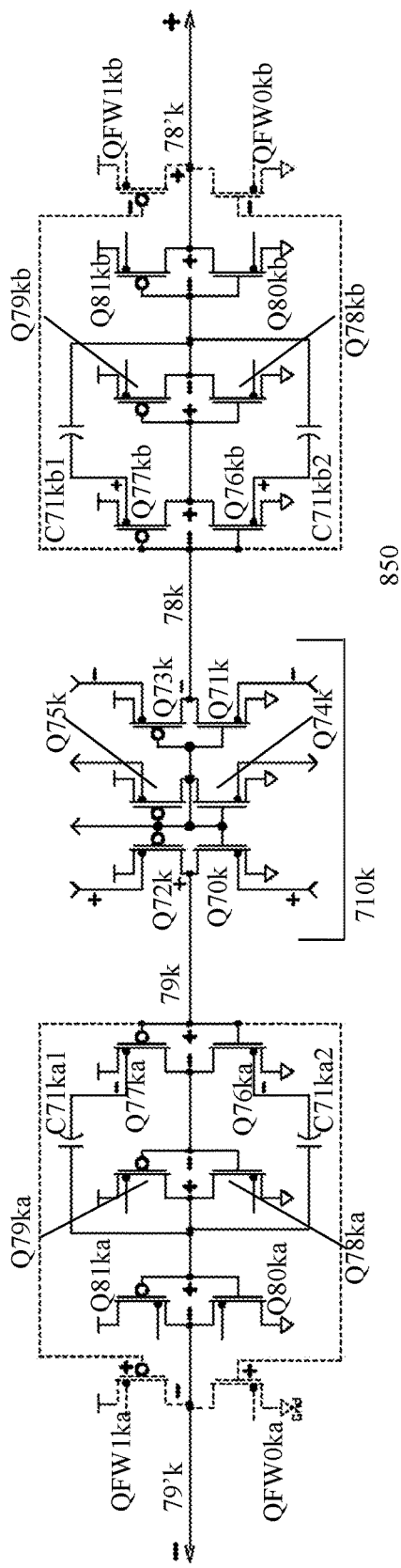
Figure 6f

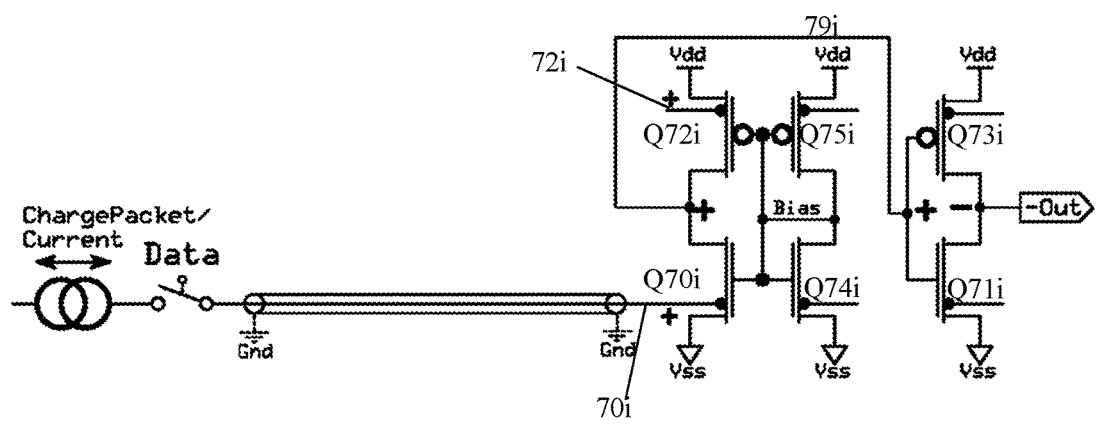
Figure 7a

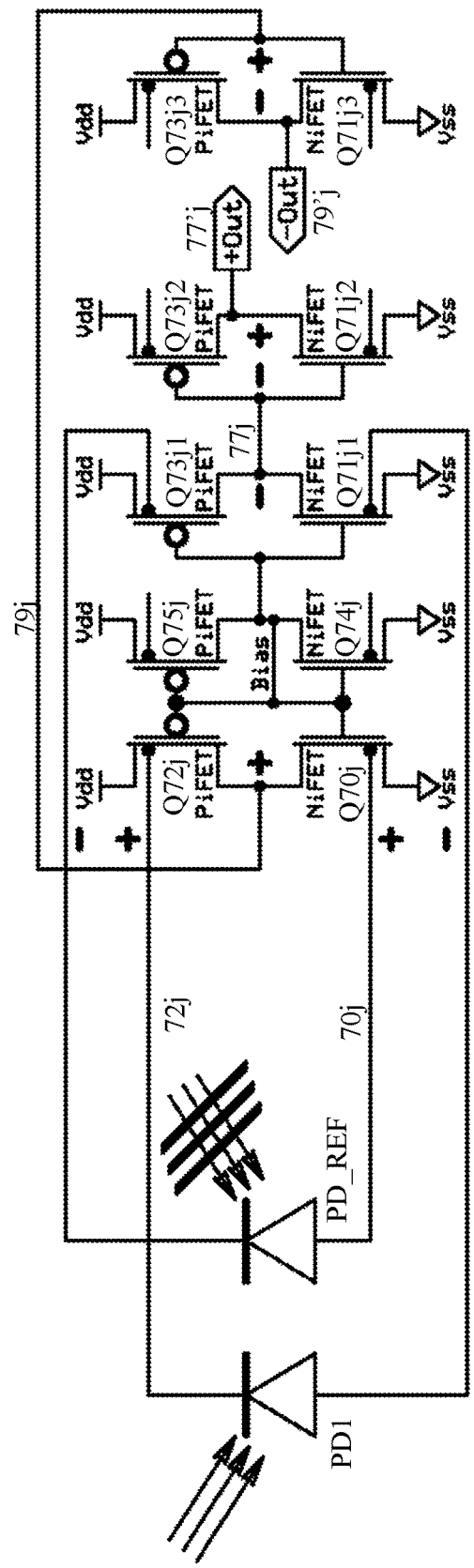
Figure 7b

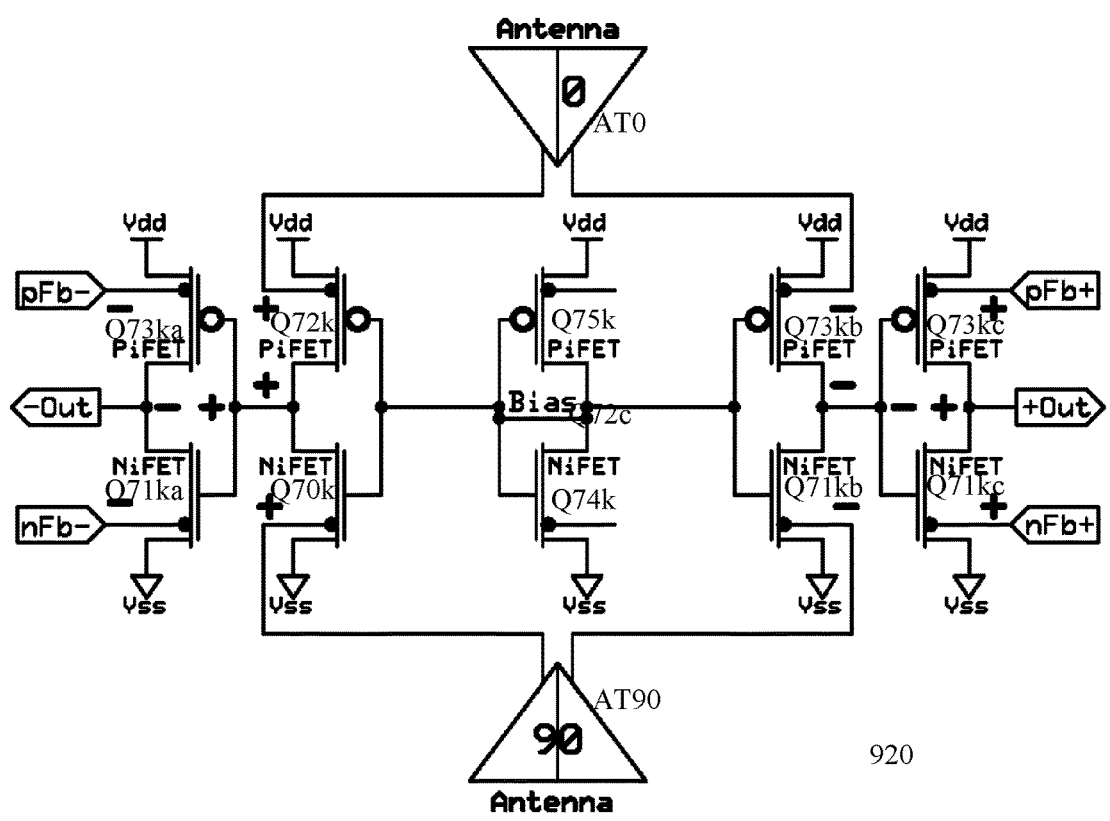
Figure 7c

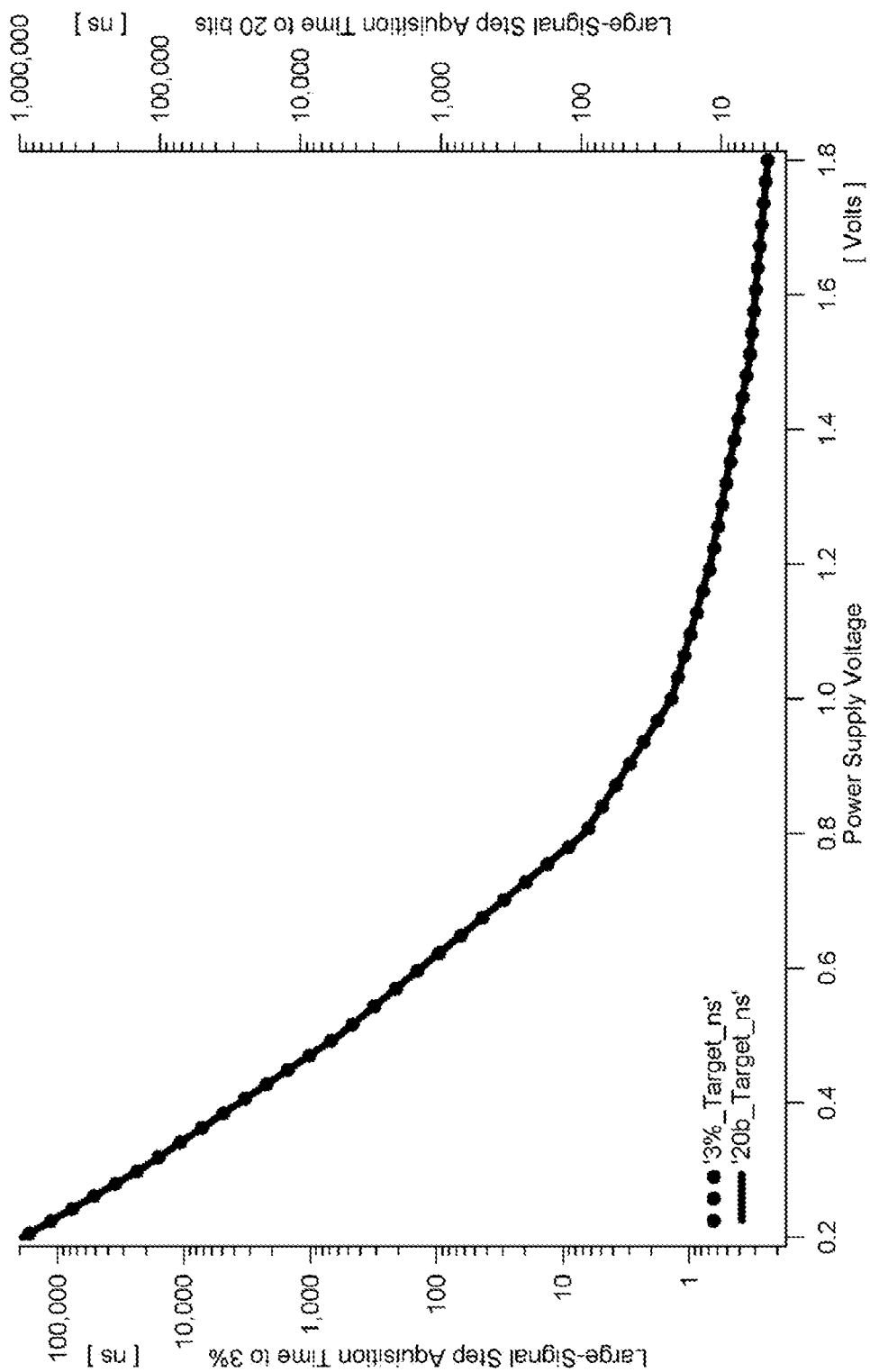
Figure 7d

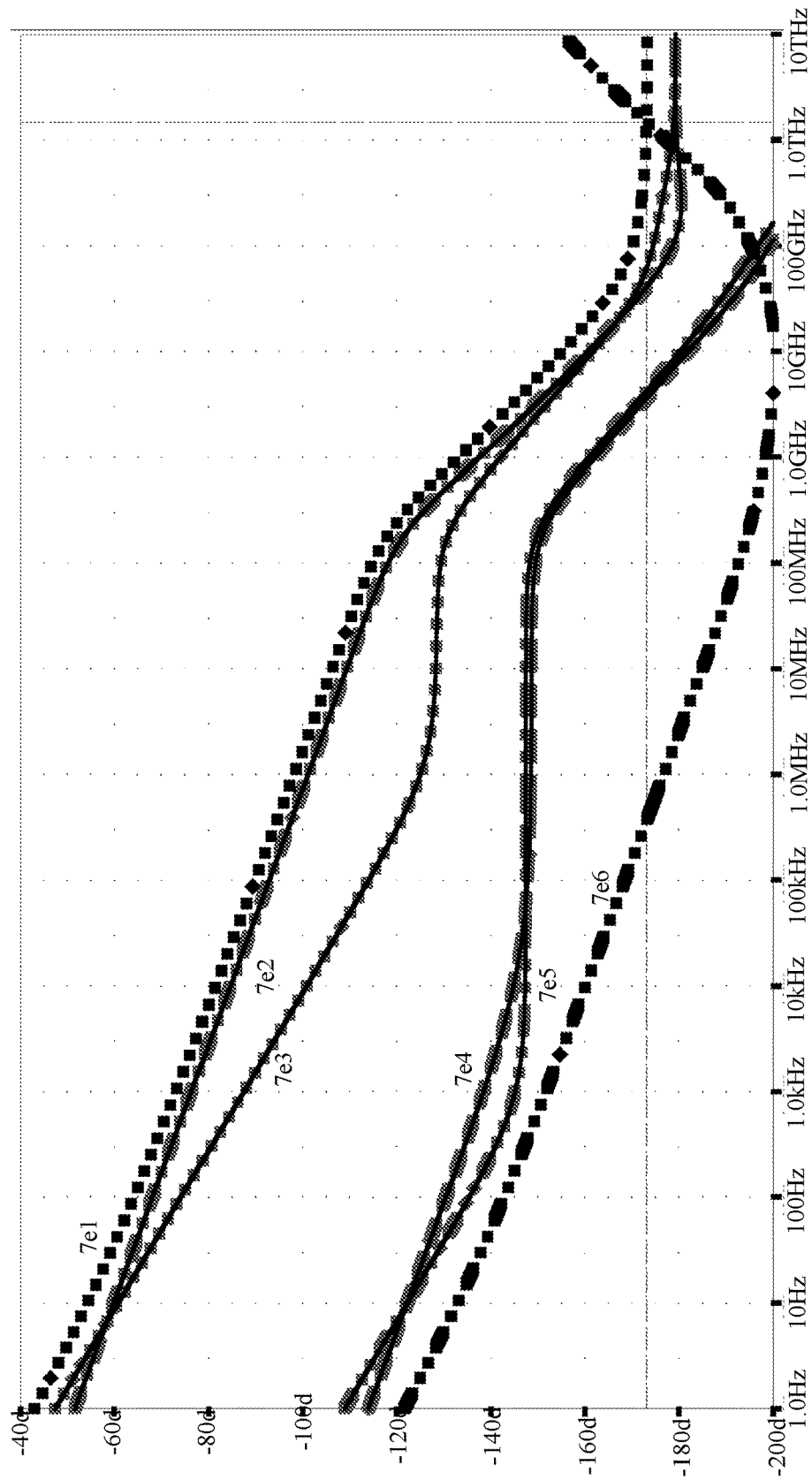
Figure 7e

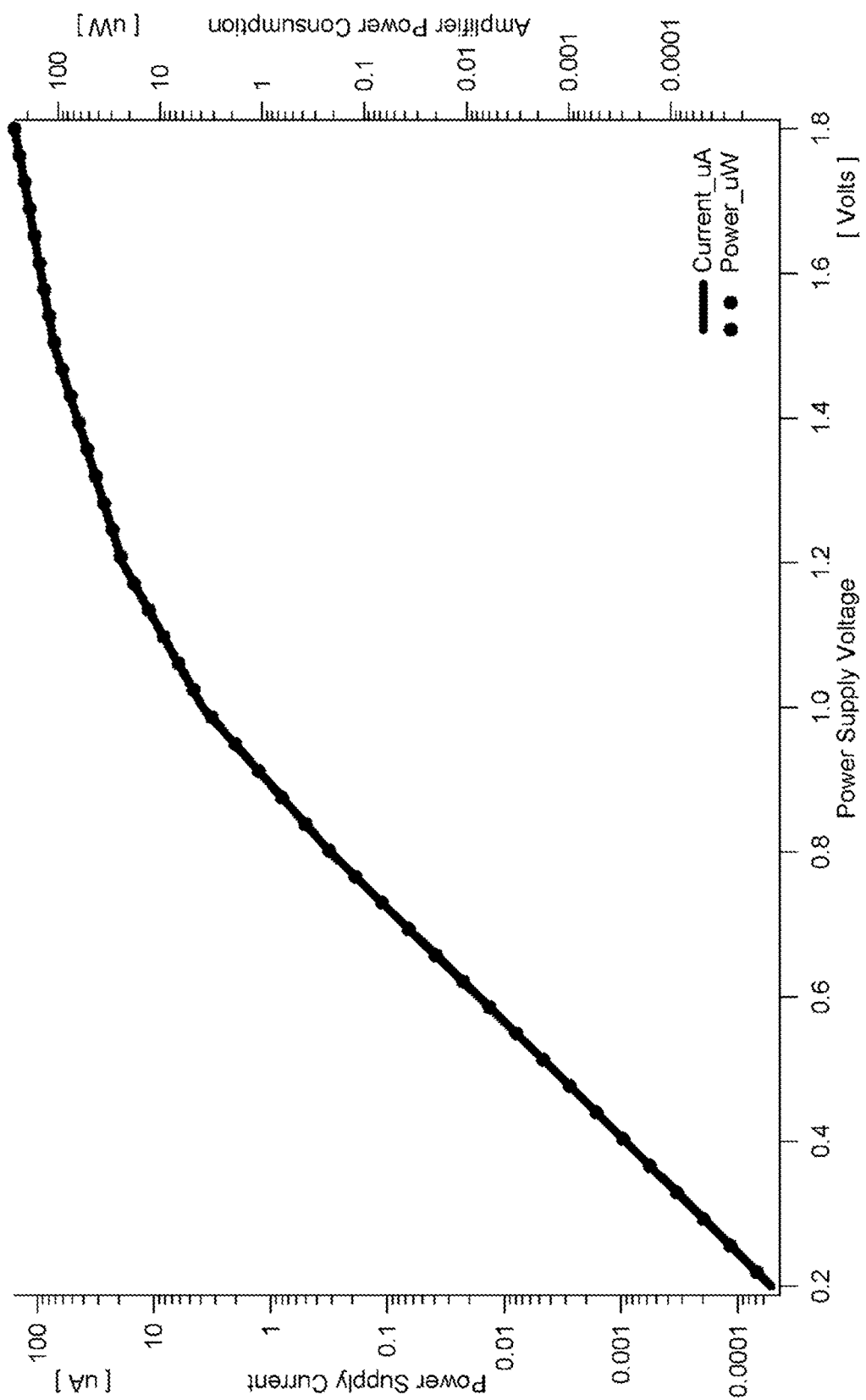
Figure 7f

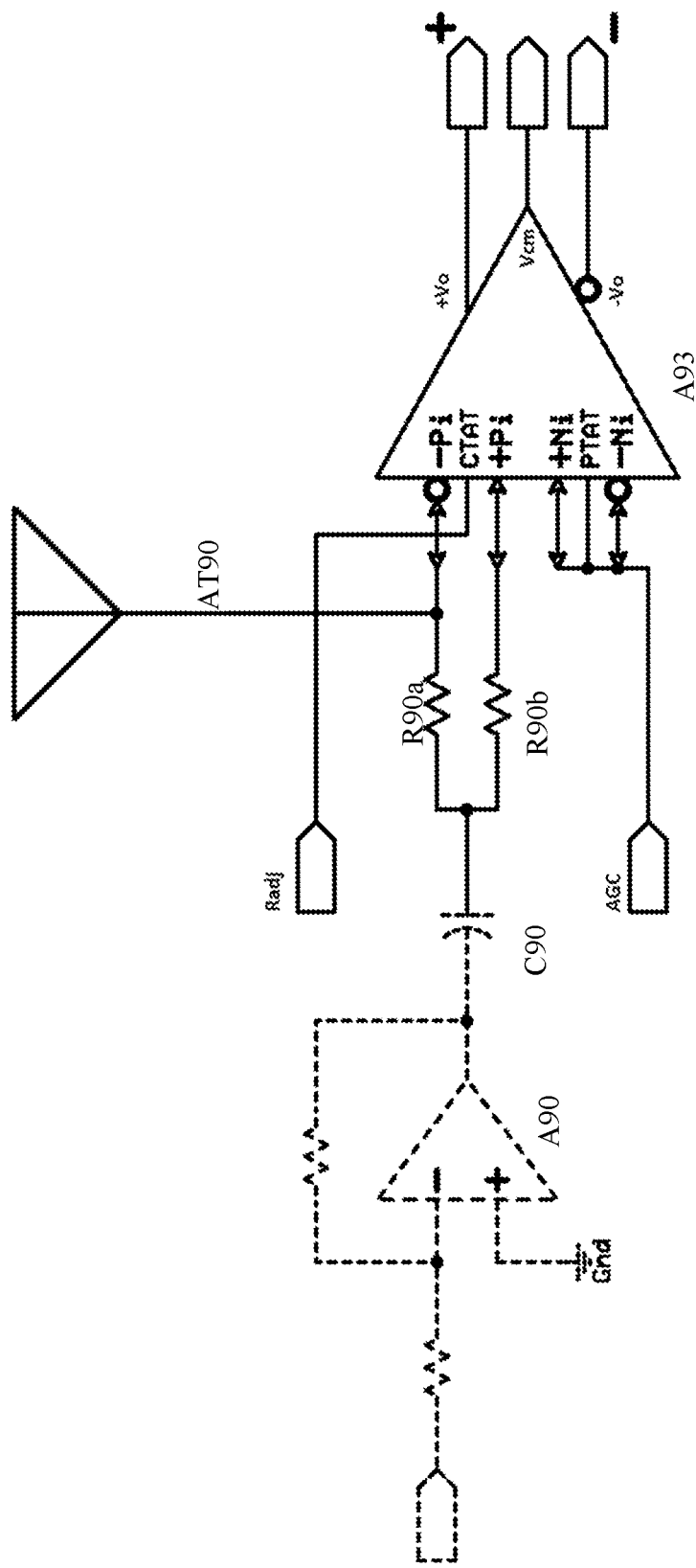
Figure 7g

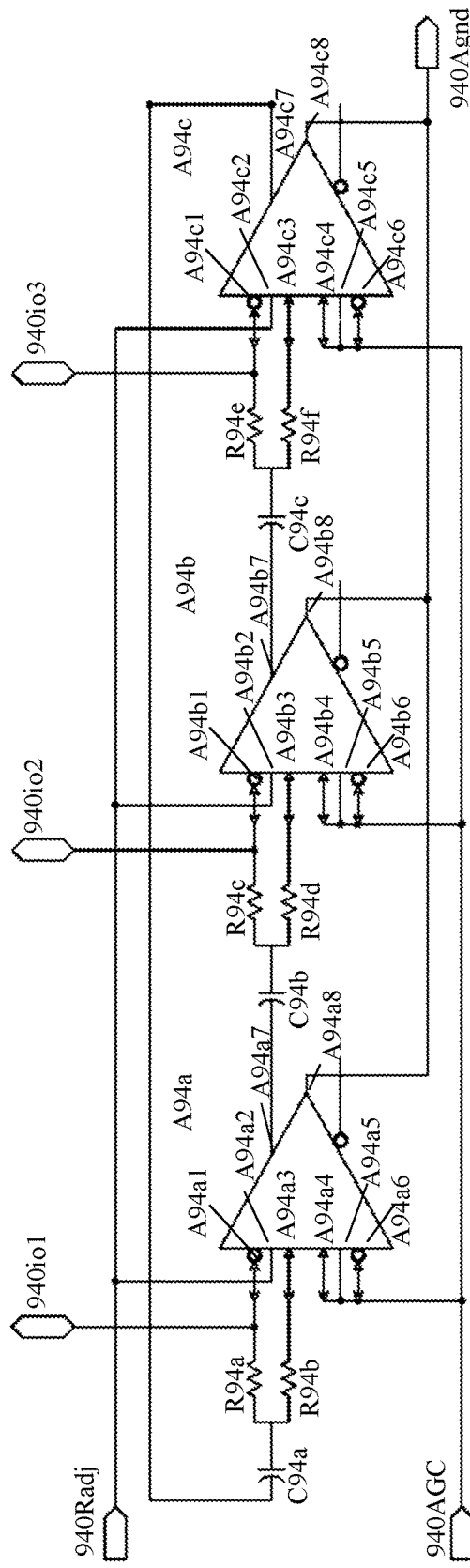
Figure 7h

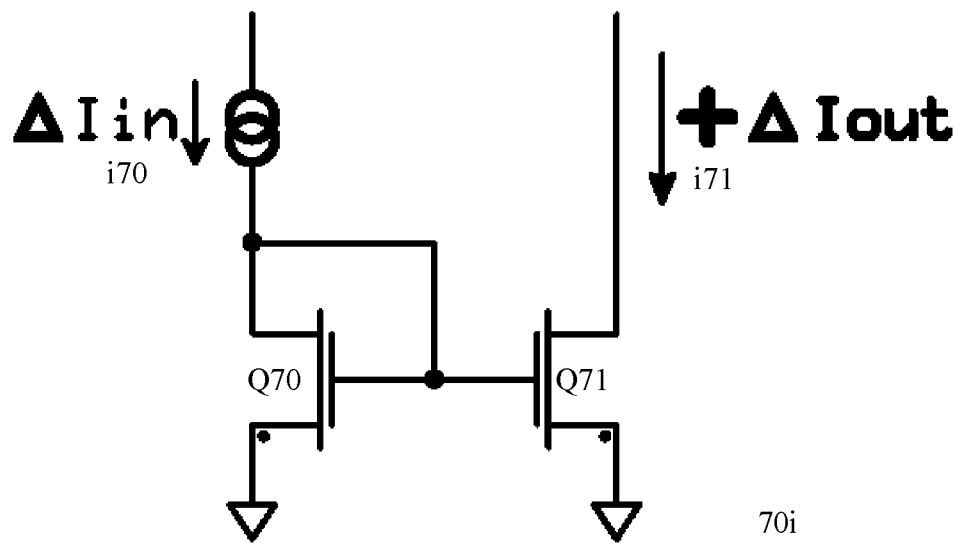
PRIOR ART
Figure 7i
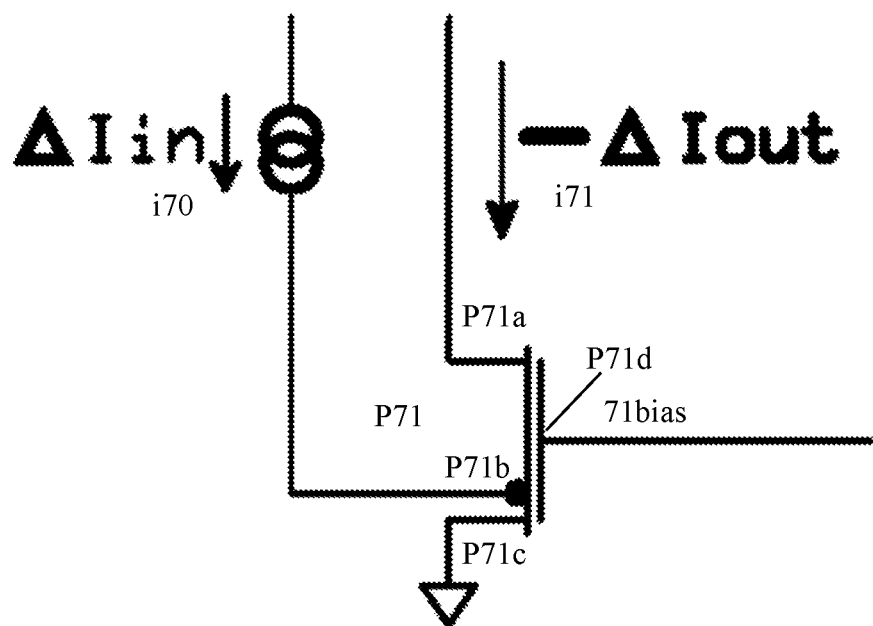
Figure 7j

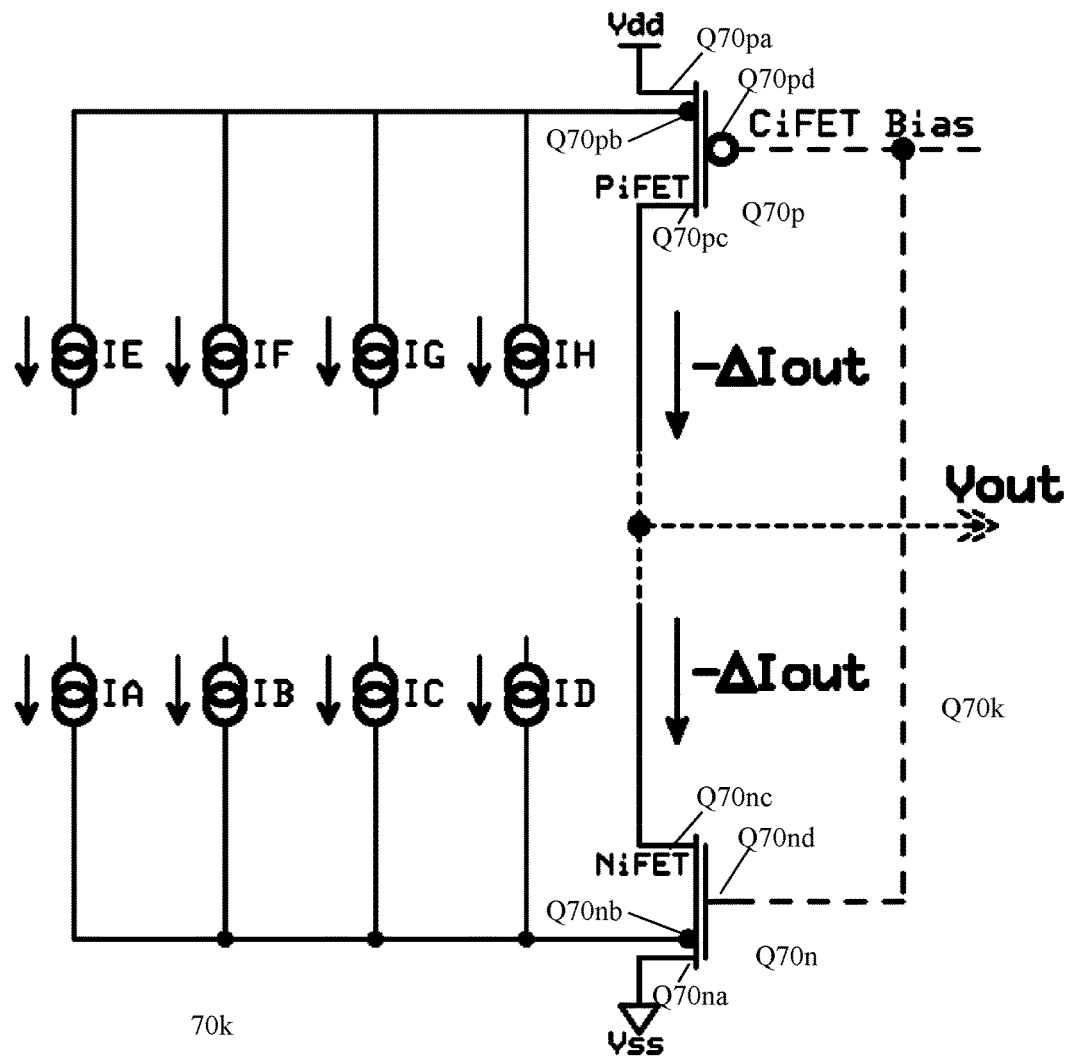
Figure 7k

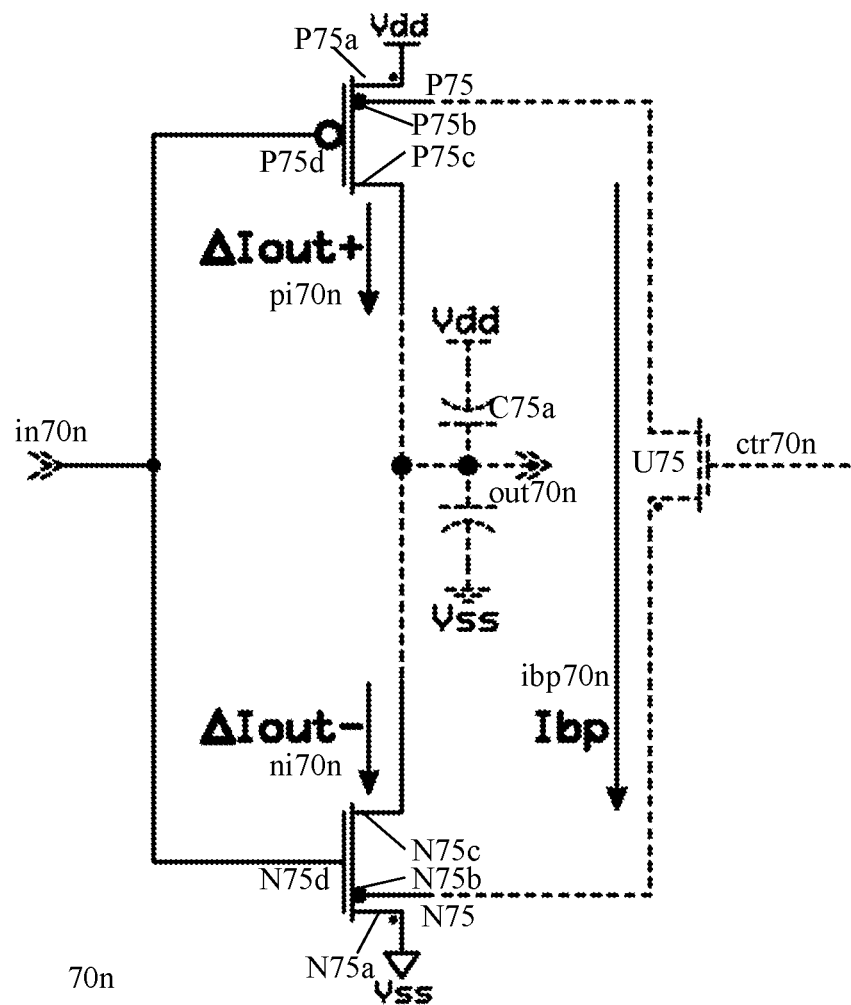
Figure 7m

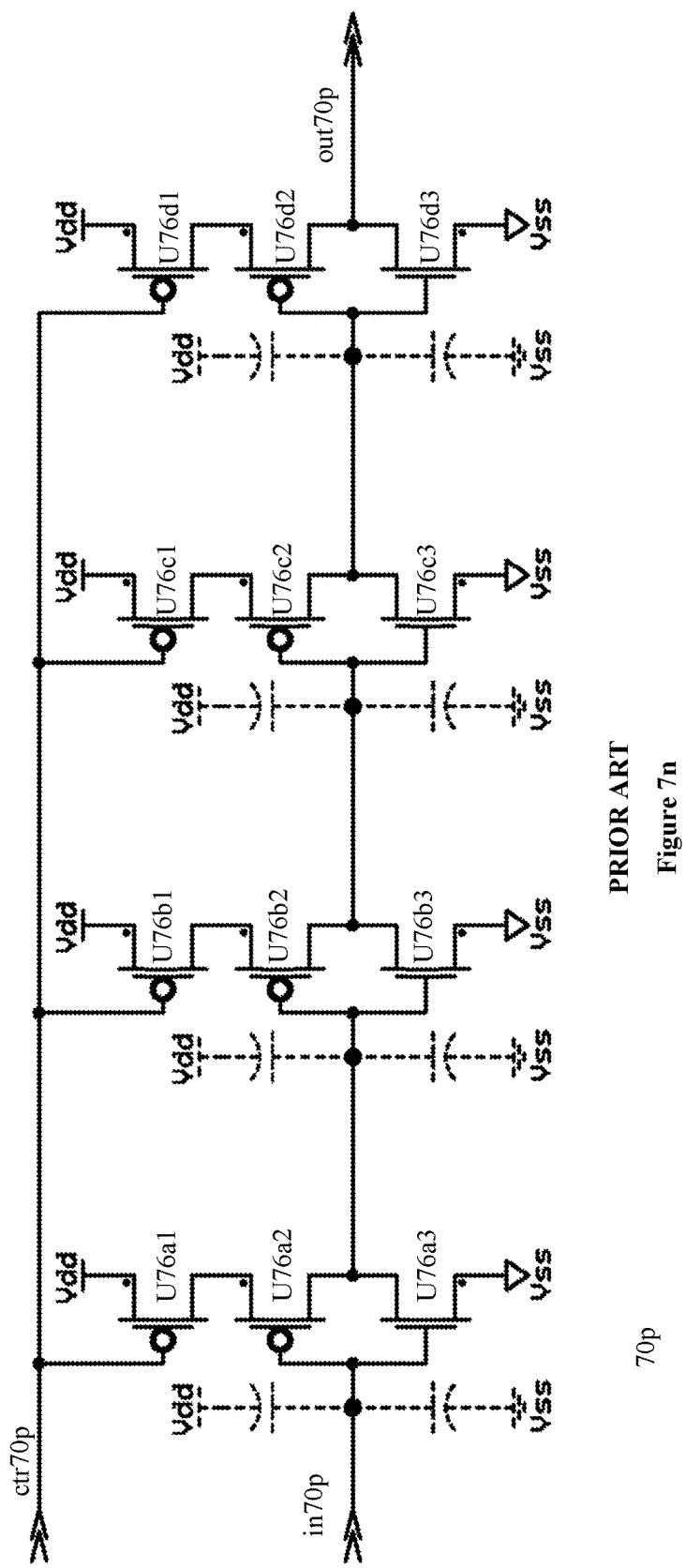
PRIOR ART
Figure 7n

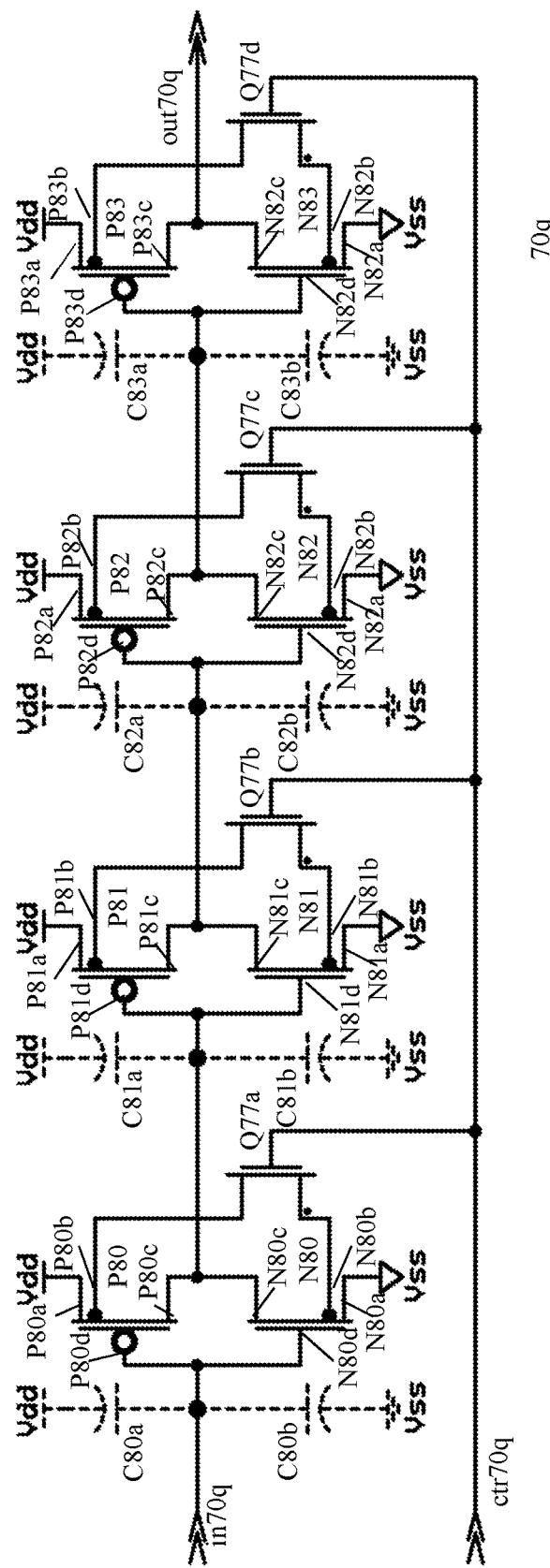
Figure 7p

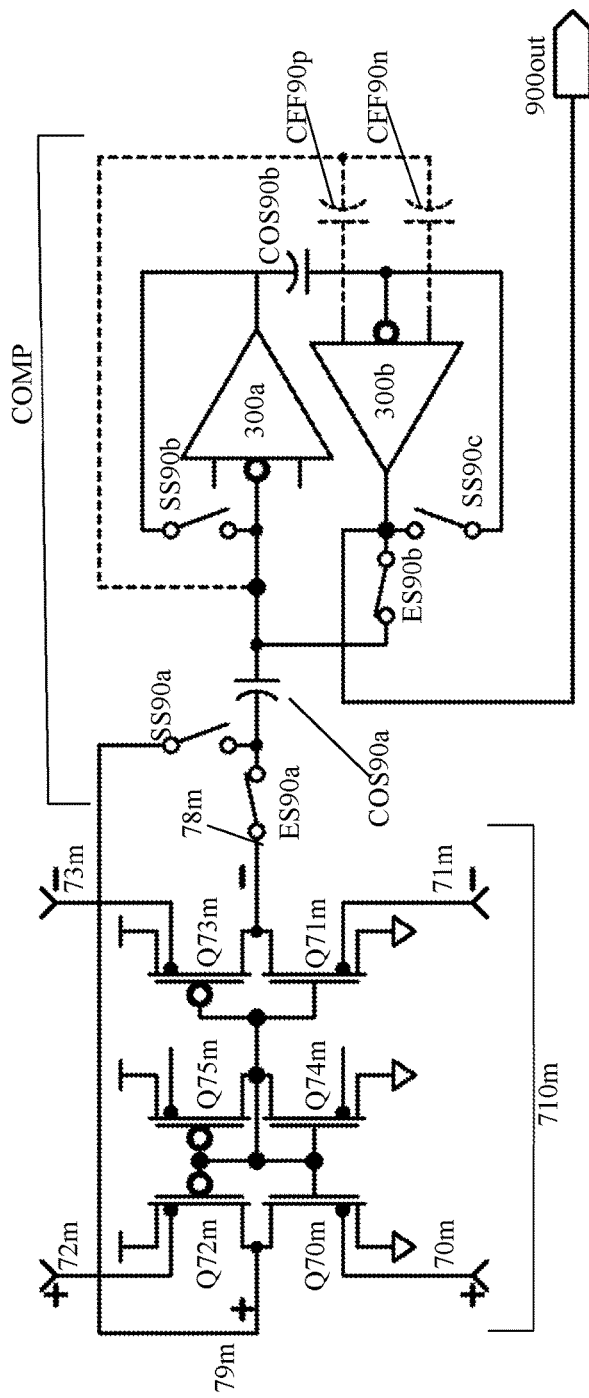
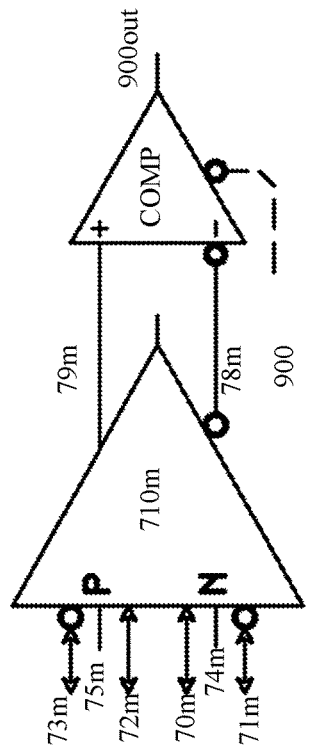
Figure 8a(1)
Figure 8a(2)

LOW NOISE TRANS-IMPEDANCE AMPLIFIERS BASED ON COMPLEMENTARY CURRENT FIELD-EFFECT TRANSISTOR DEVICES

CROSS-REFERENCE TO RELATED APPLICATIONS

The present application is a 35 U.S.C. § 371 National Stage Entry of, and claims priority to, International Application No. PCT/US2016/044787, filed Jul. 29, 2016, which claims priority to U.S. Provisional Application No. 62/198,900, filed on Jul. 30, 2015; U.S. Provisional Application No. 62/268,983, filed on Dec. 17, 2015; and U.S. Provisional Application No. 62/309,903, filed on Mar. 17, 2016, the contents of which are incorporated herein by reference in their entirety.

BACKGROUND OF THE INVENTION

Field of the Invention

The present invention relates to a novel and inventive compound device structure, enabling a charge-based approach that takes advantage of sub-threshold operation, for designing analog CMOS circuits.

Description of Related Art

The new millennium brings with it a demand for connectivity that is expanding at an extremely rapid pace. By the end of year 2015, the number of global network connections will exceed two times the world population and it is estimated that in 2020 more than 30 billion devices will be wirelessly connected to the cloud forming the Internet of Things (or "IoT"). Enabling this new era are the revolutionary developments in mobile computing and wireless communication that have arisen over the last two decades. Following Moore's Law, development of highly-integrated and cost-effective silicon complementary metal oxide semiconductor (CMOS) devices allowed incorporation of digital and analog system elements, such as bulky Analog-to-Digital converters or transceivers, into a more cost effective single chip solution.

In the last few years, however, while digital circuits have largely followed the predicted path and benefited from the scaling of CMOS technology into ultra-deep submicron (sub-μm), analog circuits have not been enabled to follow the same trend, and may never be enabled without a paradigm shift in analog design. Analog and radio frequency (or "RF") designers still struggle to discover how to make high-performance integrated circuits (or "ICs") for ultra-deep sub-μm feature sizes without losing the benefits of shrinking size; including reduced power, compact footprint, and higher operational frequencies. Truly a paradigm shift is needed to break through the established science of analog design to meet the system on chip (SoC) demands of the new millennium.

PRIOR ART

The core building block of analog circuits is the amplifier. Discrete component amplifiers are free to use resistors, capacitors, inductors, transformers, and non-linear elements as well as various types of transistors. Unwanted parasitics between various components are normally negligible. However, in order to build amplifiers within an integrated circuit, the normal analog circuit components are not readily available, and often take special IC process extensions to obtain these circuit elements if at all. The parasitics on integrated circuit amplifiers are severe due to their close proximity and being coupled together through the silicon wafer they are integrated into. Moore's law IC process advancements are focused on digital, microprocessor, and memory process development. It takes a generation (~18 months) or two to extend the IC process to incorporate analog components, thus analog functionality is generally not included on the latest process single chip systems. These "mixed-mode" IC processes are less available, vender dependent, and more expensive as well as being highly subject to parametric variation. It takes substantial engineering to include sparse analog functionality on any IC which becomes specific to its IC vender and process node. Because analog circuitry is carefully and specifically designed or arranged for each process node, such analog circuitry is highly non-portable. Reprobating this limitation, analog circuit design engineers are becoming scarce and are slowly retiring without adequate replacements.

Operational Amplifiers (or OpAmps) are the fundamental IC analog gain block necessary to process analog information. OpAmps make use of a very highly matched pair of transistors to form a differential pair of transistors at the voltage inputs. Matching is a parameter that is readily available on an integrated circuit, but to approach the required level of matching, many considerations are used: like centroid layout, multiple large devices, well isolation, and physical layout techniques among many other considerations. Large area matched sets of transistors are also used for current mirrors and load devices. OpAmps require current sources for biasing. OpAmps further require resistor and capacitor (or RC) compensation poles to prevent oscillation. Resistors are essential for the "R" and the value of the RC time constant is relatively precise. Too big value for a resistor would make the amplifier too slow and too small results in oscillation. Constant "bias" currents add to the power consumed. In general, these bias currents want to be larger than the peak currents required during full signal operation.

As IC processes are shrunk, the threshold voltages remain somewhat constant. This is because the metal-oxide-semiconductor (or MOS) threshold cutoff curve does not substantially change with shrinking of the IC processes and the total chip OFF leakage current must be kept small enough to not impact the full-chip power supply leakage. The threshold and saturation voltage tends to take up the entire power supply voltage, not leaving sufficient room for analog voltage swings. To accommodate this lack of signal swing voltage, OpAmps were given multiple sets of current mirrors, further complicating their design, while consuming more power and using additional physical layout area. This patent introduces amplifier designs that operate even better as power supply voltages are shrunk far below 1 volt.

The conventional MOS amplifier gain formation is an input voltage driving a trans-conductance ($g_m$) which converts the input voltage into an output current. This output current then drives an output load which is normally the output of a current source for the purpose of establishing a high load resistance. This high resistance load converts the output current back into an output voltage. The equivalent output load resistance is actually the parallel combination of the load current source transistor and the amplifier output transistors. In order to keep this equivalent load resistance high to provide the required voltage gain, these load transistors must be very long, but to drive enough current these transistors must be very wide also, thus very large transistors are necessary. It also might be noted that the load resistance the amplifier output drives is additional parallel resistance that reduces the voltage gain. It should also be noted that a load capacitance interacts with the amplifiers output resistance, modifying the AC performance. What is actually needed is exactly the inverse operating principle, which the present invention is about. FIG. 1a is a transistor level schematic diagram of a high-quality MOS IC OpAmp as a baseline reference (from the Wiley textbook: Analysis and Design of Analog Integrated Circuits by Gray and others, 4$^{th}$ edition pg. 482) which is used for comparison in the description of the amplifiers illustrated herein.

The baseline comparisons are (all made in an 180 nm IC process) in the form of performance plots as in: a Bode Gain-Phase plot over frequency FIG. 1b, when $V_{dd}$=1.8 Volts and $R_{cmp}$=700 ohms. Wherever possible all the axis scales for each of these three comparison plots are kept the same. A readily available 180 nm process was selected for comparison of all the comparative examples in this document because the conventional prior art amplifiers work best and have had the most usage and have mature mixed-mode IC process extensions offered which are required for conventional analog. Also as the IC process is shrunk and the power supply voltage is decreased, this is where the implementations of the present invention become highly beneficial.

Normally MOS amplifiers operate within a square-law relationship due to the strong inversion MOS transistor square-law characteristics; these are not very well defined or predictably stable to the degree that analog circuits need. Exponential-law operation, like bipolar transistors operation is higher gain, stable, and well defined. At very weak operating conditions, MOS transistors convert to exponential operation, but they are too slow to be of very much use. Furthermore, the "moderate-inversion" transition between these two operating mode provide non-linearities that lower the quality of analog MOS circuits. At the threshold voltage, where MOS transistors operate around, is where 50% of the current is square-law and the other 50% is exponential. This is the definition of threshold voltage in the latest MOS simulation equations. Full exponential MOS operation at high speed would provide higher gain that is predictable, stable, and well defined. This patent is about amplifiers that operate in the exponential mode.

To understand the prior art, let's begin with a discussion of Weak vs. Strong inversion. Referring to FIGS. 1e and 1f, weak inversion is the range where most designers would consider the transistor to be OFF:

Drain to Source voltage is small (on the order of 100 mV);
The gate G (or 17s) is at a similar small potential (typically less than 300 mV);
This creates a surface conduction layer, of uniform depth from source S to drain D;
The conductivity of this surface layer is exponential with respect to the Gate G voltage;
This allows operation over many decades (about 6) of dynamic range;
The channel appears as a moderate value resistor (100$^+$ s of K-Ohms); and
The uniform depth conduction channel promotes an exponentially higher gain but with a speed penalty (due to low charge density in the conduction channel).

Strong inversion (referring to FIGS. 1g & 1h) is characterized by a graduated conduction channel, deeper near the Source and shallow near at the Drain:

Drain to Source voltage is larger than the Gate to Source voltage Vg of FIG. 1g and threshold $V_{threshold}$ in FIG. 1h (typically in excess of 400 mV);
The Gate 17u is operated above its threshold voltage $V_{threshold}$;
This creates a conduction channel that is deeper at the Source and tapers to near pinch-off at the Drain 12u;
The resulting conduction layer behaves with a Square-law response to the gate voltage at the Gate 17u;
Dynamic range is limited to about 3 decades as compared to weak inversion;
The channel 12g appears as an adjustable current source (high value resistor); and
The wedge shape of the conduction channel 12g provides higher speed than weak inversion because of higher charge density in the conduction channel.

Now, referring back to FIG. 1e, which shows the channel 12e development under weak inversion conditions. The conduction channel 12e has a relatively even distribution of carriers over its entire length and width. Note that the conduction depth 10s of the entire channel is the same as the pinch-off area 12u on the right side of FIG. 1g. This thin conduction layer contributes a significant amount of noise because the channel current travels along the surface where charge carrier defect traps are concentrated. The Gate 17s to channel voltage $V_g$ in FIG. 1e has a strong (exponential) effect on the density of carriers in this conduction layer.

FIG. 1g shows the channel 12u development under Strong inversion conditions. The higher potential difference between Source and Drain over the gate 17u causes "channel length modulation" (the flat part of the channel 12u), resulting in pinch-off near the drain diffusion where the channel reaches a thin layer near 12u. The pinch-off region 12u (where the carriers are forced to the top of the channel) imparts significant noise by means of surface defect carrier traps. The higher the drain voltage $V_d$, the longer the pinch-off region and thus the higher the contributed noise, thus it is desired to keep this voltage low for low noise contribution to the channel current. Other effects such as velocity saturation and hot electron jumping over into the gate oxide are noted around this thin saturated pinch-off region, thus it would be highly desirable to minimize this region by lower voltage and semiconductor doping profiles.

FIG. 1h shows a characteristic plot which approaches a "constant current" relationship between drain current $I_d$ and drain voltage $V_{ds}$ with a fixed Gate voltage $V_g$ on the gate G. It is to be noted that the drain voltage $V_{ds}$ spans a large range of nearly the power supply voltage $V_{dd}$, while maintaining the same current as opposed to the limited drain voltage range of FIG. 1f.

FIG. 1i to 1k illustrate a prior art MOS structure, commonly known as a CMOS inverter, that turns out to actually combine both modes of operation. A pair of MOSFETs with opposite conductivities, PFET and NFET, are complementary connected with each other. For example, the input 10i, 10j, 10k is connected to both the gate control terminal of PFET and the gate control terminal of NFET, the source of PFET is connected to power supply (+), while the source terminal of NFET is connected to power supply (−); and the drain of PFET and the drain of NFET connected together for $V_{out}$ 19i.

FIG. 1j shows the structure related to a physical layout abstraction shown in FIG. 1k, which is 2× strength CMOS or two-finger inverter of prior art. As stated above, gate terminals of PFET and NFET are connected together to receive $V_{input}$ 10j and 10k and the drain terminals of PFET and NFET are connected together for producing $V_{output}$ 19j and 19k. The layout shown in FIG. 1k structurally corresponds to that of FIG. 1i. As it can be seen, to minimize various shortcoming from the conventional FET layouts, such as minimizing parasitic output capacitance, the source terminal of PFET, for example, is split into two source terminals S+ and S+, and the drain terminal D+ 12k is displaced therebetween for forming a pair of parallel channels 14k and 16k between S+ and D+ 12k; p-channel region of the gate G covers the parallel channels 14k and 16k. Divided by the well border WB, NFET is also provided with a pair of source terminals, S− and S−, and the drain terminal thereof, D− 11k is displaced therebetween for forming a pair of parallel channels 13k and 15k between S− and D−; n-channel region of the gate G further covers the parallel channels 13k and 15k. Drains 12k and 11k are connected therebetween through metal work 18k and forms $V_{output}$ 19k.

A 3-dimensional prospective view of this MOS transistor structure is shown in FIG. 1m, while cross sectional view at section AA in FIG. 1m is shown in FIG. 1n. This structure is inherent in a 2× or two-finger inverter as shown in FIGS. 1j and 1k. As it can be seen therein at the parallel channels 14k and 16k in PFET and the parallel channels 13k and 15k, all of these channels taper from the drains D+, D− to the sources S+, S−.

Although similar MOS structures appear in prior art, no significant exploitation of many of its unique properties are known or published. In addition, proper biasing remains as a problem(s) for its operation(s). A deeper understanding of the internal mechanisms resulted in discovery of many desirable applications (enabling superior operation at deep-sub-micron scale), including an approach to proper biasing that takes advantage of natural equilibrium. This natural equilibrium is the result of a "Band-Gap" voltage reference mechanism, again functional at deep-sub-micron scale.

Referring to FIGS. 1p and 1q, some references show a MOS field effect transistor device with two identical regions 13p/13q and 15p/15q of like "conductivity type" separated by a diffusion region 11p (designated as Z for Low Impedance in the prior art). Multiple papers by Bedabrata Pain/R Schober, Jet Propulsion Lab and Jacob Baker/Vishal Saxena, Boise State University, including Pain, Bedabrata et al., "A Self-Cascoding CMOS Circuit for Low-Power Applications", Center for Space Microelectronics Technology Jet Propulsion Laboratory, California Institute of Technology, contain such references, but these references do not exploit any opportunities as shown in this document, especially when complementary devices like this are combined into a single composite device as will be explained in this invention. Such configurations have been called self-cascading or split-length devices. The two regions of such a configuration are arranged between source and a drain diffusions and have both a high impedance common gate connection and a low impedance connection to the mid channel regions. This low impedance mid channel control input, when exploited as outlined in this document, enables an entirely new set of analog design methods.

Although a cascade amplifier can be found in prior art, the prior art does not contain a complementary pair of cascade transistors connected as a totem-pole. With this simple compound structure, feedback from the output to the input can be used to self-bias the resulting inverter into its linear mode. As mentioned above, biasing of an amplifier has always been problematic; however, the novel and inventive self-biasing structure of the present invention addresses such an issue. Advantages of the configuration of the present invention (referred to as a complementary iFET or CiFET) are many, including, but not limited to:

Gain of the single stage is maximum when the output is at the midpoint (self-bias point);

The gain of a single CiFET stage is high (approaching 100), therefore, while the final output may swing close to the rails, its input remains near the midpoint. The stage before that, because of the high gain, operates its input and output near the mid-point ("sweet-spot") where the gain is maximized. So too for each of the preceding stages;

Slew rate and symmetry are maximized where the channel current is highest (near the mid-point);

Noise is minimized where the channel current is highest (near the mid-point); and Parasitic effects are negligible where the voltage swing is small.

When the gate input signal moves in one direction, the output moves in the inverse direction. For example; a positive input yields a negative output, not so much because the N-channel device is turned on harder, but rather because the P-channel device is being turned off. Thevenin/Norton analysis shows that the current through the P and N devices must be exactly the same, because there is nowhere else for drain current in one transistor to go except through the drain of the complementary transistor; however, the voltage drop across these devices does not have to be equal, but must sum to the power supply voltage. Due to the super-saturated source channel, these voltages are tied together exponentially. This is even more evident at low power supply voltages where the voltage gain peaks. This means that the gate-to-source voltage is precisely defined by the same and only drain current going through both transistors. Exponentials have the unique physical property like a time constant, or "half-life;" It does not matter where we are at a given point of time, a time constant later we will be a fixed percentage closer to the final value. This is a "minds-eye" illustration of the primary contributor to output movement in response to input change. This same current balance of gate-to-source operating voltages also indicates why the "sweet-spot" in the self-biased amplifier is so repeatable. In effect it is used as a differential pair-like reference point to the amplifier input signal.

It is to be noted that during the transition from vacuum tubes to bipolar transistors the industry underwent a major paradigm shift, learning to think in terms of current rather than voltage. With the advent of FETs & MOSFETs the pendulum swing is back toward thinking in terms of voltage, but much knowledge has been lost or forgotten. Herein is contained the rediscovery of some old ideas as well as some new ones, all applied to the up-coming "current" state of the art. It is believed that the inherent simplicity of the present invention speaks to their applicability and completeness.

A first issue may be that there is always a need for a little analog functionality, yet nearly all analog performance metrics of a MOS transistor are remarkably poor as compared to that of a Bipolar transistor. The industry has made MOS devices serve by employing extensive "work-arounds." Conventional analog design is constrained by one or more of the followings:

Power supply voltages sufficient to bias the stacked thresholds, and transistors large enough to supply the necessary output drive current while still providing the high output impedance required for linearity and gain ($g_m$*$R_L$).

Lack of analog IC process extensions (unavailable at nanometer scale) are required for linear signals, let alone with the enhanced performance demonstrated herein.

Resistors, inductors, and large capacitors are mostly nonexistent for analog designs in newer IC processes.

In contrast, bipolar transistors can be made to have high gain (β), wider bandwidth, wider dynamic range (many decades, from near the rails down to the noise floor), better matching (found in differential pairs), and band-gap references. Junction FETs, which operate with sub-surface channel conduction below the surface defects, have lower noise than bipolar transistors. Likewise the CiFET super-saturated source channel operates primarily below the defects at the channel surface underneath the gate oxide.

MOS designs are poorer in the above areas but have their own extreme advantages, including, but not limited to:
MOS devices are small and relatively simple
highly scalable
high speed
low power
ultra-dense/high functionality systems on a chip, where Bipolar designs cannot go (deep sub-μm scale).

Accordingly, building analog circuits on an IC has always been problematic. Engineering around poorly performing analog components has been the overriding objective for analog IC designers since analog circuits have been integrated. This drove the need for digital signal processing with algorithm development yielding digital magic.

Today the real-world of analog circuit design, signals still need to be converted on both the front and back end of signal processing systems. This need has become a road-block at deep sub-μm scale.

Another problem may be that solid-state amplifiers have been notoriously non-linear since their inception. To make them linear, increased open loop gain (with levels significantly higher than is ultimately needed) is traded for control over actual circuit gain and linearity through the use of a closed loop (feedback). A closed loop amplifier requires negative feedback. Most amplifier stages are inverting, providing the necessary negative feedback. A single stage inverter, with a closed loop, is stable (does not oscillate). Increased loop gain requires stages be added such that there are always an odd number of stages (sign is negative), to provide the necessary negative feedback. While a single stage amplifier is inherently stable, three stages and most definitely five stages are unstable (they always oscillate—because they are ring oscillators).

The problem then is how to properly compensate a multi-stage closed loop amplifier while maintaining a reasonable gain-bandwidth product. This is particularly difficult at deep-sub-micron scale where circuit stages must be simple in their design. The severely limited power supply voltages preclude the use of conventional analog design approaches. Additionally, it is desirable to avoid reliance upon analog extensions but rather to accomplish the necessary analog functions using all digital parts, to improve yields and decrease costs. Using all digital parts allows analog functions at process nodes that do not yet have analog extensions, and may never have them.

There is a long felt need for low-cost/high-performance systems integrated on a single chip for affordable high-volume devices such as the Internet of things, smart-sensors, and other ubiquitous devices.

SUMMARY OF THE INVENTION

The present invention relates to circuits built out of a novel and inventive compound device structure, which enables a charge-based approach that takes advantage of exponential relationships of a super-saturated source channel described in relation to FIGS. 2a, 2b, 2c and 2d below which possesses sub-threshold-like operation when used for analog CMOS circuit designs. The present invention is an evolution of an ordinary CMOS inverter. It provides extremely high precision, speed, linearity, low noise, and a compact physical layout, using an all-digital nanoscale or deep sub-μm IC process. In addition to the expected digital inverter function, five classes of analog circuits are exemplified: a voltage input amplifier, a current input amplifier, a current inverter as opposed to a current mirror, an adjustable delay circuit, and a voltage or current reference source. Take special note that analog functionality is realized, in a digital IC process, using a single optimized digital logic circuit cell.

According to another aspect of the present invention, it takes advantage of the Doping Profile and Ratioing. Not everything in optimizing a circuit has to do with the circuits' electrical configuration. Proper device sizing and especially adjusting the size relationship between complementary transistors provides considerable performance benefits. The iFET, being a compound structure, offers extensive opportunity to establish impedance matching and gain control through proper ratio of the physical device parameters. Other important characteristics, like noise, speed, and power, can be tailored through careful specification of the physical construction and doping of the transistors, rather than relying solely on circuit configuration.

According to yet another aspect of the present invention, it provides certain noise advantages. In the end, it comes down to signal-to-noise ratio. Low power supply voltage requirements in ultra-deep-sub-micron IC processes limit the maximum signal swing to a much smaller number than most analog designers are used to. So with a smaller signal, the low-noise techniques embodied herein must be employed in order to maintain the desired signal to noise ratio.

Additional Advantages may be provided by the present invention. The primary advantage delivered by this technology is the ability to produce analog building blocks constructed entirely from digital parts, without analog extensions. Equally important is the fact that it actually operates at ultra-deep-sub-micron scale, and operates best at reduced power supply voltages below one volt as required for ultra-deep sub-μm IC processes. These three factors contribute to an unprecedented portability of designs across process nodes. Entirely new circuit designs will be realized because of a FET that has more than one control input. The CiFET offers a high-impedance voltage control on the gate while simultaneously offering a low-impedance current control at the iPorts. These two inputs operate independently of each other and their independent response is summed at the output.

According to yet another aspect of the present invention, it provides a complementary iFET compound device, which can be configured as a trans-impedance (TIA) current input to voltage output amplifier or complementary current low noise amplifier (CiLNA). For example, the CiFET compound device, used as a current amplifier, offers an unexpectedly wider dynamic range with great linearity over an extreme frequency range. This CiLNA provides constant gain and input resistance in its wide passband. The CiLNA of the present invention does not suffer from phase shift in the passband. This CiLNA operates with power supplies down to the millivolt level with a reasonable bandwidth. The CiLNA is not dependent on operation above the normal MOS threshold voltages. A skilled reader in the art would appreciate and find it useful in many applications as a gain block that is unencumbered by the surrounding parasitics, due to the fact that CiLNA of the present invention exhibits an incredibly higher signal to noise ratio. Such a performance is seldom seen, even in LNAs.

BRIEF DESCRIPTION OF FIGURES

FIGS. 1b, 1c, and 1d are a baseline set of representative performance plots illustrating frequency domain performance and power supply dependency of the prior art OpAmp of FIG. 1a.

FIGS. 1b to 1d are a baseline set of representative performance plots illustrating frequency domain performance and power supply dependency of the prior art OpAmp of FIG. 1a;

FIGS. 1e and 1g show cross-sectional views of prior art MOSFET channel conduction in weak inversion and in strong inversion, respectively, and FIGS. 1f and 1h show plots bearing exponential relationship between drain current and gate voltage when in weak inversion and quadratic relationship when in strong inversion, respectively;

FIG. 1i shows a transistor schematic of two (2) finger inverters of prior art;

FIGS. 1j and 1k show physical layout abstractions of the two (2) finger inverters of prior art;

FIG. 1m shows a three (3) dimensional perspective view of the two (2) finger inverters of prior art;

FIG. 1n shows cross-sectional view at Section AA shown in FIG. 1m;

FIG. 1p shows a physical layout of a split channel CMOS transistor of prior art;

FIG. 1q shows a 3D perspective view of an analog-sized MOSFET of prior art;

FIG. 1r shows a physical layout plan of an analog-sized array of Fin field effect transistors (FinFET) of prior art;

FIG. 1s shows a zoomed perspective view of inside the circle Z shown in FIG. 1r, showing a perspective view of a FinFET of prior art;

FIG. 1t shows a plot representing intrinsic gain scaling of nMOS transistor of prior art;

FIG. 2a illustrates a three (3) dimensional prospective view of a MOS field-effect transistor (or iFET) with a new mid-channel bi-directional current port (iPort) of the present invention;

FIG. 2b illustrates a cross-sectional view of iFET of the present invention with visualized channel charge distributions;

FIG. 2c shows a graph of drain voltage $V_{ds}$ and drain current Is when there is no iPort injection current, while FIG. 2d shows another graph when max iPort injection current is provided;

FIG. 2e shows various iFET symbols of the present invention;

FIG. 3a illustrates a schematic diagram of complimentary pair of iFETs of the present invention;

FIGS. 3b and 3c illustrate a physical layout abstraction of a complementary iFET (or CiFET) compound device of the present invention;

FIG. 3d shows a three (3) dimensional perspective view of the CiFET compound device;

FIG. 3e illustrates cross-sectional view at Section AA of FIG. 3d;

FIGS. 3f, 3g and 3h illustrate a CiFET operational modeling, self-bias schematic and symbol therefor;

FIG. 3i illustrates a physical layout of NOR gate of a prior art;

FIG. 3j(1) illustrates a physical layout of seminal CiFET, FIG. 3j(2) illustrates its corresponding schematic diagram, and FIG. 3j(3) shows its corresponding symbol;

FIG. 3k illustrates a physical layout of FinFET of complimentary pair of iFET (equivalent to the CiFET symbol shown in FIG. 3j(3)) of the present invention;

FIGS. 4a, 4e(1) and 4j show transistor circuit schematic diagrams of trans-impedance low noise amplifiers (TIA) or current low noise amplifiers (CiLNA) that are self-biased with multiple inputs, differential configurations, and AGC options where CiFET forms a simple, but high quality exceptionally linear amplifier that can be used as an ultra-sensitive current input to voltage output (Trans-impedance) Low Noise Amplifier, summer/mixer, and many other related applications;

FIG. 4b shows NiPort/PiPort voltages versus source/drain iFET W/L ratios in accordance with the present invention;

FIG. 4c shows an example of V-I trans-resistance gain characteristics of the circuit shown in FIG. 4a;

FIG. 4d shows a CiFET input resistance (real impedance) and trans-resistance versus W/L ratios in accordance with the present invention;

FIG. 4e(2) shows a symbol for the circuit shown in FIG. 4e(1);

FIG. 4f shows a sample output response waveform of the circuit shown in FIG. 4e(1), which is differential 50Ω CiTIA input impedance and 100 GHz bandwidth for use as a low noise amplifier;

FIG. 4g shows gain, phase, total input referred noise, and total output referred noise plot for the same 50Ω matched differential CiTIA amplifier as shown in FIG. 4e(1) over the same frequency spread as shown for FIG. 4f;

FIG. 4h shows a graph of time vs. differential output in nano-V to illustrate the simulated impulse response for a 1 nano-Volt signal into 100 ohms (10 pico-Amps, which is 10 zepto-Watts of input power);

FIG. 4i shows a graph of differential output in response to a family of sweeps on one input with a sequence of steps on the other input to illustrate the linearity and wide dynamic range when summing two inputs, using a replica-differential configuration as shown in FIG. 4e(i);

FIG. 4k shows a frequency response of a differential CiLNA 710 of FIG. 4e(1) with 75 ohm input resistance inputs to iPort control terminal;

FIGS. 4m and 4n corresponds to FIGS. 1c and 1d, respectively and show performance characteristics of CiLNA of the present invention;

FIGS. 4o and 4p are magnified scales of the graphs shown in FIGS. 4m and 4n, respectively;

FIG. 4q shows a graph representing the voltage output from a large signal sum of two separate ±1 μa differential inputs, totaling 4 inputs equally contributing to the differential voltage output in accordance with the present invention;

FIG. 4r shows a frequency response of a differential CiLNA 710 shown in FIG. 4e(1) with 75 ohm input termination resistance of the iPort remains constant over the entire frequency band, and the improvements are apparent when it is compared with the conventional LNA with the input resistance;

FIG. 4s is a graph of a iFET ratioed at 72 yielding CiTIA with a 75Ω input resistance as sized for a Radio Frequency low noise amplifier application;

FIG. 4t is a graph of a iFET ratio of ¼ yielding CiTIA with 35KΩ input resistance sized for a charge or current sensing.

FIG. 5a shows the core of a high quality CMOS Low Noise Amplifier (or LNA) from a prominent textbook "The Design of Radio-Frequency Integrated Circuits," 2nd Ed by Thomas Lee, p 385 of the prior art;

FIGS. 5b and 5c are representative performance plots of the prior art LNA of FIG. 5a;

FIGS. 6a, 6b, and 6c are transistor circuit schematic diagrams of preferred embodiments of trans-impedance low noise amplifiers of the present invention.

FIGS. 6d, 6e, and 6f are transistor circuit schematic diagrams of preferred embodiments of differential trans-impedance low noise amplifiers in accordance with the present invention.

FIGS. 7a, 7b and 7c illustrate transistor schematic level diagrams of a few CiFET amplifier applications of the present invention; and FIG. 7d shows a graph representing varying acquisition time versus supply voltage for the 3-stage feed-forward CiAmp circuit in accordance with the present invention;

FIG. 7e shows a graph of individual noise contributions of each of the channels in the CiTIA 710 of FIG. 4e;

FIG. 7f is a power diagram for CiTIA with 50Ω input resistance in accordance with the present invention;

FIG. 7g is a schematic diagram of an isolator circuit, optionally enabled both transmit and receive at the same time on the same frequency in accordance with the present invention;

FIG. 7h is a schematic diagram of another isolator/circulator circuit for simultaneous input/output signals in accordance with the present invention;

FIG. 7i shows a schematic diagram of a simple current monitor circuit of prior art;

FIG. 7j shows a schematic diagram of a current inverter using CiFET of the present invention;

FIG. 7k shows a schematic diagram of four (4) input NOR and four (4) input NAND logic gates using CiFET in accordance with the present invention;

FIG. 7m shows a schematic diagram of CiFET with current bypass control in accordance with the present invention;

FIG. 7n shows a schematic diagram of current starved variable delay circuit of a prior art;

FIG. 7p shows a schematic diagram of current bypass variable delay line using CiFET in accordance with the present invention;

FIG. 8a(1) shows a schematic diagram of CiTIA current comparator in accordance with the present invention; and FIG. 8a(2) shows a symbol diagram of the circuit shown in FIG. 8a(1).

DETAILED DESCRIPTION OF THE INVENTION

A MOS structure referred to herein as an iFET, where the letter "i" refers to a current and "FET" refers to a Field Effect Transistor, is the enabling element of several high performance and novel designs of the present invention. The present invention is based on the addition of a direct connection to a mid-point in a Field Effect Transistor (or FET) channel and the realization that this is a low impedance port (current port, or herein referred to as "iPort") providing a bidirectional current sink/source mid-channel with a very low input impedance at a low saturation voltage, and additionally connecting reciprocal iFETs pairs of opposite "conductivity type" (P-type & N-type) interconnected to take advantage of their complementary nature to operate as a team and symmetry to self-bias near the midpoint between power supplies. In addition, the relative strength of the first and second channels of the iFETs can be adjusted (threshold choice, relative sizing, and doping profiles) to tailor the gain, speed, quiescent current and input impedance of such a complementary iFET (or CiFET) compound device of the present invention.

The iFET, with its iPort provides an uncommon and unexpected solution to the compensation problem, and then continues to provide new or alternative solutions to other old problems, exceeding industry expectations. The advantages of operating circuits in "weak inversion" have long been known but, so also have the problems. The CiFET enables circuits to exploit the high gain and wider dynamic range available in "weak inversion," without sacrificing superior speed performance. The CiFET compound device provides a standard active IC gain device that is superior to ordinary analog MOSETs making digital ICs host analog functionality. It is not a tradeoff.

The following is a list of some of the unusual aspects of a CiFET based circuit, including, but not limited to:
  Operates at low power supply voltage;
  High gain;
  Extremely linear;
  Very high speed (wide band);
  Self-Biasing;
  Low noise;
  Quick recovery (DC);
  Uses all digital parts and processes;
  iPorts respond to charge (things in nature are charge based) rather than Volts across a Resistance; and
  iPort has wide dynamic range with constant gain in an open loop.

Referring to FIGS. 2a and 2b, according to a preferred embodiment of the present invention, it provides a current FET (or iFET) 200, which is comprised of substrate 26a or 26b, source terminal 24a or 24b. and drain terminal 29a or 29b, defining therebetween two channels 23a and 25a, or 23b and 25b on the substrate 26a or 26b, respectively, typically the first (source channel 23a, or 23b) is connected to the power supply (not shown) while the second (drain channel 25a, or 25b) connects to the load (not shown). The substrate 26a or 26b is N- or P-type. The two channels, source and drain channels 23a and 25a, or 23b and 25b, respectively, are connected to each other as shown in FIGS. 2a, and 2b, at the iPort control terminal 21a or 21b, and the channels 23a and 25a, or 23b and 25b, share a common gate control terminal 27a or 27b, respectively. This configuration means that the iFET 200 has more than one control input terminal.

The gate control terminal 27a or 27b operates like a conventional MOSFET insulated gate, with its high input impedance and a characteristic Trans-conductance ($g_m$) transfer function. Typical values of ($g_m$) for a small-signal MOSFET transistor are 1 to 30 millisiemens (1 millisiemen=1/1K-ohm) each, a measure of Trans-conductance.

The iPort control terminal 21a or 21b is low impedance with respect to the source terminal 24a or 24b, and has a transfer function that looks more like beta (β) of a bipolar transistor, but is actually Trans-resistance (or $r_m$), or more generally, especially at high frequencies, Trans-impedance, measured in K-ohms, where the output voltage is a consequence of an input current. Depending on the channel sizing ratio of the CiFET the typical resistance values (or values of $r_m$) for a small-signal iFET transistor 200 are from 1KΩ to 4MΩ, a measure of Trans-resistance. Current input to voltage output (Trans-impedance) is the basis for the assertion that 1 μA in will yield an output of 100 mV (or a gain of 100,000:1) at a large signal level, or 1 pA in will yield an output of 100 nanoV (or a gain of 100,000:1) in a low noise amplifier (or LNA) (both results from the same circuit and linear over this dynamic range).

These values have been shown to remain true for a single minimum sized iFET, with inputs from 1 pico-ampere to 10 micro-amperes, using the same circuit in simulation. In 180 nm CMOS construction the noise floor limits measurements below about 10 pico-amps. iFETs can be constructed with different length to width proportions with very predictably differing results.

High gain, uncharacteristic or surprising results differing from the state of the art designs, is the result of the "Weak inversion" characteristics of the source channel 23b of the iFET 200 operating in a highly ionized super-saturation mode of FIG. 2b.

Speed in this super-saturated source channel 23b is not limited by the transit time of carriers along the channel 23b, but the high concentration of ionized charge carriers in the active channel only have to push the surrounding charge a little as charge is either added or removed from the channel 23b by means of the iPort control terminal 21b, resulting in a diffusion current which is defined by exponential relationship as has been realized when a MOSFET is operated in weak-inversion. This is in contrast to an electric field causing the charge to transit the channel, which is a square-law function of the gate control voltage. In this configuration, speed is faster than logic built from the same fundamental transistors and unhampered by the "Weak inversion" stage that has higher gains like bipolar transistors. As opposed to bipolar transistors, control current can go either in or out of the iPort control terminal 21b as well as operate with no iPort current, which is useful for creating a self-bias operating point.

Lower noise is facilitated by the self-biased operating point. Here the potential at drain terminal 29a or 29b is the same as potential at the gate control terminal 27a or 27b, greatly reducing the pinch-off effect found in conventional analog circuit designs.

The iFET 200, because of the common gate connection over the source channel 23a/23b and the drain channel 25a/25b, places a higher than expected voltage on the gate control terminal 27a/27b (or GS) of the source terminal 24a/24b or source channel 23a/23b. This higher than expected voltage is responsible for a much thicker and deeper (lower resistance highly ionized) conduction layer, allowing the majority of carriers to avoid the traps in the surface of the crystal lattice, hence—much lower noise similar to the manner in which a junction field effect transistor (or j-FET) conduction channel is located below the surface.

Trans-resistance ($r_m$) is the "dual" of Trans-conductance ($g_m$). When you look up Trans-resistance, most of the references are to inductors and capacitors, suggesting that the iFET may be useful in synthesizing inductors.

The iFET works in the following ways: A low noise amplifier requires a low impedance channel. A low impedance channel is low in voltage gain while high in current gain. To establish voltage gain, a second stage, operating as a current to voltage converter, is required. A cascaded pair provides such a configuration. Biasing requirements for a cascaded pair preclude its use at low voltage unless a solution for the biasing problem is found. The iFET provides the solution to this problem through self-biasing of a complementary pair. The impedance of the channel can be designed to accommodate the impedance of the particular signal source driving it (see later section on ratio).

Regarding FETs in general, carriers are attracted to the surface by the gate field, a low gate voltage creates a thin surface-layer on the channel (where the conductivity takes place) while a higher gate voltage creates a thicker under-layer. The thin layer of carriers is impeded by the non-uniform surface defects resulting in electrical noise, while a thicker layer of carriers finds a smoother path below the surface, thus reducing total electrical noise. This indicates that higher gate voltage translates to lower noise.

Referring to FIG. 2b, in the iFET 200, the electric field created by the gate voltage Vg on the gate control terminal 27b causes carriers to rise from the substrate 26b into the source channel 23b region converting the semiconductor material to a conductor with a relatively large number of carriers per volume or at saturation, thus establishing a level of conductivity.

Injection current $I_{inj}$ introduced into the iPort control terminal 21b increases the diffused charge (number of carriers per volume) over and in the source channel 23b, thus making the source channel 23b even more conductive. The rate of conductivity change is exponential, similar to that found in "weak inversion." This exponential rate of conductivity change is due to the low voltage gradient along the source channel 23b (source terminal 24b to iPort control terminal 21b voltage gradient).

The iFET exponential relationship between source channel 23b charge and gate voltage 27b provides access to log functionality, where the addition of two log functions is equivalent to multiplication. A reverse anti-log, or reverse-exponential, operation recovers the analog output through the opposing complementary iFET channel. Such exponential relationship may be used for various low noise amplifier applications. The exponential relationship is also responsible for the wider dynamic range of these iFET circuits.

Again, referring to the source region in FIG. 2a, removing charge from the gate control terminal 27a or/and iPort control terminal 21a (number of carriers per volume) results in reduced conductivity of the semiconductor material in the source channel 23a. In this respect, the iPort control terminal 21a-to-source terminal 24a connection operates in a manner similar to the base-region of a bipolar transistor (which is exponential): the more control current to the iPort control terminal 21a, the more the device conductivity ($g_m$).

The drain channel 25a of the iFET 200 of FIG. 2a operates more like a conventional FET, in that the thickness of the drain channel 25a is greater near the iPort control terminal 21a (same thickness as the source channel 23a) and tapers as it reaches its diffusion region around the drain terminal 29a (the decreasing voltage differential between drain channel 25a and gate control terminal 27a diminishes the field) establishing the output resistance of the transistor as set by the gate voltage $V_g$. A lower drain voltage $V_g$ (close to the voltage found on the gate), decreases the drain channel output resistance (thicker channel at the drain diffusion). Along with a thicker conduction layer, this lower drain channel resistance results in lower noise and a high output drive capability to establish the desired drain voltage at the drain 29a with a low impedance drive offered by the thick conduction layer.

Diffusion regions around the source region 24a of the iFET 200, operating at a low voltage, has lower voltage gain but it also has low noise. Diffusion region around the drain terminal 29a, operating at a higher voltage, provides the desired voltage gain with a minimal noise contribution, due to the drain voltage being the same as the gate voltage $V_g$. This voltage equality is contributed by a unique biasing construct, to be explained hereinafter.

FIG. 2b further shows iFET channel charge distributions, according to the present invention, with their operating points or iFET's characteristics without iPort injection current graphed in FIG. 2c, where the source channel current level 24c and voltage level 25c at the drain channel 25b with no input current is applied to iPort control terminal 21b. Slope 26c represents drain channel 25b am dots transresistance $r_m$, while slope 23c is for source channel 23b which is super saturated, and iPort input resistance $R_{in}$. FIG. 2d illustrates iFET's V-I characteristics with iPort injection current, where slop 26d represents drain channel 25b and its transresistance $r_m$, while slope 23d is for source channel 23b which is super saturated, and iPort input resistance $R_{in}$. It is to be noted that how a small amount 21d of iPort current greatly disturbs the drain channel output voltage $V_{out}$ 25d. As it can be seen, $V_{out}$ can swig to almost at full power supply ($V_{dd}$). This is the converse or dual of a normal voltage controlled current source use of the MOS device where large changes in the drain-to-source voltage yield minimal changes in the drain current during saturation as shown in FIG. 2d. This gives an analog IC designer insight as to the usefulness of the iFET as an amplifier which does not require a typical large, bulky analog planar transistor for the needed transconductance to obtain gain. Instead, the NiFET in a current-controlled voltage source configuration uses transresistance to boost the gain of the MOS-based device to new heights.

Non-Inverting Nature

Regarding the iPort control terminal, in the case of both the N-channel and P-channel devices, a positive current into the iPort control terminal displaces an equivalent current coming in through the drain channel, causing the drain (output) connection to move in a positive voltage direction—thus the non-Inverting nature of the iPort input.

The iPorts also operate as a current inverter as opposed to a conventional current mirror.

Interestingly, unlike other semiconductor devices, a negative current can be extracted from the iPort, causing a drain (output) shift in the negative direction. Zero input current is also valid.

Proper Bias

An iFET 200 (as shown in FIG. 2b) has both gates connected together and requires a proper bias voltage on the gate to establish the desired operating point.

Symmetry

A P-channel device can be constructed and behaves in a similar fashion to its N-channel counterpart.

It should be emphasized that while the gate input is inverted with respect to the drain, the iPort is NOT inverted. The CiFET Amplifier is the Basic Analog-in-DIGITAL Building Block:

While a single iFET has interesting characteristics on its own, a complementary pair of iFETs (or CiFET) prove to be much more beneficial. Using the opposite semiconductor type iFET as a load device conveniently provides the opposing iFET its bias and in addition has the advantage of balancing out (linearizing) the inherent non-linearities of MOSFET operation. For instance, the high-gain exponential characteristics of the source channel's super-saturated operation are linearized over an extremely wide dynamic range.

The resulting complementary device (the seminal CiFET cell) is arguably the highest possible power gain-bandwidth MOSFET amplifier stage possible. For instance, looking into either iPort, the super-saturated source channel input impedance is a relatively low number constant resistance. This converts any input current into a small input voltage, which calculates out to be a very high voltage gain transfer function implemented by the high number $r_m$ trans-resistance. In addition, the sub-surface operation of the super-saturated source channel may operate with the lowest noise possible for any MOS device. The drain channel also maximally operates below its surface defects for low noise. In the end it is all about signal-to-noise ratio.

FIG. 3a presents the seminal CiFET symbol and FIGS. 3b and 3c show a diagrammatically similar physical layout abstraction; FIG. 3d shows three (3) dimensional perspective view and FIG. 3e illustrates cross-sectional view at Section AA in FIG. 3d; and FIGS. 3f and 3g illustrate iPort control terminal behavioral model of a CiFET device of the present invention, self-bias schematic, and symbol therefor of a complementary pair of iFET of the present invention, which is a radical improvement from the state of the art in high gain, high precision, small scale, analog primitive building blocks. The complementary pairs of iFETs are built entirely from logic components, without analog extensions, while enabling scaling and portability. Both the footprint and the power consumption per gain/bandwidth are drastically reduced from the present state of the art, while retaining superior noise performance.

Referring to FIG. 3a, the complementary pair of iFETs (or CiFET) 300 comprises P-type iFET (or PiFET) 301 and N-type iFET (or NiFET) 302, comprising input terminal 30a connected to both the gate control terminal 37p of PiFET 301 and the gate control terminal 37n of NiFET 302, function as the common gate terminal 30a. CiFET 300 receives power, Power – and Power +, where Power – is connected to the source terminal of NiFET 302 and Power + is connected to the source terminal of PiFET 301. Each of PiFET 301 and NiFET 302 comprises iPort control terminals (31a and 32a) for receiving injection current. The drain terminal of PiFET 301 and NiFET 302 are combined to provide output 39a.

FIG. 3b stretches out the CiFET 300 PiFET and NiFET devices 301 and 302 of FIG. 3a to visually correlate to the physical layout abstract of FIG. 3c.

Referring to FIG. 3c, the CiFET 300 comprising PiFET 301 and NiFET 302, laid out on the substrate (or body B+ and B– respectively) like a mirror image along well border WB' shown therein; PiFET 301 comprises source terminal S+, drain terminal D+, and iPort control terminal Pi, defining source + channel 34c between the source terminal S+ and the iPort control terminal Pi diffusion region 32c, and drain channel 36c between the drain terminal D+ and the iPort control terminal Pi diffusion region 32c. NiFET 302 comprises source terminal S–, drain terminal D–, and iPort control terminal Ni, defining source – channel 33c between the source terminal S– and the iPort control terminal Ni diffusion region 31c, and drain channel 35c between the drain terminal D– and the iPort control terminal Ni diffusion region 31c. CiFET 300 further comprises a common gate terminal 30c over source + channel 34c, drain + channel 36c, source – channel 33c and drain – channel 35c. Accordingly, the common gate terminal 30c is capacitively coupled to the channels 34c, 36c, 35c, and 33c.

FIG. 3d is a 3-Dimensional representation of the CiFET physical layout of FIG. 3c and FIG. 3e is a cross-section AA of FIG. 3d. The corresponding pinpoint numbers relate the same feature between each of FIG. 3a, 3b, 3c, 3d, 3e, 3f, and 3g where the same feature is represented by the reference number with the figure letter annexed. FIG. 3h shows a symbol diagram for a CiFET device of the present invention. FIGS. 3d and 3e further points out the active channel charge conduction regions 34d, 34e, 36d, 36e, 33d, 33e, 35d, and 35e that exist for the biased CiFET which has its gate voltage at about half the difference between that on the S+ and S− terminals.

In many analog circuits, biasing is a problem. Using iFETs in complementary pairs (31g & 32g) as shown in FIG. 3g allows them to "self-bias" (38g), thus eliminating drift problems and additionally, the amplifier finds the maximum gain point on its operating curve.

In the "Behavioral Model" as shown in FIG. 3f, the current at the iPort control terminals, NiPort 33f and PiPort 34f is converted to a voltage by a trans-resistance ($r_m$), whose value determines the gain. Self-bias path 38f to $V_{input}$ 30f is provided for eliminating drift problems. This "Trans-resistance" ($r_m$) is established by the ratio of the "drain channel" to "source channel" strength, and remains constant throughout the entire operational range. Here the iFET operation is derived from different current densities in the source and drain channels, which is similar to a dual of the band-gap method of generating a reference voltage made by running the same current value through a single transistor and a parallel combination of multiple instances of an identical transistor. Simulation has shown this resistance ($r_m$) to typically be in the range of 1 KΩ to 4 MΩ with a typical value of 100 KΩ, as set by the relative channel sizing. $r_m$ is the dual of $g_m$.

The output ($V_{out}$ 39f) is a low-impedance source follower common-gate FET configuration that can deliver its voltage with the necessary current to drive the following circuit.

The iPort input is a constant low resistance termination (related to $r_m$ but much lower) with a constant offset voltage, CTAT Ref (or complementary-to-absolute-temperature reference voltage), PTAT Ref (or proportional-to-absolute-temperature reference voltage), of about 1 mV to 100 mV from their respective power supply rail. This offset voltage is a "bandgap" reference, established by the ratio of the "drain channel" to "source channel" strength.

A standard CiFET compound device cell can be physically constructed and instantiated like a logic cell for designing analog. Normally this is the only active circuit component needed. Like a transistor, but the CiFET cell does everything needed for an active component.

How then is the proper bias voltage produced? The simplest way of generating the bias voltage is to use iFETs in complementary pairs, NiFET 31g and PiFET 32g, creating an inverting device as shown in FIG. 3g, and then using the output 39g to provide negative feedback 38g to the input 30g. The CiFET compound device will "self-bias" at a point between the power supplies, where the gain is maximized and the speed or slew rate is poised for its most rapid changes. At this self-bias voltage point, the current through both of the complementary iFET devices 31g and 32g is exactly equal, there is no other DC current path for the PiFET (32g) drain except into the NiFET (31g) drain, and thus a specific gate voltage is established for this equality of currents (or conductivity). Also since both iFETs 31g and 32g have the same current, the pull-up ability is exactly equal to the pull-down ability, which defines the maximum slew rate bias point. The current at the iPort control terminals, NiPort 33g and PiPort 34g is, then, converted to a voltage by a trans-resistance ($r_m$) (not shown), whose value determines the gain.

Since the complementary pair of iFETs 31g and 32g is self-biased, any parametric factors are auto-compensated, for changes in operating environment. Because of inherent matching between adjacent parts on an IC, the bias generator can be used to bias other iFETs nearby. The real-time self-biasing circuit corrects for parametric changes (in various forms).

Each of the transistors in an inverter of the present invention acts as a "dynamic" load for its complement, allowing the gate voltage to be significantly higher than the traditional bias point of an analog circuit gate. With the complementary iFET compound device's higher than normal gate voltage, the source conduction channel is deep, yielding lower noise.

The dominant noise source in a traditional analog circuit is related to "pinch-off." Biasing the drain (or output) at the same voltage as the gate (zero differential) causes the drain conduction channel to avoid the channel pinch-off (shallow channel) phenomena usually encountered in analog circuits. Another way of stating this is: a transistor gets noisier as the drain approaches its design maximum voltage, the self-biased inverter operates its transistors at around half the design maximum voltage and the gate is at the same voltage as the drain (zero differential), therefore the self-biased inverter is MUCH quieter.

The operation of the CiFET amplifier differs from the operation of a conventional analog amplifier, with its current mirror loads, in that:

The "Source" channel has an extremely small (~100 mv) voltage from source terminal to iPort control terminal while the "Gate terminal" is at ~½ $V_{supply}$. This puts the iFET Source channel into "Super-Saturation," a condition similar to weak inversion but with high Gate overdrive. Gate overdrives resulting in an unusually thick conduction layer and along with a low Source to iPort voltage resulting in that conduction layer remaining thick all the way along the channel. Notice the differences in the thickness between the conduction channel 10s in FIG. 1e from that of 23b in FIG. 2b.

The "Drain" channel 25b operates with its' drain terminal 29b at ~½ Vmax, greatly reducing the pinch-off (and DIBBL) effect. This reduced pinch-off condition is further enhanced by the fact that the "Gate terminal" is operated at ~½ $V_{supply}$ (same as ½ Vmax), meaning no potential difference between the Drain 29b and the Gate 27b.

Another important aspect of the CiFET compound device is its current input that frees it from the speed robing effects of parasitic capacitance.

This subtle but significant difference is one of the enabling features that makes weak inversion work and gives the complementary iFET amplifier its superior low noise, wider dynamic range, and speed advantages.

MOSFETs do not make particularly good amplifiers compared to equivalent bipolar circuits. They have limited gain, they are noisy, and their high impedance makes them slow.

Bipolar Diff-Amps developed to the point where the input offset is pretty good, but the move to CMOS never really delivered as good a result.

It has long been known that superior performance can be had from CMOS operated in weak inversion but complications arising from high impedance, due to impractically low currents, preclude taking advantage of the superior gain (equivalent to that of bipolar transistors), dynamic range (exceeding that of bipolar transistors), and logarithmic performance (allowing numerous decades of amplification) found in weak inversion. Because of weak inversion the CiFET brings the noise benefits of majority carriers in a deep channel found in junction-FETs to the MOSFET.

While a MOSFET in weak inversion, working into a current source load, delivers a logarithmic transfer function, the same MOSFET working into an anti-log load cancels the nonlinearity, yielding a perfectly linear transfer function. The CiFET amplifier is such a circuit, i.e.: log input, antilog load, perfectly linear, wide dynamic range, low noise. The low noise is a consequence of the biasing, where the source channel gate potential is unusually high and the potential across the source channel itself is maintained at near zero volts. The drain channel is a level shifter, maintaining a very low voltage on the source channel while delivering high amplitude signal swings at the output.

The CiFET amplifier, implemented in a closed-loop, sample-data block delivers near perfect performance in terms of input offset because of its "flying capacitor" input. The CiFET amplifier, implemented in an open-loop, delivers unexpected levels of sensitivity (gain >1 million), even in the presence of high levels of background, this because of the extreme dynamic range.

FIGS. 3i, 3j(1), 3j(2), 3j(3) and 3k shows a comparison between NOR2 and CiFET physical layouts. In particular, FIG. 3i shows a physical layout of NOR2 device with a corresponding symbol. FIG. 3j(1) shows a physical layout of seminal CiFET while FIGS. 3j(2) and 3j(3) show its corresponding schematic diagram and symbol, and FIG. 3k shows a physical layout of FinFET of complimentary pair of iFET (equivalent to the CiFET symbol shown in FIG. 3j(3)) of the present invention.

In the layout abstractions of FIGS. 3i, 3j(1), and 3k, a metal layer (not shown) is added to connect their source/drain diffusion contacts (small squares) together. Namely, in FIG. 3j(1), for example, drain terminals pout and nout are interconnected, one iPort Ni is connected to the other iPort Ni on NiFET 30n, and one iPort Pi is connected to other iPorts Pi on PiFET 30p. Parallel channels are used as needed to increase total channel width.

Referring to FIG. 3j(1), the layout 30j includes layout for PiFET 30p and NiFET 30n, PiFET 30p includes gate Gate, iPorts Pi, drain terminals pout and source terminal pst. Source channel ps1 and ps2 is formed between the iPort Pi and source terminals pst, and the drain channel pd is formed between the drain terminals pout and iPort terminals Pi. In a similar manner, NiFET 30n includes iPorts Ni, drain terminals nout and source terminal nst. Source channel ns1 and ns2 is formed between the iPort Ni and source terminals nst, and the drain channel nd is formed between the drain terminals nout and iPort terminals Ni.

Referring to FIG. 3k, the layout 30k includes layout for PiFET 30'p and NiFET 30'n, PiFET 30'p includes gate Gate, iPorts P'i, drain terminals p'out and source terminal p'st. Source channels p's1a, p's1b, p's1c, and p's2a, p's2b, and p's2c, are formed between the iPort P'i and source terminals p'st, and the drain channels p'd1a, p'd1b and p'd1c; and p'd2a, p'd2b and p'd2c are formed between the drain terminals p'out and iPort terminals P'i. In a similar manner, NiFET 30'n includes iPorts N'i, drain terminals n'out and source terminal n'st. Source channels n's1 and n's2 are formed between the iPort n'i and source terminals n'st, and the drain channels n'd1 and n'd2 are formed between the drain terminals n'out and iPort terminals N'i.

Taking Advantage of the Doping Profile and Ratioing:

Traditionally engineers have avoided using digital logic in an analog configuration because it was believed to be unacceptably nonlinear and was difficult to bias. Digital logic also sacrifices drive symmetry for compactness. Restoring the symmetry through proper device ratioing (~3:1 p:n width) improves linearity, increases noise immunity, and maximizes dynamic range. Self-biasing solves the bias problem.

FIG. 1q depicts the basic symbol and 3-dimensional view of the MOS transistor structure in saturation. The generic planar MOSFET here is shown with a typical longer/wider channel used in customary analog applications. The FET symbol and structure shown applies to either n- or p-type planar transistors which can further be related and applied to the wrapped-gate FinFET structure as desired. Note that the FET has four ports including the gate (g) 17q, drain (d) 19q, source (s) 14q, and body (b) 16q. Typically, voltage is applied as input to the high-resistance gate port 17q, while a voltage or current may be applied to the physically similar (and interchangeable) drain 19q and source ports 14q. The bulk/body port 16q is generally attached to the lowest (or low) voltage potential for n-type FETs and highest (or high) voltage potential for p-type FETs to control/prevent forward biasing of the bulk-source junction and to give the lowest $V_{gs}$ relative to the supply voltage for normal operation (although there are exceptions and special uses for the bulk, they will not be covered here). Additionally, the planar 3-dimensional MOSFET structure in FIG. 1q is shown with a wider width, W, and longer length, L, commonly used for analog circuits, along with a channel in the pinch-off saturation region.

In order to maintain a high intrinsic gain, the MOSFET requires a high output impedance. This is obtained through long channel lengths necessary for high $r_o = R_{out}$. Since $g_m$ is proportional to the W/L ratio of the MOSFET, in order to keep $g_m$ high when the channel is long, the channel must also be proportionally wider. Gain here is $\sim g_m R_L / R_{out}$. As the IC process shrinks, $g_m$ increases, but $R_{out}$ decreases faster, ruling out short channel lengths for analog. This is why as IC processes shrink analog transistors do not scale accordingly in the newest double-digit CMOS technologies. Also, it is to be noted that the analog channel current travels close to the surface under the gate where the surface defect carrier traps create the characteristic MOSFET 1/f noise.

FIG. 1r shows a physical layout plan of an array of Fin field effect transistors (FinFET) of prior art. Sources 14r and drains 19r are stacked and forms fins, and an array of gates 17r are disposed therebetween to form FinFETs 12r. Zoomed in view of the circle Z in FIG. 1r, which shows one of prior art three (3) dimensional perspective view of FinFET 12r is shown in FIG. 1s.

FIG. 1t shows a plot representing intrinsic gain scaling of nMOS transistor of prior art. As it can be seen, the steadily decreasing intrinsic gain of nMOS transistors alerts analog designers of impending difficulty that they face when attempting to scale the design of an amplifier that may have run efficiently at 65 nm or 90 nm to the 14 nm CMOS process, where it will most likely not provide usable $g_m * R_L$ voltage gain. Therefore, other methodologies which depart from conventional procedures must be explored in order to find a viable tactic to harness inherent transistor gain in the newer ultra-deep sub-µm CMOS technologies.

FinFETs have short nanoscale channel lengths that increase $g_m$ while lowering the drain output resistance of the bare field effect transistor. Higher $g_m$ provides better control over channel conductance, but the close proximity of the drain to the source makes them talk to each other making the output resistance low. This yields a low intrinsic gain of the MOSFET at nanoscale dimensions. Conversely the CiFET is a low output resistance device and improves with deep scaling.

According to the preferred embodiment of the present invention, noise figures can be particularly optimized on front end amplifiers through proper ratioing. The iFET's electrical characteristics can be enhanced by modifying the combined and relative strength of the source and drain channels, without modifying the available IC process (without analog extensions). There are several approaches to realizing this optimization (adjusting length, width, and threshold among others).

Nearly any source and drain channel size will make a functional iFET, but varying the individual iFET channel size, both relative and cumulative, increases the iFET performance depending on the objective.

Fundamentally:

Lower iPort impedance is achieved with a lower current density (wider) source channel as compared to the drain channel.

Higher voltage gain is obtained through a higher resistance (longer) drain channel as compared to the source channel, which makes a higher output impedance looking into the drain terminal (iFET Voltage gain=Drain channel resistance/Source channel resistance).

The power verses speed tradeoff is controlled by the cumulative sum of all of the channel strengths used to set the idle current through the complementary iFET amplifier. This establishes the output slew rate (or output drive capability).

To be clear, the strength of the iFET channels are a function of the individual channel width and lengths, as well as their thresholds. Each of the iFET channels can have individually selected sizes and/or threshold relationships to the other channel.

FIG. 2e shows various conventions/symbols for iFET devices of the present invention. Symbols 22g and 24g for PiFET, and symbols for NiFET 21g and 23g are shown. For example, NiFET 21g or 23g represents an n-type iFET (or NiFET) with shorter source channel as previously described, and thus, as it can be seen, NiPort is shown near the Source. An example sizing of the NiFET device 21g may be, for drain channel with $W_{min}/2 \times L_{min}$ while the source channel is $2 \times W_{min}/L_{min}$ for a combined iFET drain:source ratio of 4. This NiFET would allow for lower input iPort termination resistance targeting current gain objectives, which is useful for high gain current input trans-impedance amplifier applications. Similarly, PiFET 22g or 24g is shown to have PiPort near the Source as well which signifies wider source channel. Example sizing of the PiFET device 22g may be, for drain channel with $3 \times W_{min}/2 \times L_{min}$, while the source channel may be $6 \times W_{min}/L_{min}$ for combined iFET drain:source ratio also of 4, but with 3×PiFET to NiFET ratio adjusting for similar PiFET to NiFET overall strength, roughly balancing P to N total channel conductance.

While iFET amplifiers can be constructed with minimum sized devices which do provide ample current at the output for very fast response and high accuracy, care must be exercised so that the complementary iFET amplifier does not pass too much current, subjecting it to mechanical failure. The physical layout requires enough contacts and metal for the required DC and transient currents.

Noise Advantages:

In the end, it comes down to signal-to-noise ratio. Low power supply voltage requirements in ultra-deep-sub-μm IC processes limit the maximum signal swing to a much smaller number than most analog designers are used to. So with a smaller signal, the noise must be equally small in order to maintain the desired signal to noise ratio. It is imperative that noise issues be reduced. This iFET amplifier technology not only reduces noise by an amount as would be necessary, but performs far beyond expectations, delivering ultra-quiet front ends.

1/f noise in the source channel is reduced because the self-bias scheme provides a high field strength on the source channel's gate, forcing carriers in the channel to operate below the surface where there is a smoother path (fewer obstructions) than along the surface where crystal lattice defects interfere.

1/f noise in the drain channel is also low. Unlike conventional analog designs, the gate is self-biased at the half-way point between the power supply rails as is the drain, while the iPort is within ~100 millivolts of the power rail. With the high electric field along the drain channel, and the gate voltage equal to the drain terminal voltage, the carriers are constrained to flow mostly below the channel surface. This keeps the drain channel out of pinched off conditions, where unwanted 1/f noise would be generated.

Resistor noise is reduced because the self-bias configuration puts the complementary pair at its lowest channel resistance operating point. Resistance is caused by collisions, between carriers and the surrounding atoms in the conductor. The lower the resistance is, the fewer the collisions are.

Wide band noise (white-noise) would always be an issue in high gain for high frequency circuits. While conventional designs adjust the gate voltage to establish suitable operating point(s), the designs of the present invention establish the gate voltage at the optimum point (the "sweet-spot") and then adjust the load to establish the desired operating point. This approach establishes a higher quiescent current where (for reasons explained above) higher current density circuits have lower wide band noise.

High common mode power supply rejection is inherent in the complementary iFET circuit of the present invention. Signals are with respect to the mid-point instead of being with respect to one of the power supply rails, (similar to an op-amp with its "virtual" ground). Power supply noise is from one rail to the other, equal and opposite in phase with respect to each other; thus canceling around the mid-point.

Ground-Loop noise is diminished because the circuit ground is "virtual" (just like in many op-amp circuits), rather than ground being one or the other power supply connections . . . . In the closed-loop case, "Flying capacitors" (or "input voltage sampling capacitors") are employed. With "flying capacitors" there is no direct electrical connection between stages, so there is no common ground; virtual or otherwise. The use of "differential decoupling" (flying capacitors) offers transformer like isolation between stages, with the compactness of integrated circuit elements.

Coupled noise from "parasitic induced crosstalk" increases by the square of the signal amplitude. Unintended capacitive coupling with a 1 volt signal causes a lot more trouble than with a 100 mV signal, by a factor of 100:1 (square law effect). The small voltage signals employed in the analog sections, reduce this capacitive coupled interference substantially. Nearby Digital signals will, by definition, be high amplitude (rail-to-rail). Good layout practices are still the best defense against this digital source of noise.

Additional Advantages:

There are a number of additional advantages. For example, bi-directional control on the iPort means that current can flow in-to as well as out of this connection; both directions having a significant control effect on overall channel current. The iPort has about five (5) orders of magnitude more dynamic control range than the gate.

The iFET of the present invention yields an analog structure that is significantly faster than logic using the same MOS devices. This speed improvement is due to the fact that the complementary structure expresses its maximum gain (and highest quiescent current) at its natural self-bias point, midway between the power supplies.

Since the iPort voltage does not significantly change, it is immune to the R/C time constant effects of the surrounding parasitics, thus the iPort (current) input responds faster than the gate (voltage) input.

Since in most applications of the CiFET compound device of the present invention, the output voltage (drain connection point) does not vary greatly, and thus making the output immune to the R/C time constant effects of the surrounding parasitics. A logic signal is slower than analog here because logic signals have to swing from rail to rail.

Drain-induced barrier lowering or (DIBL) threshold reduction is avoided in the CiFET compound device operating in the analog mode. When gain and threshold voltage is important, the drains are operating around half of the power supply voltage, thus eliminating the higher drain voltages where DIBL effects are prevalent.

In accordance with another preferred embodiment of the present invention, it provides a current input amplifier (or "CiLNA").

FIG. 4a shows a trans-impedance amplifier 700, which is a self-biased, low input impedance single stage CiFET trans-resistance amplifier that converts current input 70a to voltage output 79a, comprising a simple single stage amplifier with replica biasing made out of another self-biased CiFET, including first and second CiFETs, NiFET Q70a and PiFET Q72a, and NiFET Q74a and PiFET Q75a. The second CiFET, NiFET Q74a and PiFET Q75a biases the first CiFET, NiFET Q70a and PiFET Q72a. The output 79a is non-inverting and swings about the self-bias voltage 77a. This self-bias voltage 77a is the analog Zero reference voltage around which analog voltages swing.

Low impedance at iPort control terminal inputs 70a and 72a on the amplifier Q70a and Q72a, respectively, can be used for precision additive processing of current based analog signals. Since both inputs 70a and 72a are of the same sign (non-inverting), the resulting output 79a is a repeatable voltage related to the sum of the input currents 70a and 72a.

The input 70a can source or sink current without the need of a feedback path from the amplifiers output 79a. This is a DC coupled, OPEN LOOP amplifier. The P-Channel input 72a of PiFET Q72a behaves not in a similar fashion but in an identical fashion to its N-Channel counterpart 70a, that is to say; even though the inputs are miles apart in voltage, their response to changes of input current is identical.

The input connections 70a and 72a have a DC offset of about 1 mV to 100 mV from their respective power supply rails. This voltage is a stable "Band-Gap" class reference and tracks the iPort control terminal of the associated self-bias supply. This bandgap voltage is derived from the different channel current, or charge, density derived through ratios that are created by the size ratio of the two iFET channels, NiFET Q70a and P iFET Q72a channels.

The low impedance and termination voltage of the iPort control terminals is established by adjusting the relative channel size, or the threshold of the iFETs Q70a and Q72a.

The CiFET is a charge amplifier, and as such has far reaching application in Bio-Medical, where electrical activity in the body is in fact based on charge transfer. Charge transfer is also the operational mode in imaging arrays, piezo based transducers, and other similar types of sensors. The iPort control terminal is highly sensitive to just a few electrons at any given time (a tiny pulse).

The response time of the iFET source channel is essentially immediate since charge carriers do not have to transit this channel which contains an abundant sea of carriers that are only displaced by the addition or deletion of charge at the iPort control terminal. The carriers are not sent across the channel here because there is essentially no voltage gradient along the channel, thus the exponential behavior similar to weak inversion, but at a low channel resistance.

Since both the P-channel and N-channel complementary iFETs Q72a and Q70a, respectively, must pass the same current their exponential behavior cancels. If the current is doubled in one channel, it must double in the complementary channel. It has nowhere else to go. The response from doubling the current in one exponential will create an identical response in the complementary channel creating a precise transfer function. Their respective operating gate to source voltages "do what they have to do" to make their target current the same, or "are what they are" because they support the same current, thus the absolute values of the Vgs are incidental variables which happen to maintain their relative ratio providing a constant Bias voltage 77a at about ½ the power supply which is useful for an analog signal virtual ground that the analog voltages swing about. Not tying the analog virtual ground to either power supply isolates power supply noise and facilitates cancellation of parasitic capacitance with easy physical layout parasitic capacitance balancing considerations.

The current inputs 70a and 72a of the circuit in FIG. 4a are linear over numerous decades (more than nine decades of current FIGS. 4s and 4t), limited only by the noise floor and saturation limits. That is to say, voltage out to current in or Trans-resistance ($r_m$) has a linear relationship.

A complementary iFET Low Noise Amplifier (iLNA) shown in FIG. 4a requires proper biasing at its optimum operating point. A closed loop CiFET circuit, including complementary pair of iFETs Q74a and Q75a, provides this bias. With the gate terminals of iFETs Q74a and Q75a being held at a fixed operating voltage 77a, changes on the current 70a to the iPort control terminal of NiFET Q70a are amplified and presented on the drain connection 79a of the amplifier Q70a and Q72a.

Small changes in input current would cause significant changes in output voltage. What must be emphasized is the extremely high signal to noise ratio with extensive dynamic range and surprising linearity. In this example, the biasing voltage, $V_{bias}$, and the iPort "offset" voltages are set by the combination of two factors for a given supply voltage: 1) the ratioing the complementary iFET W/L channels, and 2) sizing the PiFETs with the appropriate multiplication factor that accounts for the hole-to-electron mobility differences in the same way pMOS is typically done for CMOS logic gate sizing.

For example, ratioing the complementary iFET source and drain channels results in the varying of the P- and N-iPort node voltages as is shown in FIG. 4b. This plots shows NiPort/PiPort voltage versus source/drain iFET W/L ratio. The left vertical axis is for N-channel iPort PTAT termination voltage in mV, right vertical axis is P-channel iPort CTAT termination voltage in mV, and the horizontal axis is iFET ratio (i.e. W/L source channel/W/L drain channel). Solid line is for iNbias, and dotted line is for iPbias as shown in the FIG. 4b. This action also alters the input resistance, $R_{in}$, as seen at either of the iPort current input terminals FIG. 4d, which is useful for impedance matching if desired.

FIG. 4c shows an example of the V-I transresistance gain characteristic of the circuit in FIG. 4a. As it can be seen, for a very small change in input current at either NiPort or PiPort, we get a large increase in voltage on the output. This plot is a linear scale depicting the constant linear trans-resistance gain through zero of $r_{m\text{-}total}$=85,000 where the CiFET ratio used was 4. A wide linear dynamic range of a sum of four of these iPort input currents are plotted in FIG. 4q using a corresponding composite log-log scale. For the default high gain CiFET ratio of 0.25, this trans-resistance gain factor is 1.5 million, and for a 50Ω matched $R_{in}$, the ratio is 64 for a trans-resistance gain factor of 5000. Furthermore, if we use either of the iFET's source channels as an impedance matching element via ratioing, we can see the direct relationship this modification has on the trans-resistance gain shown in FIG. 4d, where the left vertical axis represents input resistance $R_{in}$, right vertical axis represents trans-resistance ($r_m$=gain factor), and the horizontal axis represents iFET Ratio (W/L source channel/W/L drain channel). The solid line represents changes in $R_{in}$ over NiFET Ratio, while dotted line represents changes in $r_m$ over PiFET Ratio.

To the first order, the gain, input resistances, and iPort voltages are set by the iFET Ratio and not the IC process parameters, making CiFET based circuits relatively IC process independent thus maximizing portability of CiFET based analog intellectual property. The desirable linear, high gain trans-resistance properties, simple low power biasing, and ability to easily match iPort input to the source impedance, making the CiFET device a useful building block for analog applications.

FIG. 4e illustrates, in accordance with the present invention, an example of a self-biased replica-differential current-controlled voltage source (or CCVS) CiFET amplifying circuit 710. The circuit 710 consists of three appropriately-ratioed CiFET building blocks, including first CiFET Q70c and Q72c, second CiFET Q71c and Q73c, second CiFET Q74c and Q75c arranged to allow dual PiPort differential current 72c and 73c and NiPort differential current 70c and 71c (either or both can be used), while the output 78c and 79c is a differential voltage with zero reference 77c; the gain is therefore of the trans-resistance/impedance form innate to the CiFET device (i.e. CCVS). This particular CCVS CiFET-based circuit 710 can be also used as an impedance-matched low noise amplifier (LNA), wideband amplifier, or frequency mixer among other applications. It also shows promise for being fast enough to operate in the high hundreds of GHz (and possibly THz) range enabling direct RF signal processing and multi-GHz frequency tracking ADCs. The fully-differential signal inputs and outputs of this replica-differential topology further cancel out non-linear differences between the PiFET Q72c, Q73c, Q75c and NiFET Q70c, Q71c, Q74c as well as single-ended power supply considerations.

Focusing on the first use here as a CiFET based trans-impedance amplifier (or CiTIA), the first input CiFET Q70c and Q72c can be ratioed whereby the source and drain channels thereof to obtain a 50Ω input impedance matching through a >50 GHz operating frequency. Source-to-drain channels of the all CiFETs Q71c and Q73c, Q74c and Q75c are ratioed the same to maintain equilibrium.

FIG. 4f depicts the wideband 50Ω matching for the CiTIA circuit topology 710 shown in FIG. 4e while FIG. 4g shows the gain, phase, total input referred noise, and total output referred noise plot for the same 50Ω matched differential CiTIA amplifier over the same frequency spread. At a frequency of 100 GHz, the gain has dropped to 25 dB from the lower frequency baseline gain of 79 dB. At 0 dB, the frequency is 1.5 THz and the total input referred noise is as low as −200 dB in the wide operating frequency band.

FIG. 4g provides an awareness of the CiTIA's ability to operate at the required signal to noise ratios that are enacted with low input signal levels (waveform shown in the FIG. 4i). This compact and scalable CiTIA circuit can be used as a low noise gain element that has the ability to operate at a wide range of multi-GHz frequencies with low distortion due to minimum phase shift and a wide ultra-linear dynamic range. A very small signal can ride anywhere on a large signal without incurring distortion. Passive components such as capacitors (which are RC related to the iPort input resistance) could be utilized to create an active network for filtering (i.e. band-pass, high-pass) to amplify at the select frequency of interest with tunable properties by means of iPorts. Notably, this versatile CiTIA could ideally be used as a low noise amplifier (or LNA) for receivers. The low noise properties of the CiTIA from the circuit 710 of FIG. 4e are illustrated in the frequency plot of FIG. 4g. In FIG. 4g, line 4g1 line is total input referred noise; 4g2 line is total output referred noise; 4g3 line is phase shift; and 4g4 is differential 50Ω CiFET trans-impedance amplifier gain. The roll-off slope of the total input referred noise (line 4g1) and total output referred noise (line 4g2) descends at 20 dB per decade until the point at which the amplifier roll-off starts. At that point, the total output referred noise rolls off faster (60 dB per decade) as a results of the amplifier roll-off at 40 dB per decade (which happens at approximately 1 GHz). The double rate of roll-off results from the sum of both parts of the replica differential configuration and the trans-impedance amplifier remains stable thought its operating frequencies. FIG. 4h shows the ability for this topology to amplify very small nV signals (converted from current into a constant input resistance) with high precision, linearity, and a fast stable response.

FIG. 4i shows differential output in response to a family of sweeps on one input with a sequence of steps on the other input. The purpose of this plot is to illustrate the linearity and wide dynamic range when summing two inputs, using a replica-differential configuration. In this replica-differential configuration, common mode input current signals are not differentially propagated to the output, difference current signals appear differentially at the voltage output. Common mode current input signals move both differential outputs together yielding no differential signal gain. This is because there is no cross connection to provide common mode rejection. Common mode signals are passed to the next stage, where any common mode component is dealt with— now that the signal is out of the mud.

The selection of a 1 μA input in FIG. 4i is made in contrast to that of FIG. 4c, where the input is only 1 pA to illustrate the extreme dynamic range. FIG. 4i is a linear-linear scale plot and when the same plot scales are changed to a composite of log-log scales (logs do not go through zero, only approach zero, femto-amps and nano-volts here FIGS. 4s and 4t), the plot looks identical showing the CiTIA linearity and gain over its wide dynamic range.

In order to illustrate linearity over a large range, Input "A" is swept from −1 μA to +1 μA while input "B" is stepped from −1 μA to +1 μA in 0.1 μA increments. The output is remarkably linear, in all quadrants, over an unprecedented range, as can be seen with close inspection.

Because the input is a current, it is used twice with the same effect each time, for a total differential block gain that is four times (340,000) that in FIG. 4c, with the noise contribution from the two different sides being uncorrelated (Gain=4×, Noise=√4 or 2×).

Once again, the plot shown in FIG. 4q shows the voltage output from a large signal sum of two separate ±1 μa differential inputs, totaling 4 inputs equally contributing to the differential voltage output; while FIG. 4c is the voltage output from a single low level iPort input current of ±1 pa. This evidences a linear response over the full ~9-decade dynamic range, avoiding unintended intermodulation distortion from a small signal of interest rides on a 1 million times larger signal.

In FIG. 4e, the circuit 710 shows two such amplifier circuits, first being Q70c and Q72c and second being Q71c and Q73c, that, because of inherent process matching, have the same offset voltage at their iPort control terminals 70c and 71c with the same current sensitivity therebetween, and so any signal presented differentially to the two matching inputs 70c and 71c will not see a DC offset with respect to each other.

Additionally, because the two input signals 70c and 71c have opposite signs (or polarity), any nonlinearity exhibited by one amplifier will be compensated for (canceled out) by the other amplifier.

While the two such amplifier circuits Q70c/Q72c and Q71c/Q73c, have no cross connection to compensate for common mode input signals, common mode signals will be presented equally on the complementary outputs 78c and 79c, for the following stage to deal with. The input common mode is absorbed by utilizing current inputs instead of voltage inputs.

The point is; the tiny input signal has been amplified sufficiently to get it out of the mud with little noise contribution from the amplifier circuits Q70c/Q72c and Q71c/Q73c.

Because of the wide dynamic range of the amplifier 710 shown in FIG. 4e and because of the possible wide dynamic range of the input signal, means have been provided to reduce the gain of the amplifier circuits Q70c/Q72c and Q71c/Q73c stage as required in the presence of larger signal inputs (by reducing the channel current of the gain elements). This gain control facility may be added to the already wide dynamic range inherent in the particular implementation 710 of FIG. 4e as modified in FIG. 4j which includes a common input to all three PiFETs Q72e, Q73e, Q75e controlled by the NMOS Q76e which is voltage biased by the AGC input 76e. Gain control is caused by pulling a balanced current out of all three CiFETs Q70e/Q72e, Q71e/Q73e in the CiTIA amplifier including the Bias CiFET Q74e and Q75e.

This level of dynamic range is unprecedented in LNAs, and the circuit as shown in FIGS. 4e and 4j facilitates high resolution measurements. This high level of dynamic range is extended by the inclusion of voltage controlled gain as part of a feedback loop in a larger system. "Voltage controlled gain" in the amplifier shown in FIG. 4j is essentially FREE and does not add any devices to the signal path.

It is true that a lower operating current in the amplifier shown in FIG. 4j would increase noise, as the gain decreases. In other words, the lower the input current, the noisier the amplifier would be. An automatic gain control (or "AGC") (not shown) may be provided for generating gain control signal 76e. The gain control signal 76e may be applied to a circuit element Q76e, which in turn controls injection current 75e to iPort control terminals of Q72e, Q73e and Q75e for diminishing the gain by decreasing the operating current, thus increasing the noise; however, it does this in response to a higher amplitude input signal. Noise contributed by the AGC circuit (not shown) is minimized with smaller input signals while allowed to increase in the presence of larger input signals (contributed noise is proportional to attenuation). This is the best possible scenario of signal to noise contributed by the local circuitry. One of reasons for putting AGC on the LNA first stage is to prevent clipping in subsequent stages.

FIG. 4g shows the AC characteristics of the CiTIA amplifiers of FIGS. 4e and 4j where the total input referred noise is trace 4g1, total output referred noise 4g2 as derived by the total input noise 4g1 multiplied by the gain 4g4, along with the phase shift is 4g3. These total noise traces 4g1 and 4g2 are replotted in FIG. 7e to show the individual noise contributions of each of the channels in the CiTIA 710 of FIG. 4e where the top trace 7e1 is the total output referred noise and the bottom trace 7e6 is this total input referred noise 7e1 again related by the voltage gain 4g4. The two largest contributors to local noise trace 7e2 are the drain channels of the two input NiFETs, Q70c and Q71c. The input PiFETs contribute more noise 7e3 at DC, but they roll-off twice as fast yielding lower noise over the anticipated AC band of frequencies. The super-saturated channel noise contribution is insignificant, 7e4 for the NiFET source channels and 7e5 for the PiFET source channels. The noise contribution from the Bias CiFET does not even show because its noise is nulled out by the replica-differential configuration of this CiTIA 710. To be more specific, the noise is generated in the thinner conduction channel region around 25b in FIG. 2b of the drain channels of NiFET Q70c, Q71c and PiFET Q72c, Q73c, just before the drain charge carriers are pinched, where these carriers are forced near the turbulent surface that create noise from the channel to gate oxide surface defects. (See FIGS. 2a and 2b, drain channel 25a, 25b about the drain terminal 29a, 29b).

Self-biasing at the midpoint between power supplies reduces the drain voltage on the input iFET drain channels, NiFET Q70c, Q71c and PiFET Q72c, Q73c contributing lower noise by reducing the channel thinning near the drain diffusion regions about the drain terminals.

Midpoint self-biasing also reduces the contribution of noise from the power supply because noise from ground and power cancels at the midpoint. Midpoint self-biasing also means maximum supply current density which translates to minimum noise as a result of minimum channel resistance. Also because the noise issues from two physically different iFET input transistors, NiFETs Q70c, Q71c and PiFETs Q72c, Q73c, that noise is not correlated.

In many cases, P-channel devices (i.e. PiFETs) may contribute less noise than their N-channel counterparts (i.e. NiFETs). In the P-channel case an inversion of the entire circuit allows the signal to be presented to the P-channel iFETs instead.

Referring to 710 FIG. 4e, the CiFET compound device, when used in pairs and operating at their self-biased maximum gain point, presents a highly desirable, low impedance current input, with a significant improvement in signal to noise ratio and constant gain over an extremely wide dynamic range. It would be useful for various applications, including, but not limited to a self-biased differential antenna preamp, an antenna transmit/receive isolator, a circulator, transmission line receiver, optical preamp, a charge/current based sensor preamplifier, and for many other types of current sourced or charge based input signals.

The use of differential inputs addresses the DC offset issue by presenting a DC differential of zero, from input 70c to input 71c shown in FIG. 4e.

A gain control signal 76e is shown in FIG. 4j. The ghost image of a DiffAmp is shown as a possible next stage, but is not part of the current amplifier shown in FIG. 4j or the AC characteristics shown in FIGS. 4k, 4m, 4n, 4o, and 4p.

FIG. 4c shows a graph of output relative to bias. The purpose of this plot is to illustrate the linearity between the input current (horizontal axis) and the output voltage (vertical axis). The input is from a current source, and so its reference is irrelevant. The output is with respect to the self-bias or "Bias" voltage (~midway between power supply rails).

In addition, the input moves from −1 pA to +1 pA, for a change of −85 nano-V to +85 nano-V on the output. Most analog amplifiers would not even respond to an input change that small, let alone with any resemblance to linearity.

When a MOSFET is modeled, the input to output relationship "V-in to I-out" is described in terms of Trans-conductance ($g_m$), expressed in "Siemens" or "miliSiemens". This circuit, being "I-in to V-out" is described in terms of Trans-resistance, or more generally Trans-Impedance, ($r_m$), expressed in "Ohms" or "K-Ohms". Trans-resistance ($r_m$) is the "Dual" of Trans-conductance ($g_m$).

Furthermore, the graph of FIG. 4c indicates an input to output $r_m$ that translates 85,000 times the input to the output (8.5 mV per 100 pA). An input of 10 μA would drive the output past clipping, but the gain is constant (linear response) all the way down to 1 μA input, where the gain remains 85,000. This is an open loop amplifier, with a dynamic range of more than 1 million:1, or 20 bits in the digital domain.

FIG. 4h shows a graph of time vs. differential output in nano-V. The purpose of this plot is to illustrate the simulated impulse response for a 1 nano-Volt signal into 100 ohms (10 pAmps, which is 10 zepto-Watts of input power). The output tracks the input, without overshoot, to an output voltage of 60 nano-V, within 1 ns. This indicates the amplifier will operate comfortably in the GHz range. The 100 ohm input resistance design parameter yields a combined iFET Trans-resistance ($r_m$) of 60K volts/amp in this implementation. The plot represents performance of a 180 nm circuit, built with minimal size devices. At smaller scale the performance improves significantly. Performance is somewhat proportional to ring oscillator speed comparisons.

FIG. 4i illustrates additive linearity of a differential CiTIA iPort of the present invention. Here the NiPort was swept from −1 μA through zero to +1 μA for each diagonal output plotted. At the same time, the PiPort iPort was stepped in 100 nA steps for each diagonal trace. The importance of this plot is that it shows the uniformly equal spacing between the traces to verify that every time the p-channel differential input is stepped in current, the spacing between output traces is linear in both spacing and straightness of the lines. This is useful for adders and mixers in signal modulation operating at the high frequencies of the CiTIA. This plot in FIG. 4i also shows the composite gain: 1 μA produces 340 mV, which is 85 mV for each input, resulting in an $r_m$ of 85,000 per input. Furthermore, the differential CCVS CiFET amplifier operates equally in all four quadrants, including zero, of the plot.

The differential CiTRA/CiTIA has shown great usefulness for amplification applications in ultra-deep sub-μm and nanoscale CMOS technologies below 45 nm including FinFETs. It has a wide dynamic range with optimal gain and a distortion-free linear response, which can dramatically improve distortion and SNR for multi-GHz communication systems. Finally, the circuit is low power and can work at supply voltages below 1V as shown in FIGS. 4m, 4n, 4o, and 4p, which is important for portable, battery-dependent wireless systems as well as battery-free energy scavenging systems such as a thermocouple. FIG. 4p shows that the CiTIA operates solidly at a 10 mV power supply showing a bandwidth of about 5 KHz at a power consumption of less than 10 pico-Watts as plotted in Figure (7f=thesis FIG. 4.22).

In the CiTIA of FIG. 4j, which can include AGC control, the inputs are the N-Channel iFETs Q70e and Q71e, with the gain control signal 76e controlling the P-Channel iFETs Q72e, Q73e, and Q75e through their iPort control terminals. Optionally, a configuration where the inputs are connected to the P-Channel iFETs (by flipping the semiconductor types which is replacing the PMOS with NMOS, NiFETs with PiFETs, and PiFETs with NiFETs in FIG. 4j), and the gain control signal would control through the PMOS the N-Channel iFETs which may offer overall lower noise (because, often P-Channel devices are quieter).

In FIG. 4h, the input is a ±2 nano-volt P-P pulse yielding a ±120 nano-volt P-P output with a response time of about 1ns, a voltage gain of 60, or 35 dB (½ the total gain from each side), uncommon sensitivity in a current amplifier. This kind of sensitivity will enable the scientific community to make measurements on a scale never before possible.

The additional circuitry for a differential path doubles the gain and increases the noise, but the gain is correlated while the noise is uncorrelated, resulting in an enhanced signal to noise ratio (1.41 or $\sqrt{2}$ times better).

The simulation was run in a 180 nm digital IC process using minimum area and power design which improves with IC process shrink. Nanosecond rise times indicate frequency response into the GHz range at 180 nm. While the prior art LNA voltage amplifier circuit in FIG. 5a is intended for use in a closed loop, with relatively large signals as compared to the CiTIA signal levels. This CiTIA current amplifier circuit FIG. 7a is intended to be operated in an open loop with extremely small signals, but remains viable over many, many decades. This allows small signals to be seen in the presence of very high levels of out-of-band background or interference without overloading the signal chain. Due to the CiFET linearity over a wide dynamic range with improved low noise performance of the CiTIA circuit 710 of FIG. 4e, may amplify signals out of the mud without incurring phase and gain distortion of the prior art resonant LNA circuit approaches, that are employed for obtaining high sensitivity within inferior CMOS ICs. MOS RF front-end circuits that are available in CMOS ICs. This leaves a simple, clean linear circuit at the front-end and the bandpass cutoff can be done at higher signal levels away from the signal to Noise concerns of the RF front end. Physically inductors do not add noise, but they electrically pick up unwanted signals and are operated at their highest practical Q, which introduces phase shift and gain peaking distortion over their passband. These distortion introducing gain, phase and notch characteristics that the CiTIA LNA avoids as compared to the prior art LNA example in FIG. 5a circuit are plotted in FIGS. 5b and 5c. At higher signal levels exotic flatter passbands can be implemented using more filter parts than are available at the LNA level. Representative FIG. 4e CiTIA 710 simulation plots are shown in FIGS. 4s and 4t each showing 9 decade sweeps of input current (x-axis) ranging from 1 fa to 10 μa. FIG. 4s is of a iFET ratioed at 72 yielding a 75Ω Rin 4s3 CiTIA as sized for a RF LNA; while FIG. 4t is of a iFET ratio of ¼ yielding a 35KΩ Rin 4t3 CiTIA sized for a charge or current sensing.

Trace 4s1 shows a constant Trans-Resistance $r_m$ gain (Vout/iSweep) of 2,800Ω for the 750 case; while trace 4t1 shows a Trans-Resistance $r_m$ gain (Vout/iSweep) of 1.25 million Ω for the Rin=36 KΩ case.

The diagonal trace is the CiTIA differential output voltage in response to its iPort input current: 4s2 starting at 28 pico-volts for a 10 femto-amp input current to 28 milli-volts at a 10 μamp current input; while 4t2 starts out at 1.2 nano-volts for a 1 femto-amp iPort input up towards a 1.2 volt saturation at 1.0 μamp iPort current input. These perfectly linear gains enable distortion-free amplification over the full dynamic range from the noise floor to saturation.

This performance is facilitated by the complementary iFET CMOS transistor's Super-Saturated source conduction channel shown in FIG. 2b (i.e. source channel 21b therein). Because this source conduction channel as referred to as 21b in FIG. 2b is uniform with a low voltage gradient along its length, it acquires an exponential characteristic resulting it this wide dynamic range. Because this Super-Saturated source conduction channel is deep, it operates at an extremely low noise level comparable to that of a junction-FET (or jFET), one of the lowest noise IC transistors, which are essential to run down to ultra-low signal levels.

The breakup of the plot traces is a consequence of the 8-digit data file transferred into the plotting program and not the simulation or CiFET TIA circuit. This is especially evident on the resistance traces 4s3 and 4t3 which are created by a division of output voltage/sweep current.

FIG. 4k illustrates the frequency response of a differential CiLNA 710 of FIG. 4e(1) with 75 ohm input resistance inputs to iPort control terminal in the form of a standard Bode gain-phase plot prior art reference set comparable to FIGS. 1b, 1c, and 1d. It should be noted that the gain remains constant with frequency up to a well behaved roll-off region where the phase shift is minimal and not abrupt. This well-behaved linear response is in strong comparison to an example of low noise amplifier (or LNA) FIGS. 5b and 5c where the gain radically changes throughout the pass band and the example's phase shift is 415 degrees around the passband frequency. In order to obtain the best signal sensitivity and cut down the out of band energy, conventional LNAs operate at a resonant circuit peak mode in-band. The radical gain variation and radical rate of phase shift introduce excessive distortion in the passband. Alternatively, the CiLNA maintains signal integrity through its linear characteristics and does not depend on resonant circuitry for peaking its gain and obtaining low noise performance using a linear gain without an array of resonant elements operating at the low signal level. The passband can be cut out of a linearly larger signal in this different approach, or passband filtering can easily be added at the iPorts of the CiTIA if this is needed. The CiTIA low noise performance is derived through the super-saturated channel 21b as shown in FIG. 2b which is ionized below the gate oxide surface 20b where the primary shot-noise is generated. This super-saturated channel 21b operates with exponential conduction characteristics of diffusion current and has a low resistance value of 75 ohms in the 75Ω example, keeping the Johnston resistance noise source at a minimum.

FIGS. 4m and 4n correlate to FIGS. 1c and 1d, the prior art baseline CMOS OpAmp as power supply is reduced from the full 1.8 core voltage available in its semiconductor process down to a near-minimum operating voltage in −100 millivolt steps. The OpAmp of FIG. 1a was used as a comparison here instead of the LNA, because the comparable differential LNA of FIG. 5a has too many problems with reduced voltage to be of much comparison value. In FIG. 4m for the CiTIA amplifier, the right-most solid trace 4m1 is for the full 1.8 volt power supply voltage, which shows a flat gain of 30 dB and a cutoff frequency of about 80 GHz. The power supply voltage was dropped in −100 millivolt steps for each succeeding lower cutoff frequency trace. The bold dash trace 4m2 is for a power supply of 1.0 volts where the ultra-deep sub-um and nano-scale IC processes and especially FinFETs like to operate. The next 4 grey traces 4m3a, 4m3b, 4m3c, and 4m3d, are for 0.9 volts down to 0.6 volts. These are where the CiLNA functions at its highest gain of about 38 dB. This is because of the CiLNA operating deeply in the exponential mode instead of partially in the normal MOSFET square-law mode. The dotted traces 4m4a, 4m4b, 4m4c, and 4m4d take the power supply voltage down from 500 my to a power supply of 200 mv where the gain remains close to 30 dB, clearly illustrating the CiTIA's is not limited by threshold voltage making it useful for an entire new class of power scavenging sensor and low power, low voltage processing circuits. FIGS. 1d and 4n re-plot these gain and cutoff frequency relationships so they can be clearly presented.

It might be noted that the CiLNA operates all the way down to around 1.0 millivolt on the power supply with a potentially usable bandwidth. This may be applicable for systems like a reader field powered RFID systems that measures analog values like temperature. To further illustrate this low voltage operation, these two plots FIGS. 4m and 4n were magnified below 200 millivolts in FIGS. 4o and 4p respectively. For a 50 millivolt power supply the CiLNA makes an amplifier that has a gain of about 15 dB and a cutoff frequency of about 15 KHz where the power is about 5 pico-watts as extrapolated from FIG. 7f.

FIGS. 4n and 4p show the range of the differential CiTIA's operating frequency and gain versus supply voltage when the input is matched to a 750 antenna for a RF receiver. Most notably, at an extremely low 25 mV power supply this transresistance amplifier has approximately 10 kHz bandwidth and a gain of 5 dB as can be seen in FIGS. 4n and 4p—obviously revealing that the CiFET is not a threshold voltage limited device like state-of-the-art analog amplifiers. FIGS. 4n and 4p demonstrate that the CiTIA amplifier circuit 710 from FIG. 4e is not restricted by threshold voltages or their stacking, which makes these CiFET amplifier configurations extremely useful at very low power supply voltages and can be fabricated in ultra-deep sub-μm and nanoscale CMOS technologies with very desirable gain, frequency, and low power properties.

FIG. 4q depicts this topology's similar linear, high gain characteristic to the individual CiFET current injection vs. output voltage plot previously shown in FIG. 4c. Only here the input was swept through a minimal input range of −1 pA through zero to +1 pA which illustrates a dynamic range of over 1-million-to-1 with no zero-crossover discontinuity. Linearity and transresistance ($r_m$-total) gain stays at 85,000 per iPort current input over the entire range (note: $r_m$=the slope in FIGS. 2c and 2d). This gain is set by the relative conductance of the source and drain iFET channels making the CiFET very process independent. In addition, the gain can be electrically varied by several mechanisms if desired. This CiFET transresistance gain $r_m$ depends on the relative channel conductance ratios normally set by relative channel sizes, as charted in FIG. 4d primarily and not the IC process parameters, yielding a high degree of design portability.

If all four iPort sites 70c, 71c, 72c, 73c of the differential CiTIA of FIG. 4e 710 are utilized as a current input the gain adds from both of the PiFET and NiFET, such that:

$$r_{m_{n1}} + r_{m_{p1}} + r_{m_{n2}} + r_{m_{p2}} \approx 4r_m = r_{m\text{-}total}$$

if the currents are similar and the sizing of the iFETs is done correctly regarding roughly equivalent pull-up mobility to pull-down. A small current input on one iPort can be offset with a large current on the other iPort without losing small signal linearity or sensitivity. Furthermore, gain can also be electrically altered, as mentioned previously, by using the opposing iPort along its self-bias generator's iPort as in FIG. 4*j*.

The graph in FIG. 4*r* illustrates how the 75 ohm input termination resistance of the iPort remains constant over the entire frequency band, and the improvements are apparent when it is compared with the conventional LNA with the input resistance as shown in FIG. 5*c*. This constant termination resistance FIG. 4*r* results in a reflection-free input for both the input and the out-of-band signals.

Because of the extreme degree of linearity, the filtering out of side-bands would not be necessary for the LNA level where the simplest circuitry normally yields the best noise figure. If it is necessary to knock down out-of-band signals early, the configuration as shown in FIG. 7*c* can be utilized where the extra iPort inputs pFB+, pFB−, nFB+, nFB− can be used for subtracting the out-of-band signals from the input.

FIG. 5*a* shows a schematic diagram of a core of a high quality CMOS Low Noise Amplifier (or LNA) from a prominent textbook "The Design of Radio-Frequency Integrated Circuits," 2nd Ed by Thomas Lee, p 385 of the prior art, and FIGS. 5*b* and 5*c* show representative gain, phase, and input resistance performance plots of the prior art LNA of FIG. 5*a* for comparison purposes with the CiLNA of the present invention.

FIGS. 6*a*, 6*b*, and 6*c* show exemplary schematic diagrams as to staging the CiAmp and CiTIA similar to one 700 shown in FIG. 4*a*, showing the flexibility of the CiFET configurations. All CiFET device ratios within an amplifier are normally set to the same ratio in order for all stages to be biased near the same self-bias "sweet-spot" or approximately ½ Vdd. Similar replica differential circuit structures can also be made where the core TIA 700 from FIG. 4*a* is replaced by the replica differential TIA 710 of FIG. 4*e* and the attached voltage amplification stages are added differentially as in FIGS. 7*b* and 7*c*.

These examples illustrate stronger source channels yielding lower input resistance that transfers energy into the amplifiers by means of input signal current into a low impedance input yielding performance similar to FIG. 4*s* which is well suited for RF receivers and biomedical sensing applications for instance. Flipping the CiFET channels to make a stronger channel near the output node yields a higher voltage gain configuration similar to the performance plots of FIG. 4*t* which are well suited for a wide array of sensor applications for instance.

FIG. 6*a* shows first and second pairs of CiFET, Q70*f* and Q71*f*, and Q74*f* and Q75*f*. Input current may be provided to singularly to N iPort 70*f* or P iPort 70'*f*, or for a current gains, to both N iPort 70*f* and P iPort 70'*f*. Output 79*f* varies as the sum of 70*f* plus 70'*f* inputs, creating an analog mixer of these two separate inputs. Output 79*f* from the first pair Q70*f* and Q71*f* may be further amplified/inverted using an additional pair of CiFET Q71*f* and Q73*f*, for an inverted output 79'*f*. The bias 77*f* from the second pair Q74*f* and Q75*f* forms as the virtual ground Bias reference that the output of circuit 800 swings about.

FIG. 6*b* shows a circuit 810 similar configurations as shown in FIG. 6*a*, including two pairs of CiFET Q70*g* and Q72*g*, and Q74*g* and Q75*g* with inputs 70*g*/70'*g* and outputs 79'*g* and 77*g*; however, the output 79*g* from the first couple of CiFET Q70*g* and Q72*g* receives two stages of amplification through two additional pairs of CiFETs Q71*g*1 and Q73*g*1, and Q71*g*2 and Q73*g*2 with capacitively feeding back the output of the second pair Q71*g*2 and Q73*g*2 to the first pair Q71*g*1 and Q73*g*1.

FIG. 6*c* yet further show another circuit 820, similar to ones shown in FIGS. 6*a* and 6*b*, including two pairs of CiFET Q70*h* and Q72*h*, and Q74*h* and Q75*h* with input 70*h*/70'*h* and outputs 79'*h* and 77*h*; however, the output 79*h* from the first couple of CiFET Q70*h* and Q72*h* receives three stages of amplification through three additional pairs of CiFETs Q71*hl* and Q73*h*1; Q71*h*2 and Q73*h*2; and Q71*h*3 and Q73*h*3 with capacitively feeding back the output of the second pair Q71*h*2 and Q73*h*2 to the first pair Q71*hl* and Q73*h*1, and with feed-forward pair Q71*h*4 and Q73*h*4 for improving speed/reducing delay.

FIG. 7*a* shows a conceptual schematic diagram for a $Z_{in}$ matched transmission line or data bus receiver 900. The circuit 900 comprises a first complementary pair of iFETs, NiFET Q70*i* and PiFET Q72*i*, for amplifier (current in, voltage out), and a second complementary pair of iFETs NiFET Q74*i* and PiFET Q75*i* for biasing the amplifier or the first complementary pair Q70*i* and Q72*i*. The source terminals of PiFETs Q72*i* and Q75*i* of the first and second complementary pairs are connected to positive supply voltage Vdd, while the source terminals of NiFETs Q70*i* and Q74*i*, of the first and second complementary pairs are connected to negative supply voltage Vss. A self-biased, low input impedance current 70*i* is supplied to the iPort control terminal (or iPort low impedance input terminal) of the NiFET Q70*i* of the first complementary pair. In the case that the polarity of the input current is positive, such current input would be connected to the iPort control terminal of PiFET Q72*i* of the first pair. Drain terminals of the first complementary pair are connected together to form an output 79*i* therefrom. Bias is generated by the second complementary pair of NiFET Q74*i* and PiFET Q75*i*. Drain terminals of the second complementary pair Q74*i* and Q75*i* are connected together for generating Bias, and is fed back to the gate terminals of the first and second complementary pairs, Q70*i* and Q72*i*, and Q74*i* and Q75*i*. The Bias is the analog zero reference voltage around which analog voltage would swing.

The output 79*i* of the first pair Q70*i* and Q72*i*, would be further amplified via a CiFET amplifier, or third pair of NiFET Q71*i* and PiFET Q73*i*. The CiFET amplifier comprises a complementary pair of iFETs, namely, NiFET Q71*i* and PiFET Q73*i*. The source terminal of NiFET Q71*i* of the third pair receives negative supply voltage Vss, while the source terminal of PiFET thereof receives positive supply voltage Vdd. Gate terminals of the third pair receives the output 79*f* from the first pair Q70*i* and Q72*i*. Drain terminals of the third pair Q71*i* and Q73*i* are connected together to form an output (−Output), which is inverting from its input (or input of the third pair Q71*i* and Q73*i*). The Bias of the second pair Q74*i* and Q75*i* would serve as reference output for the amplifier 900 as a whole.

This is an example of using the CiTIA to receive transmission line or bus signals. The transmission line goes into one of the iPorts 70*i* of the NiFET Q70*i* or 72*i* of the PiFET Q72*i* of the first CiFET and a second stage may be used to increase gain. The iPorts can be used to set the threshold and the parallel use of all the iPorts control the receiver gain. Alternatively, the PiPort of Q72*i* PiFET could be used for a transmission line receiver terminated top the positive supply Vdd.

FIG. 6*d* shows a schematic diagram of a replica-differential CiTIA with single stage voltage gains added to its outputs 830 in accordance with the present design. A CiTIA 710*i* is the same as the one 710 shown in FIG. 4*e*(1), including first NiFET Q70*i* and PiFET Q72*i*, second NiFET Q74*i* and PiFET Q75*i*, and third NiFET Q71*i* and PiFET Q73*i*. Positive voltage output 79*i* from the CiTIA 710*i* is amplified with a single stage voltage amplifier (or CiFET) Q76*ia* and Q77*ia* for inverting to negative voltage output 79'*i*, and negative voltage output 78*i* is amplified with another single stage amplifier (or CiFET) for inverting to positive voltage output 78'*i*.

FIG. 6*e* shows a schematic diagram of a replica-differential CiTIA with two stage voltage gains added to its outputs 840 in accordance with the present invention. A CiTIA 710*j* is the same as the one 710 shown in FIG. 4*e*(1), including first NiFET Q70*j* and PiFET Q72*j*, second NiFET Q74*j* and PiFET Q75*j*, and third NiFET Q71*j* and PiFET Q73*j*. Positive voltage output 79*j* from the CiTIA 710*j* is amplified with a two-stage voltage amplifier including first stage amplifier Q76*ja* and Q77*ja*, and second stage amplifier, Q78*ja* and Q79*ja* for non-inverting positive voltage output 79'*j*; and negative voltage output 78*j* is amplified with another two-stage amplifier, including first stage amplifier Q76*jb* and Q77*jb*, and second stage amplifier, Q78*jb* and Q79*jb* for non-inverting to negative voltage output 78'*j*. If this CiTIA application requires roll-off for stability, capacitor locations are indicated by C71*ja*1, C71*ja*2, C71*jb*1, and C71*jb*2.

FIG. 6*f* shows a schematic diagram of a replica-differential CiTIA with three-stage voltage gains added to its outputs (with optional speed-boosting feed-forward amplification dotted in) 850. A CiTIA 710*k* is the same as the one 710 shown in FIG. 4*e*(1), including first NiFET Q70*k* and PiFET Q72*k*, second NiFET Q74*k* and PiFET Q75*k*, and third NiFET Q71*k* and PiFET Q73*k*. Positive voltage output 79*k* from the CiTIA 710*k* is amplified with a three-stage voltage amplifier including first stage amplifier Q76*ka* and Q77*ka*, second stage amplifier, Q78*ka* and Q79*ka*, and third stage amplifier Q80*ka* and Q81*ka* for inverting negative voltage output 79'*k*. For stability, capacitors, C79*ka*1 and C79*ka*2 are coupled between the iPorts of the first stage and the second stage output. Feedforward amplifier QFW0*ka* and QFW1*ka* (optionally shown dotted) may be added by forwarding the input 79*k* of the first stage amplifier to the input of the feedforward amplifier QFW0*ka* and QFW1*ka*. Similarly, negative voltage output 78*k* is amplified with another a three-stage amplifier including first stage amplifier Q76*kb* and Q77*kb*, second stage amplifier, Q78*kb* and Q79*kb*, and third stage amplifier Q80*kb* and Q81*kb* for inverting to the positive voltage output 78'*k*. For stability, capacitors, C79*kb*1 and C79*kb*2 are coupled between the iPorts of the first stage and output of the second stage output. Feedforward amplifier QFW0*kb* and QFW1*kb* may be added by forwarding the input of the first stage amplifier 78*k* to the input of the feedforward amplifier QFW0*kb* and QFW1*kb*.

Specifically, FIG. 7*a* is an example of matching iPort input resistance $R_{in}$ to the characteristic impedance of a transmission line. This is achieved by ratioing the CiFET source to drain channels as illustrated in the plot of FIG. 4*d*. A 200Ω transmission line requires a ratio of ~32 as read from this plot. Thus, the CiFET drain channels are 2× long, then the source channels are 16× wide for a combined ratio of 32. A differential version has higher noise immunity and speed.

This impedance matching through iPort ratioing avoids transmission line reflections and maximizes power transfer to the CiTIA resulting low termination impedance which also creates a low noise receiver that operates on current, rather than voltage, which is passed down the interconnect wire. For low noise, the receiver is locally referenced at the receiver ground instead of the remote transmitter ground as in a voltage transmission system. The high output impedance of the transmitter current source provides high compliance to ground noise which normally enters the signal path between the source and receiver.

A current into a low termination impedance means that there is insignificant voltage change on the transmission line, making the interconnect capacitive loading of no effect, thus a large power savings. This system is well suited for high speed data bus applications. The various bus talkers are just wire-OR'ed to the data bus wires, also the wire-OR property is useful in combining several interconnect signals over a single wire. Also due to the bi-directional iPort property, the signals can both source and sink their talking current while outputting zero current when offline. It works for both analog signal transmission and digital transmission, not to mention a charge packet transfer, which is useful in neuromorphic circuits. At high data throughput, this eliminates the dominant power dissipation component of charging the transmission/interconnect wires, which is a tradeoff for continuous current operation. For lower data rates, current can be scaled down, or for DC, charge packets can be the transmitted and the result latched at the receiver.

The next example in FIG. 7*b* is an optical receiver 910, which provides higher noise immunity and higher speed system. A pair of photodiodes PD1 and PD_REF are used with one active and the other as a replica bias or for providing an additional differential signal from a different light input. This optical receiver 910 operates in the differential mode with optional second or more gain stages (similar to the one shown in FIG. 4*e*(1)). The circuit 910 includes the first, second and third pairs of CiFET, Q70*j* and Q72*j*, Q74*j* and Q75*j*, and CiFET Q71*j*1 and Q73*j*1 for converting the differential input currents between the input current on iPort 70*j* (which receives anode of the reference photodiode PD_REF) and the input current on iPort 72*j* (which receives cathode of the photodiode PD1), while iPort of the PiFET Q73*j*1 receives cathode of the reference photodiode PD_REF; and iPort of the NiFET Q71*j*1 receives anode of the photodiode PD1. Output 79*j* from the first pair Q70*j* and Q72*j* may optionally be amplified via a pair of CiFET Q71*j*3 and Q73*j*3 as the output 79'*j*. The output of the third pair of CiFET Q71*j*1 and Q73*j*1 may optionally be amplified by further additional pair of CiFET Q71*j*2 and Q73*j*2 as positive output 77'*j*. Currents can be wire-OR summed into the various iPorts to modify operation if desired.

FIG. 7*c* shows a schematic diagram of a dual differential antenna preamplifier 920 as an example application of a few of the possible enhancements to the replica differential trans-impedance amplifier of FIG. 4*e* which use all four iPort inputs 70*c*, 71*c*, 72*c*, and 73*c* and includes a replica-differential second gain stage for voltage amplification similar to FIG. 6*a*, but replica-differentially implemented. Both the NiPorts 70*c*, 71*c* and PiPorts 72*c*, 73*c* of FIG. 4*e* are used to connect two separate differential antennas AT0 and AT90. Since the antenna inputs are summed in real time, it may be useful for beam signal reception that better covers all four quadrants of an omnidirectional antenna pattern. This preamplifier 920 also has differential second stages which have additional filter and gain control access into their iPorts pFb−, pFb+, nFb−, and nFb+. These second stages operate about the common self-bias voltage Bias. The first differential stage can also receive iPort control currents for additional options.

These circuits represent continuous time domain applications for the CiFET as opposed to the sampled data domain CiAmp previously illustrated. This helps to break down any perception that sampled data applications are all that the CiFET can do. Correlated double sampled data systems get rid of 1/f noise and circuit parametric deviations which is extremely important and probably will be necessary in nanoscale analog systems where a single out of place trapped charge or defect causes a local parametric deviation. Excessive single transistor parametric deviations have been reported in the article, Kuhn, Kelin J., "Reducing Variation in Advanced Logic Technologies—Approaches to Process and Design for Manufacturability of Nanoscale CMOS", IEEE IEDM Meeting 2007, which must be tolerated in order to provide useful yields with any reliability. In order for newer receivers to operate with a 1V power supply, switching receivers are the new generation of RF circuits.

FIG. 7d is a plot representing the varying acquisition time versus supply voltage for the 3-stage feed-forward CiAmp circuit that is added to a trans-impedance amplifier input stage illustrated in 820 FIG. 6c. Note that with a 1V power supply, the voltage gain stage adds about 1ns to acquire a 1V step in voltage and 20 ns to settle to 1 ppm accuracy.

FIG. 7e breaks out the 50Ω CiTIA total output noise from FIG. 4g into individual iFET channel contributors. The CiFET circuit level is 710 FIG. 4e(1). For cross-reference, the fine-dash trace 7e1 at the top is the same total-output-referred-noise illustrated as 4g2 in FIG. 4g and the fine-dot-dot-dash trace 7e6 at the bottom is the same total-input-referred-noise 4g1. The four bold annotated traces 7e2, 7e3, 7e4, 7e5 are the replica-differential positive input side of the CiTIA and the identical fine solid traces contained within the annotations are the negative input side of the CiTIA (identical uncorrelated noise contributors, but gain is doubled through the replica-differential configuration). The vertical scale is dB (V/√Hz) from −200 dB to −40 dB. The highest noise contributor 7e2 is the NiFET drain channels, green-dot-dash, followed by the 7e3 PiFET drain channels, blue-dotted. The only other significant contributors are the CiFET source channels 7e4 and 7e5. The p-channels 7e3 and 7e5 tend to be a little lower noise. The reference CiFET and any noise sources other than these 1/f noise components did not even score on this scale. This reveals that signal-to-noise optimization should focus on the CiFET drain channels.

Note that the CiFET super-saturated channels push the CiTIA top cutoff frequency range out to 1.5 THz where the total-output-referred-noise crosses the total-input-referred-noise as a result of unity-gain. Amazingly, so far and to a first-order approximation, this bandwidth appears to be largely process independent because it is a property of the diffusion-current speed in the super-saturated channels.

FIG. 7f shows power consumption of a CiTIA, ratioed for 50Ω input resistance, over various power supply voltages for an example 180 nm CMOS process. Nanoscale processes will be lower, primarily as a function of the small CMOS threshold voltage reduction with IC process shrink.

FIG. 7g shows a schematic diagram of an isolator circuit 930, which enables both transmit and receive at the same time on the same frequency while providing in excess of 140 dB of isolation, in accordance with the present invention.

The circuit 930 includes a CiTIA amplifier or differential trans-impedance amplifier (or dTIA) A93 (one shown in FIG. 4e(1)). RF signals Xmit are amplified by a power amplifier A90 and AC coupled by the DC isolation capacitor C90 through a transmission line, represented as R90a, to an antenna AT90 for sending information out. This antenna signal is also coupled into dTIA A93 inverting PiPort input −Pi. At the same time capacitor C90 couples this transmit signal to a replica path into the replica +Pi iPort input of the trans-impedance amplifier. Both of the PiPort trans-impedance amplifier inputs are set to terminate at the transmission line characteristic impedance, thus matching the transmission line equivalent resistance, which can be electrically trimmed to fine-tune the termination for optimum transmit signal rejection out of the concurrently received RF signal at the trans-impedance amplifier A90 differential inputs resulting in NO Xmit signal output +Rcv, −Rcv.

For the receive signal path, the received RF energy from the antenna AT90 drives only one of the dTIA A93 differential PiPorts −Pi. Thus, the power out signal pushes both PiPorts together to take advantage of the dTIA common-mode rejection, while the received antenna RF pushes only one of the PiPorts to differentially amplify and isolate the receive from transmit signals capitalizing on the linear wide dynamic range of this differential trans-impedance amplifier invention. In addition, the received gain can be electrically varied by AGC which ties the three NiPort inputs together as illustrated for the AGC connection 77e of FIG. 4j.

1) Transmit: The power amplifier A90 outputs its RF signal at low impedance with respect to Gnd ground. This signal is transmitted to both −Pi and +Pi differential inputs of the dTIA A93 as a signal exercising the dTIA's common mode rejection resulting in no received signal at +Rcv to −Rcv differential output of the dTIA A93. Balancing these differential signal paths from the transmit power amplifier A90 to the dTIA A93 with the antenna AT90 attached to one of them is achieved through the values of R90a and R90b selected around the fixed antenna characteristic impedance. This sets the balanced resistive input network impedance being presented to the dTIA A93. This input resistance of the dTIA A93 is adjusted to precisely terminate this incoming characteristic resistance in order to absorb all of the energy being presented to the dTIA A93 and not reflect any power back. Instead of losing energy in conventional amplifier input termination resistors, this energy is terminated by the iPort super-saturated channel resistance where it is used to amplify the incoming RF signal. The value of R90b into input impedance $R_{in}$ of dTIA A93 +Pi iPort is selected to match the Tee of R90a, the antenna AT90, and the input resistance of dTIA A93. Resistors R90a, R90b, and the input resistance of the dTIA A93 which is flat from DC to greater than the frequencies of interest as shown in FIG. 4f for the 50Ω example and 4r for the 75Ω example. The gain of the dTIA A93 is also flat as shown in FIG. 4k.

2) Receive: A small RF signal, perhaps, for example, 100 million times smaller than the transmit signal, is received by the antenna and injected into the −Pi input of the dTIA A93 just prior to the resistor R90a. This single ended antenna AT90 is referenced to Gnd, just like the power amplifier A90. At this point, the network looks purely resistive—R90a, $R_{in}$ of the dTIA A93 and the antenna AT90 characteristic resistance. This small RF signal enters the dTIA A93 on the input −Pi, but it cannot get back around to the other differential input port +Pi of the dTIA A93, because it is trapped by the low impedance to Gnd of the power amplifier A90 which cannot move to the received RF signal power due to the low active output resistance of the power amplifier A90. Thus, input signal from the antenna AT90 is amplified with a single ended input of the dTIA A93 to the −Rcv output.

3) The input resistance dTIA A93 is physically set through the iFET ratio and the dTIA A93 has the ability to electrically trim through $R_{adj}$ to trim its input resistance, as shown in FIG. 4e(1), which is done by adding a small signal into its CTAT input 75c. Alternately, the input resistance $R_{in}$ can be adjusted by paralleling a small portion of the PiFETs and controlling their bias or current inputs (not shown). Furthermore, automatic gain control AGC is optionally available as presented as 77e in FIG. 4j around which the AGC operation is described.

FIG. 7h shows a schematic diagram of an isolator circuit 940, which separates antenna, transmit RF output, and receive RF input multiple (or three) signals at the same time on the same frequency while providing in excess of 140 dB of isolation, in accordance with the present invention.

The circuit 940 includes three (3) identical CiTIA amplifiers or differential trans-impedance amplifiers (or dTIA) A94a, A94b and A94c (one shown in FIG. 4e(1)). Input resistance adjustment terminal 940Radj is coupled to complementary-to-absolute temperature (or CTAT) reference voltage terminals A94a2, A94b2 and A94c2; automatic gain control terminal 940AGC is coupled to proportional-to-absolute-temperature (or PTAT) reference voltage terminals A94a5, A94b5 and A94c5, non-inverted iPort A94a4, A94b4 and A94c4 (NiPort+), and inverted iPort A94a6, A94b6 and A94c6; and zero voltage reference (or analog ground reference) terminals A94a7, A94b7 and A94c7 are further coupled together to form analog ground terminal 940Agnd.

Non-inverted voltage output (Vo+) A94a7 of the first dTIA A94a is coupled to non-inverting and inverting iPorts (Pi+ and Pi−) A94b1 and A94b3 of the second dTIA A94b, respectively, through a capacitor C94b and resistors R94c and R94d; non-inverted voltage output (Vo+) A94b7 of the second dTIA A94b is coupled to non-inverting and inverting iPorts (Pi+ and Pi−) A94c1 and A94c3 of the third dTIA A94c, respectively, through a capacitor C94c and resistors R94e and R94f; then non-inverted voltage output (Vo+) A94c7 of the t dTIA A94c is coupled to non-inverting and inverting iPorts (Pi+ and Pi−) A94a1 and A94a3 of the first dTIA A94a, respectively, through a capacitor C94a and resistors R94a and R94b.

Three RF signals input/output, for example, may be coupled to Input/Output (or IO) terminals 940io1, 940io2 and 940io3, which are also coupled to dTIAs A94a, A94b and A94c, respectively, directly at inverting PiPort input −Pi A94a1, A94b1 and A94c1, respectively, and effectively, the circuit 940 provides a circulator that would handle simultaneous RF signal input and output. As it can be seen, the present invention provides simplified structure with extreme amount of isolation in excess of 140 dB over a wide dynamic range due to the fact that input would be rejected with common mode around the circulator loop of the circuit 940 while the i/0 signals are single ended as shown in the figure.

FIG. 7i shows a schematic diagram of a simple current mirror circuit 70i of prior art. By 1965, a new analog cell, the CCCS "current mirror" 70i possessed a structure not seen prior om vacuum tube design and readily solved problem around need for biasing analog circuits on-chip beyond the traditional methods used in voltage mode design, and it was not feasible for analog ICs to have low-accuracy, bulky IC resistive divider or a multitude of input/output (I/O) pads connecting off-chip biasing to the on-chip circuit.

FIG. 7j shows a schematic diagram of a current inverter using NiFET P71 of the present invention. More specifically though, NiFET P71 is a current-inverter which is the dual concept of a normal voltage-inverting circuit. When a change in current i70 at the iPort terminal P71b is noted, a precise inverse of that current change is imposed on the drain channel current i71 at the drain terminal P71a in NiFET P71. This is a consequence of source channel current being held constant by a fixed gate voltage 71bias. Current i70 enters the source channel from the iPort P71b diffusion. The current i70 entering the iPort diffusion P71b is the sum of the drain channel current i71 and the iPort current i70. When the iPort current is zero, all the source channel current i71 comes from the drain channel. When there is an iPort current, it displaces the exact amount of drain current i71 because the source channel current is held constant by the fixed gate bias voltage 71bias. This gate bias voltage 71bias is the "sweet-spot" bias voltage that may be generated by a separate CiFET (not shown) which has its gate connected to its drain for generating an analog virtual ground for analog voltages to swing about. Note that the iPort current can be either positive or negative as well as zero and due to its exponential transfer function, it is somewhat reminiscent of a base current of a bipolar transistor, except that this current can be positive, negative or even zero. However, the CiFET output is a low impedance voltage instead of a high impedance current. In a bipolar transistor (BJT) an increase in base current generates an increase on collector current. In the CiFET an increase in iPort current creates an increase in output voltage because the iPort drain current is decreased leaving the complementary iFET to pull the output voltage up.

Since the iPort input signal is a current, several analog current input signals precisely sum when connected to the same iPort, creating a high precision analog adder, and when the output is taken as a current, this creates an analog NOR gate Q70n as shown in the lower half of FIG. 7k. Multiple current inputs IA, IB, IC, and ID are summed into the iPort Q70nb and this sum appears as a negative current change at the NiFET drain Q70nc, forming an analog NOR function. Currents can also be removed from this iPort Q70nb forming a difference, which is an algebraic sum including a sign for the direction of the input currents.

For the opposite diffusion type of iFET, or PiFET Q70p, the current inputs IE, IF, IG, and IH sum to form an analog AND function which appears at the PiFET output Q70p as an analog NAND function. Here these input currents considered positive when they are pulled out of the iPort.

If an inverter plus either an OR/AND gate is available, a complete logic family can be constructed from these basic logical elements. For instance, latches can be constructed by cross-coupling a couple of inverters or NOR/NAND gates. If discrete levels of current are chosen, a digital logic family is defined, but if the analog levels are used, neuromorphic circuits build neuromorphic chips. For neuromorphic decision thresholds into a latch, fixed currents in any of the summation iPorts serve as electronically defined thresholds perhaps called as neuron synapse trigger points. In summary, these CiFET TIA circuits naturally map into neurological circuits: charge movement is the primary variable and voltages are incidental variables.

These CiFET circuits operate down to extreme low supply voltages as seen in FIGS. 4n and 4p where the power is trivial as indicated in FIG. 7f. The functionality and data retention is maintained down to millivolt supply levels, and when high speed is required hundreds of GHz operation is available as these trans-impedance circuits communicate with current between them eliminating the need to charge and discharge interconnect capacitance. Any voltage changes can be kept within the logic elements where capacitive loads are minimal. Logic element speed is high within these iFET logic elements because the source channel operates in super-saturation where charge is merely bumped along instead of being transported through the channel avoiding velocity saturation as discussed with the super-saturated channel operation for FIG. 2b. This type of charge-movement or current-based logic concept originated in bipolars as current-mode logic (CML) where the inputs and outputs are in voltage, but the computation takes place with fast current signal swings in a staged differential BJT circuit. Bipolar CML interconnect signal transverse significant voltage verses CiFET CML having little voltage change. Either can be differential for speed and noise immunity or single ended for simple logic interconnect. The tradeoff with bipolar CML is that the power dissipation is great and it is only used when extremely fast digital logic is desired with little regard to a battery, and this CML requires a bipolar IC process. Here though, in the CiFET, power dissipation is minimal as the current changes involved can be in the pico- to nano-Amp range depending on the sizing of CiFET. On the other hand, the results are similar, as there is a way to build logic gates out of CiFET based on current, resulting in ultra-fast logic which has essentially no voltage change at both the input and output logic interconnect wires, and the inputs are referenced at the iPort termination resistance instead of the logic voltage transmitter providing very high noise immunity. This makes the logic parasitic insensitive and noise immune yielding very low power and extremely high frequency operation. There are also methods of throttling the speed/power relationship, or turning the circuits off and back on again at logic speed.

When a current is injected into iPort P71b, NiFET P71 substitutes for its portion of the existing source channel current. This is because this total source channel current is controlled by its voltage between the gate P71d and source P71c, which has not been caused to change by the iPort current injection i70. Thus the origin of source channel current is steered around the drain channel through the iPort P71b.

This results in an exact subtraction of iPort current from the output drain current as there is no other current path. This introduces an entirely new MOS device: the ultra-fast precision "current inverter." It is built out of digital parts and is process independent. More iPort current, yields less drain current, which is the output current. A current mirror operates the other way and is fragile. Also, the current can go in either direction passing through zero, truly bidirectional as compared to the base current of a bipolar.

The source channel is exceptionally low resistance because it has a high overdrive on the gate P71d while the voltage gradient along this source channel is clamped to near zero by the self-cascode structure of the iFET. This is similar to operating this channel in weak inversion, thus the channel current is driven by carrier diffusion (exponential), and not a voltage gradient (square-law) along this source channel. We have named this channel condition "super-saturation." In contrast, weak inversion has few carriers which pass along the surface where they pick up noise from surface carrier traps. Because this source channel has an abundance of carriers and these carriers do not have to transit the channel length, the source channel operates faster than any other MOS channel known. The carriers only have to push on adjacent carriers (diffusion). A mental picture is that when a rock is thrown in the water, sound travels much faster than the wave produced.

FIG. 7k shows four (4) input NOR logic gate and four input NAND logic gate using CiFET of the present invention. Within logic gates $r_m$ (current-to-voltage) receives logic information and $g_m$ (voltage-to-current) provides gate outputs, enabling parasitic tolerant logic for simple timing closure. The circuit 70k provides as computation, that is connected by fast-switching small bi-directional iPort currents, while the external CMOS inputs and outputs are converted from/to voltage signals for further computation as desired. Moreover, the complement iPorts can be utilized alone or in conjunction with each other; thus either adding together, or subtracting, or negating each other dependent on the polarity and magnitude of the iPort currents.

Referring to FIG. 7k, CiFET Q70k provides both NOR and NAND circuits, that are key neuromorphic circuit elements in the CiFET family of logic circuits; where NiFET Q70n as NOR circuit (or a summing current inverter); and PiFET Q70p as NAND circuit (or subtracting current inverter). For example, four different input currents IA, IB, IC and ID are fed through to iPort Q70nb of NiFET Q70n. iFET bias voltage is applied to the gate Q70nd and the resulting current (or differences of IA, IB, IC and ID) would be resulted on the drain terminal Q70nc. Similarly, Q70p provides NAND logic by summing currents IE, IF, IG and IH received at iPort Q70pb of PiFET Q70p, which receives bias voltage on gate terminal Q70pd. Its drain terminal Q70pc provides resulting current therefrom.

These CiFET based charge-model logic circuits can operate far below supply voltages of 1V, are extremely low-power, fast, compact, and able to be fabricated in the newest deep sub-μm, nanometer, or FinFET logic IC processes.

FIG. 7m shows a schematic diagram of CiFET 70n with current bypass control in accordance with the present invention, including NiFET N75 and PiFET P75 with additional transistor U75, which bypasses current around the CiFET 70n drain output. Each of NiFET N75 and PiFET P75 has gate terminal N75d/P75d, source terminal N75a/P75a, drain terminal N75c/P75c, and iPort or diffusion terminal N75b/P75b. The drain terminals N75c and P75c are connected together to form output out70n of CiFET 70n. Input in70n is received by the gate terminal N75d of NiFET N75 and the gate terminal P75d of PiFET P75. This additional transistor U75 (MOSFET, for example) can be either N- or P-channel where its gate control voltage ctr70n performs the inverted function of the other, thus in effect, current can be removed from one port of iPorts N75b and P75b, and injected into the other port, and therefore, bypassing drain channel current. One advantage of this delay control is that all the timing nodes maintain constant amplitude and in the injection-locked voltage controlled oscillator, for example, the noise critical threshold would remain at the zero cross-over where the slope is at its maximum.

FIG. 7n shows a schematic diagram of current starved variable delay circuit 70p of a prior art. In this circuit 70p, there are four (4) delay stages, including a first delay stage U76a1, U76a2, and U76a3, second U76b1, U76b2, and U76b3, third U76c1, U76c2, and U76c3 and fourth U76d1, U76d2, and U76d3. Delay is controlled through the control signal ctr70p, which is received by gate terminals of U76a1, U76b1, U76c1, and U76d1, in order to starve available inverter output capacitor charging current, thus controlling delay.

FIG. 7p shows a schematic diagram of current bypass variable delay line 70q using CiFET in accordance with the present invention, including four (4) delay stages, each stages comprises CiFET with current bypass control similar to the one shown in FIG. 7m, P80 and N80 with a transistor Q77a for current bypass control, P81 and N81 with a transistor Q77b for current bypass control, P82 and N82 with a transistor Q77c for current bypass control, and P83 and N83 with a transistor Q77d for current bypass control. For each pair, gate terminals N80d and P80d, N81d and P81d, N82d and P82d, and N83d and P83d are connected together to form an input, and drain terminals N80c and P80c, N81ec and P81c, N82c and P82c, and N83c and P83c are connected together to form an output; and the output of a prior pair is received by an input of a subsequent pair. The source channels N80a, N81a, N82a, and N83a of NiFETs N80, N81, N82, and N83 respectively, receives negative power supply Vss; the source channels P80a, P81a, P82a, and P83a of PiFETs P80, P81, P82, and P83 respectively, receives negative power supply Vdd, the input of the first pair forms as input in70q, and the output of the last pair forms output out70q. The input to each pair is capacitively coupled to positive Vdd and negative power supply Vss via capacitors C80a and C80b, C81a and C81b, C82a and C82b, and C80a and C80b. The transistors Q77a, Q77b, Q77c and Q77d are activated by a control signal ctr70q to control connection between iPorts P80b and N80b, P81b and N81b, P82b and N82b, and P83b and N83b, respectively. Number of delay stages can be adjusted depending on delay requirements or application therefor by simply adding/subtracting a required number of delay stage.

FIG. 8a(1) shows a schematic diagram of a latching current comparator 900 in accordance with the present invention. The comparator 900 comprises a CiTIA 710m and comparator COMP. The CiTIA 710m is the exactly the same as the one 710 shown in FIG. 4e(1), receives current inputs 70m, 71m, 72m and 73m. The comparator COMP includes two CiFET 300a and 300b, each of which are the same as CiFET 300 shown in FIGS. 3a, 3g, etc. A first set of switches SS90a, SS90b, and SS90c close to pass through during "SETUP" phase of a control signal, and a second set of switches ES90a and ES90b, which close to pass through during "ENABLE" phase of the control signal. The comparator COMP includes a first capacitor COS90a, and a second capacitor COS90b, each having a first terminal and second terminal. The second terminal of the first capacitor, COS90a, is connected to the input of the first CiFET 300a. The output of the first CiFET 300a is capacitively coupled to the input of the second CiFET 300b. An output from the second CiFET 300b forms output 900out of the circuit 900. This capacitor COS90b stores the difference between the two CiFET 300a and 300b self-bias voltages while capacitor COS90a stores the difference between the self-bias voltage of CiFET 300a and the positive reference voltage 79m of the differential TIA 710m for comparison during the setup phase of operation.

During the "SETUP" phase of the control signal, the first and second switches SS90a, SS90b, and SS90c and ES90a and ES90b causes to couple the positive voltage output 79m of the CTIA 710m with the first terminal of the first capacitor COS90a, causes the first CiFET 300a to be self-biased by connecting its output to its input, and further causes the second CiFET 300b to be self-biased by connecting its output to its input, while the second capacitor COS90b stores any slight offset voltage difference between these two self-bias voltages.

At the beginning of the "ENABLE" phase of the control signal, the first and second switches SS90a, SS90b, and SS90c and ES90a causes the difference between the positive voltage 79m and the negative voltage 78m to be instantly coupled to the first and second terminals of the first capacitor COS90a, and through to the input of the first latch CiFET 300a input. After a brief logic buffer propagation delay, the output switch ES90b of the second CiFET 300b is closed through to the input of the first CiFET 300a forming a rapid AC positive feedback latching loop. This brief logic buffer delay allows the CiFETs 300a and 300b to start in their proper polarity direction as imposed by the difference of the TIA outputs 79m and 78m. Ideally, once the output of CiFET 300b begins to move, the positive feedback loop is closed driving the comparator latch all the way to its logical state rapidly to be passed onto the system which this comparator is embedded in.

For even greater comparator decision speed, the latching current comparator 900 may optionally have a feedforward capacitors CFF90p and CFF90n, which capacitively couple the input of the first CiFET 300a to iPorts of the second CiFET 300b.

Since the CiTIA has quad inputs, multiple combinations and directions of current can be compared as desired. Any one and all of the logical combinations suggested in FIG. 7k are valid along with the replica differential inverted inputs. The number of wire-OR/AND inputs is nearly unlimited, opening the door to data buss operation. Unlike voltage input comparator, unused inputs are just left open circuited. Using current inputs offers a high degree of noise immunity since all the current inputs are referenced at their iPort termination and not at the current source voltage offering excellent immunity to power supply noise between the signal source and the current comparator. Also since the current signals do not have a significant change in voltage, wire parasitic capacitance does not load down the circuit or consume additional power at high speed. This charge mode logic (CML) of FIGS. 7j and 7k along with this latch makes a basis for a logic family that either operates on discrete levels or a neuromorphic circuit family where continuous analog levels are employed. Recall from FIG. 4p that these charge mode TIA circuits operate very well at low voltages down to millivolt power supply levels, where its noise immunity is still preserved and power FIG. 4f is on the order of a pico-watt per gate. Power supply voltage can be used to actively (while operating) throttle the speed to power operating point to effectively shut down portions of logic while holding its operating state.

DEFINITIONS OF TERMS iFET: A 4 terminal (plus body) device similar to a Field Effect Transistor but with an additional control connection that causes the device to respond to current input stimulus.

source channel: A semiconductor region between iPort diffusion and the Source diffusion. Conduction in this region is enabled by an appropriate voltage on the Gate.

drain channel: A semiconductor region between Drain diffusion and the iPort diffusion. Conduction in this region is enabled by an appropriate voltage on the Gate.

CiFET: A single stage, complementary iFET compound device shown in FIG. 3a.

super-saturation: an exponential conduction condition similar to weak inversion, but with high Gate overdrive and forced low voltage along the conduction channel. FIG. 2b #23b.

feed-forward: A technique to present a signal on an output, early on, in anticipation of the ultimate value.

self-biased: Unlike fixed-bias circuits, self-biased circuits adjust to local conditions to establish an optimum operating point.

dual: (of a theorem, expression, etc.) related to another by the interchange of pairs of variables, such as current and voltage as in "Trans-Conductance" to "Trans-Resistance."

trans-resistance: infrequently referred to as mutual resistance, is the dual of Trans-conductance. The term is a contraction of transfer resistance. It refers to the ratio between a change of the voltage at two output points and a related change of current through two input points, and is notated as $r_m$:

$$g_m = \frac{\Delta I_{out}}{\Delta V_{in}}$$

$$r_m = \frac{\Delta V_{out}}{\Delta I_{in}}$$

The SI unit for Trans-resistance is simply the ohm, as in resistance.

For small signal alternating current, the definition is simpler:

$$g_m = \frac{i_{out}}{v_{in}}$$

$$r_m = \frac{v_{out}}{i_{in}}$$

trans-impedance: similar to trans-resistance, but further includes complex variables for high frequency applications.

trans-conductance is a property of certain electronic components. Conductance is the reciprocal of resistance; Trans-conductance is the ratio of the current variation at the output to the voltage variation at the input. It is written as $g_m$. For direct current, Trans-conductance is defined as follows:

$$g_m = \frac{\Delta I_{out}}{\Delta V_{in}}$$

$$r_m = \frac{\Delta V_{out}}{\Delta I_{in}}$$

For small signal alternating current, the definition is simpler:

$$g_m = \frac{i_{out}}{v_{in}}$$

$$r_m = \frac{v_{out}}{i_{in}}$$

Trans-conductance is a contraction of transfer conductance. The old unit of conductance, the mho (ohm spelled backwards), was replaced by the SI unit, the Siemens, with the symbol S (1 siemens=1 ampere per volt).

translinear circuit: translinear circuit is a circuit that carries out its function using the translinear principle. These are current-mode circuits that can be made using transistors that obey an exponential current-voltage characteristic—this includes BJTs and CMOS transistors in weak inversion.

subthreshold conduction or subthreshold leakage or sub-threshold drain current is the current between the source and drain of a MOSFET when the transistor is in subthreshold region, or weak-inversion region, that is, for gate-to-source voltages below the threshold voltage. The terminology for various degrees of inversion is described in Tsividis. (Yannis Tsividis (1999). *Operation and Modeling of the MOS Transistor* (Second Edition ed.). New York: McGraw-Hill. p. 99. ISBN 0-07-065523-5.)

Subthreshold slope: In the subthreshold region the drain current behavior—though being controlled by the gate terminal—is similar to the exponentially increasing current of a forward biased diode. Therefore a plot of logarithmic drain current versus gate voltage with drain, source, and bulk voltages fixed will exhibit approximately log linear behavior in this MOSFET operating regime. Its slope is the subthreshold slope.

Diffusion current: Diffusion current is a current in a semiconductor caused by the diffusion of charge carriers (holes and/or electrons). Diffusion current can be in the same or opposite direction of a drift current, that is formed due to the electric field in the semiconductor. At equilibrium in a p-n junction, the forward diffusion current in the depletion region is balanced with a reverse drift current, so that the net current is zero. The diffusion current and drift current together are described by the drift-diffusion equation.

Drain-induced barrier lowering: Drain-induced barrier lowering or DIBL is a short-channel effect in MOSFETs referring originally to a reduction of threshold voltage of the transistor at higher drain voltages.

As channel length decreases, the barrier $\varphi_B$ to be surmounted by an electron from the source on its way to the drain reduces.

As channel length is reduced, the effects of DIBL in the subthreshold region (weak inversion) show up initially as a simple translation of the subthreshold current vs. gate bias curve with change in drain-voltage, which can be modeled as a simple change in threshold voltage with drain bias. However, at shorter lengths the slope of the current vs. gate bias curve is reduced, that is, it requires a larger change in gate bias to effect the same change in drain current. At extremely short lengths, the gate entirely fails to turn the device off. These effects cannot be modeled as a threshold adjustment.

DIBL also affects the current vs. drain bias curve in the active mode, causing the current to increase with drain bias, lowering the MOSFET output resistance. This increase is additional to the normal channel length modulation effect on output resistance, and cannot always be modeled as a threshold adjustment.

What is claimed is:

1. A trans-impedance amplifier, comprising:
   a. a first complementary pair of a first n-type current field-effect transistor (NiFET) and a first p-type current field-effect transistor (PiFET);
   b. a second complementary pair of a second NiFET and a second PiFET;
   wherein each of said NiFETs and PiFETs comprises:
      a source terminal, a drain terminal, a gate terminal, and a diffusion terminal of a corresponding conductivity type of said each of said PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source channel and said drain channel;
   wherein said gate terminal of said PiFET and said gate terminal of said NiFET are connected together to form a common gate terminal for said each complimentary pair, said source terminal of said NiFET of said each pair is connected to negative power supply and said source terminal of said PiFET of said each pair is connected to positive power supply, and drain terminals of said NiFET and said PiFET are connected together to form an output; and
   wherein said common gate of said first complimentary pair and said common gate of said second complementary pair are connected with said output of said second complementary pair to for generating a bias voltage output;

at least one or both of said diffusion terminal of said first NiFET and said diffusion terminal of said first PiFET receives input current; and said output of said first complementary pair forms a voltage output of said trans-impedance amplifier.

2. The trans-impedance amplifier as recited in claim 1, wherein ratio between width over length of said source channel and width over length of said drain channel of said first and second NiFETs and said first and second PiFETs is adjusted to obtain a suitable input resistance.

3. The trans-impedance amplifier as recited in claim 1, wherein ratio between width over length of said source channel and width over length of said drain channel of said first and second NiFETs and said first and second PiFETs is adjusted to obtain a suitable trans-resistance.

4. The trans-impedance amplifier as recited in claim 1, wherein ratio between width over length of said source channel and width over length of said drain channel of said first and second NiFETs and said first and second PiFETs is adjusted to obtain a suitable gain.

5. The trans-impedance amplifier as recited in claim 1 further comprises an output amplifier for amplifying said voltage output of said trans-impedance amplifier.

6. The trans-impedance amplifier as recited in claim 5, wherein said output amplifier comprises a third complementary pair of a third NiFET and a third PiFET, wherein each of said third NiFET and said third PiFET comprises:
   a diffusion terminal of a corresponding conductivity type of said each of said third PiFET and said third NiFET, defining a source channel between a source terminal and said diffusion terminal, and a drain channel between a drain terminal and said diffusion terminal, said diffusion terminal causes changes in said diffused charge density throughout said source and drain channels, and a gate terminal capacitively coupled to said source channel and said drain channel;
   wherein said gate terminal of said third PiFET and said gate terminal of said third NiFET are connected together to form a common gate terminal, said source terminal of said third NiFET is connected to said negative power supply and said source terminal of said third PiFET is connected to said positive power supply, and drain terminals of said third NiFET and said third PiFET are connected together to form an output; and
   wherein said common gate of said third complimentary pair receives said output of said first complimentary pair.

7. The trans-impedance amplifier as recited in claim 5, wherein said output amplifier comprises a plurality of complementary pairs of a third NiFET and a third PiFET, wherein
   each of said third NiFET and said third PiFET comprises:
   a source terminal, a drain terminal, a gate terminal, and a diffusion terminal of a corresponding conductivity type of said each of said third PiFET and said third NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source channel and said drain channel;
   wherein said gate terminal of said third PiFET and said gate terminal of said third NiFET are connected together to form a common gate terminal, said source terminal of said third NiFET is connected to said negative power supply and said source terminal of said third PiFET is connected to said positive power supply, and drain terminals of said third NiFET and said third PiFET are connected together to form an output of each of said plurality of complementary pairs;
   wherein said common gate of a subsequent one of said plurality of complementary pairs receives said output of a prior one of said plurality of complementary pairs; and
   wherein said common gate of said first one of said plurality of complementary pairs of said third NiFET and said third PiFET receives said output of said first complimentary pair.

8. The trans-impedance amplifier as recited in claim 7, wherein said output of said second one of said plurality of complementary pairs of said third NiFET and said third PiFET is further capacitively coupled to said diffusion terminal of said third NiFET of said first one of said plurality of complementary pairs and to said diffusion terminal of said third PiFET of said first one of said plurality of complementary pairs.

9. The trans-impedance amplifier as recited in claim 8, wherein said output amplifier further comprises a feedforward amplifier receiving said output of said first complementary pair and coupling an output of said feedforward amplifier with said output of said last one of said plurality of complementary pairs.

10. The trans-impedance amplifier as recited in claim 9, wherein said feedforward amplifier is a fourth complementary pair of a fourth NiFET and a fourth PiFET,
    each of said fourth NiFET and said fourth PiFET comprises:
    a diffusion terminal of a corresponding conductivity type of said each of said fourth PiFET and said fourth NiFET, defining a source channel between a source terminal and said diffusion terminal, and a drain channel between a drain terminal and said diffusion terminal, said diffusion terminal causes changes in said diffused charge density throughout said source and drain channels, and a gate terminal capacitively coupled to said source channel and said drain channel;
    wherein said gate terminal of said fourth PiFET and said gate terminal of said fourth NiFET are connected together to form a common gate terminal, said source terminal of said fourth NiFET is connected to negative power supply and said source terminal of said fourth PiFET is connected to positive power supply, and drain terminals of said fourth NiFET and fourth third PiFET are connected together to form said output of said feedforward amplifier;
    wherein said common gate of said fourth complementary pair receives said output of said last one of said plurality of complimentary pairs.

11. A differential amplifier for amplifying difference between a first input and a second input, each of said first and second inputs having negative and positive polarity inputs, comprising:
    a. a first complementary pair of a first n-type current field-effect transistor (NiFET) and a first p-type current field-effect transistor (PiFET);
    b. a second complementary pair of a second NiFET and a second PiFET; and c. a third complementary pair of a third NiFET and a third PiFET;

wherein each of said NiFETs and PiFETs comprises:
a source terminal, a drain terminal, a gate terminal, and a diffusion terminal of said corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source channel and said drain channel;

wherein said gate terminal of said PiFET and said gate terminal of said NiFET are connected together to form a common gate terminal for said each complimentary pair, said source terminal of said NiFET of said each complimentary pair is connected to negative power supply and said source terminal of said PiFET of said each pair is connected to positive power supply, and drain terminals of said NiFET and said PiFET of said each complimentary pair are connected together to form an output; and wherein said common gate of said first complimentary pair, said common gate of said second complementary pair and said common gate of said third complementary pair are connected with said output of said second complementary pair for generating a bias voltage output;

said diffusion terminal of said third PiFET receives said negative polarity input of said first input;

said diffusion terminal of said first PiFET receives said positive polarity input of said first input;

said diffusion terminal of said third NiFET receives said negative polarity input of said second input;

said diffusion terminal of said first NiFET receives said positive polarity input of said second input; and said output of said first complementary pair forms output of said differential amplifier.

12. An optical signal receiver, comprising:
a. a photodiode comprising a cathode and anode;
b. a reference for said photodiode, comprising cathode and anode;
c. a differential current amplifier, comprising a first, second and third complementary pairs of a n-type current field-effect transistor (NiFET) and a p-type current field-effect transistor (PiFET);

wherein each of said NiFETs and PiFETs comprises:
a source terminal, a drain terminal, a gate terminal, and a diffusion terminal of a corresponding conductivity type of said each of said PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source channel and said drain channel;

said gate terminal of said PiFET and said gate terminal of said NiFET are connected together to form a common gate terminal, said source terminal of said NiFET is connected to negative power supply and said source terminal of said PiFET is connected to positive power supply, and drain terminals of said NiFET and said PiFET are connected together to form an output;

said common gate of said first complimentary pair and said common gate of said second complementary pair are connected with said output of said second complementary pair, and received by said common gate terminal of said third complementary pair;

said diffusion terminal of said PiFET of said first complementary pair receives said cathode of said photodiode;

said diffusion terminal of said PiFET of said third complementary pair receives said cathode of said reference;

said diffusion terminal of said NiFET of said first complementary pair receives said anode of said reference;

said diffusion terminal of said NiFET of said third complementary pair receives said anode of said photodiode; and said output of said first complementary pair forms a voltage output to an output stage, and said output of said third complementary pair provides a bias voltage to an input of the output stage.

13. A wireless signal transceiver, comprising:
a. a wireless antenna;
b. a differential current amplifier, comprising a first, second and third complementary pairs of a n-type current field-effect transistor (NiFET) and a p-type current field-effect transistor (PiFET);

wherein each of said NiFETs and PiFETs comprises:
a source terminal, a drain terminal, a gate terminal, and a diffusion terminal of a corresponding conductivity type of said each of said PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source channel and said drain channel;

said gate terminal of said PiFET and said gate terminal of said NiFET are connected together to form a common gate terminal, said source terminal of said NiFET is connected to negative power supply and said source terminal of said PiFET is connected to positive power supply, and drain terminals of said NiFET and said PiFET are connected together to form an output;

said common gate of said first complimentary pair and said common gate of said second complementary pair are connected with said output of said second complementary pair, and received by said common gate terminal of said third complementary pair;

said diffusion terminal of said PiFET of said first complementary pair receives said antenna;

said diffusion terminal of said PiFET of said third complementary pair is resistively coupled with said antenna;

said diffusion terminals of said NiFET of said first, second and third complementary pairs are connected together to receive current for gain control;

said output of said first complementary pair forms a voltage output to an output stage, said output of said second complementary pair provides an analog ground for said voltage output, and said output of said third complementary pair provides a bias voltage to an input of the output stage.

14. A gain controllable trans-impedance amplifier, comprising:
   a. a positive current input terminal, and a negative current input terminal,
   b. a positive voltage output terminal, and a negative voltage output terminal;
   c. a bias output terminal;
   d. a first complementary pair of a first n-type current field-effect transistor (NiFET) and a first p-type current field-effect transistor (PiFET);
   e. a second complementary pair of a second NiFET and a second PiFET; and
   f. a third complementary pair of a third NiFET and a third PiFET;
   wherein each of said NiFETs and PiFETs comprises:
      a source terminal, a drain terminal, a gate terminal, and a diffusion terminal of said corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source channel and said drain channel;
      wherein said gate terminal of said PiFET and said gate terminal of said NiFET are connected together to form a common gate terminal for said each complimentary pair, said source terminal of said NiFET of said each complimentary pair is connected to negative power supply and said source terminal of said PiFET of said each pair is connected to positive power supply, and drain terminals of said NiFET and said PiFET of said each complimentary pair are connected together to form an output; and
   wherein
      said diffusion terminal of said third NiFET receives said negative current input terminal;
      said diffusion terminal of said first NiFET receives said positive current input terminal;
      said common gate of said first complimentary pair, said common gate of said second complementary pair and said common gate of said third complementary pair are connected with said output of said second complementary pair for said bias voltage output terminal;
   said output terminal of said first complementary pair is connected to said positive voltage output terminal;
      said output terminal of said third complementary pair is connected to said negative voltage output terminal;
      wherein said gain controllable trans-impedance amplifier further comprises a gain control switch for selectively connecting said negative voltage supply to said diffusion terminals of said first, second and third PiFETs.

15. An isolator circuit, comprising:
   a. a differential current amplifier, comprising a first, second and third complementary pairs of a n-type current field-effect transistor (NiFET) and a p-type current field-effect transistor (PiFET);
   wherein each of said NiFETs and PiFETs comprises:
      a source terminal, a drain terminal, a gate terminal, and a diffusion terminal of a corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels, and a gate terminal capacitively coupled to said source channel and said drain channel, and said gate terminal is capacitively coupled to said source channel and drain channel;
      said gate terminal of said PiFET and said gate terminal of said NiFET are connected together to form a common gate terminal, said source terminal of said NiFET is connected to negative power supply and said source terminal of said PiFET is connected to positive power supply, and drain terminals of said NiFET and said PiFET are connected together to form an output;
   wherein said common gate of said first complimentary pair and said common gate of said second complementary pair are connected with said output of said second complementary pair, and received by said common gate terminal of said third complementary pair;
   said diffusion terminal of said PiFET of said first complementary pair is coupled to an input and output terminal;
   said diffusion terminal of said PiFET of said third complementary pair is resistively coupled with said input and output terminal;
   said diffusion terminals of said NiFET of said first, second and third complementary pairs are connected together to receive current for gain control;
   said output of said first complementary pair forms a voltage output to an output stage, said output of said second complementary pair provides an analog ground for said voltage output, and said output of said third complementary pair provides a bias voltage to an input of said output stage.

16. A multiple input and output circulator circuit coupled to a plurality of input and output terminals, comprising:
   a. a plurality of differential current amplifiers, each differential current amplifier comprising a first, second and third complementary pairs of a n-type current field-effect transistor (NiFET) and a p-type current field-effect transistor (PiFET);
   each of said NiFETs and PiFETs comprises:
      i. a source terminal, a drain terminal, a gate terminal, and a diffusion terminal of a corresponding conductivity type of said each of said PiFET and NiFET, defining a source channel between said source terminal and said diffusion terminal, and a drain channel between said drain terminal and said diffusion terminal, said diffusion terminal causes changes in said diffused charge density throughout said source and drain channels, and a gate terminal capacitively coupled to said source channel and said drain channel, and said gate terminal is capacitively coupled to said source channel and drain channel;
      ii. said gate terminal of said PiFET and said gate terminal of said NiFET are connected together to form a common gate terminal, said source terminal of said NiFET is connected to negative power supply and said source terminal of said PiFET is connected to positive power supply, and drain terminals of said NiFET and said PiFET are connected together to form an output;
   wherein said common gate of said first complimentary pair and said common gate of said second complementary pair are connected with said output of said second complementary pair, and received by said common gate terminal of said third complementary pair;

said diffusion terminal of said PiFET of said first complementary pair forms a non-inverting positive current input;

said diffusion terminal of said PiFET of said third complementary pair forms an inverting positive current input;

said diffusion terminal of said NiFET of said first complementary pair forms a non-inverting negative current input;

said diffusion terminal of said NiFET of said third complementary pair forms an inverting negative current input;

said output of said first complementary pair forms a non-inverting voltage output, said output of said second complementary pair provides an analog ground for said voltage output, and said output of said third complementary pair provides an bias voltage for said voltage output;

wherein said non-inverting voltage output of a previous one of said plurality of said differential current amplifiers is capacitively and resistively coupled to said non-inverting and said inverting positive current inputs of a subsequent one of plurality of said differential current amplifiers; and said non-inverting voltage output of a last one of said plurality of said differential current amplifiers is capacitively and resistively coupled to said non-inverting and said inverting positive current inputs of a first one of said plurality of said differential current amplifiers;

a corresponding one of said plurality of said input and output terminals is coupled to said inverting positive current input of a corresponding one of said plurality of said differential current amplifiers.

17. A latch current comparator, comprising:
a. a differential amplifier for amplifying difference between a first input and a second input, each of said first and second inputs having negative and positive polarity inputs, comprising:
   i. a first complementary pair of a first n-type current field-effect transistor (NiFET) and a first p-type current field-effect transistor (PiFET);
   ii. a second complementary pair of a second NiFET and a second PiFET; and
   iii. a third complementary pair of a third NiFET and a third PiFET; and
b. a comparator, comprising:
   i. a fourth complementary pair of a fourth NiFET and a fourth PiFET;
   ii. a fifth complementary pair of a fifth NiFET and a fifth PiFET;
   iii. a plurality of switches operable on a control signal that alternates enable and setup phases;
   iv. a first capacitor and a second capacitor, each has a first terminal and a second terminal;
wherein each of said NiFETs and PiFETs comprises:
   a source terminal, a drain terminal, a gate terminal, and a diffusion terminal of said corresponding conductivity type of said each of PiFET and NiFET, defining a source channel between said source terminal and said diffusion terminal, and a drain channel between said drain terminal and said diffusion terminal, said diffusion terminal causes changes in said diffused charge density throughout said source and drain channels, and said gate terminal is capacitively coupled to said source channel and said drain channel;

wherein said gate terminal of said PiFET and said gate terminal of said NiFET are connected together to form a common gate terminal for said each complimentary pair, said source terminal of said NiFET of said each complimentary pair is connected to negative power supply and said source terminal of said PiFET of said each pair is connected to positive power supply, and drain terminals of said NiFET and said PiFET of said each complimentary pair are connected together to form an output; and wherein said common gate of said first complimentary pair, said common gate of said second complementary pair and said common gate of said third complementary pair are connected with said output of said second complementary pair for generating a bias voltage output;

said diffusion terminal of said third PiFET receives said negative polarity input of said first input;

said diffusion terminal of said first PiFET receives said positive polarity input of said first input;

said diffusion terminal of said third NiFET receives said negative polarity input of said second input;

said diffusion terminal of said first NiFET receives said positive polarity input of said second input; and said output of said first complementary pair forms positive voltage output of said differential amplifier;

said output of said third complementary pair forms negative voltage output of said differential amplifier;

wherein said output of said fourth complementary pair is capacitively coupled to said input of said fifth complementary pair through said second capacitor;

said second terminal of said first capacitor is coupled to said input of said fourth complementary pair;

during said setup phase of said control signal, said plurality of switches cause said positive voltage output of said differential amplifier to be coupled with said first terminal of said first capacitor, said fourth complementary pair to be self-biased by connecting said output of said fourth complementary pair to said input of said fourth complementary pair, and said fifth complementary pair to be self-biased by connecting said output of said fifth complementary pair to said input of said fifth complementary pair;

during said enable phase of said control signal, said plurality of switches cause said negative voltage output of said differential amplifier to be coupled to said first terminal of said first capacitor, and said output of said fifth complementary pair to said input of said fourth complementary pair.

* * * * *